US011150071B2

(12) United States Patent
Coza

(10) Patent No.: US 11,150,071 B2
(45) Date of Patent: Oct. 19, 2021

(54) METHODS OF DETERMINING PERFORMANCE INFORMATION FOR INDIVIDUALS AND SPORTS OBJECTS

(71) Applicant: adidas AG, Herzogenaurach (DE)

(72) Inventor: Aurel Coza, Portland, OR (US)

(73) Assignee: adidas AG, Herzogenaurach (DE)

( * ) Notice: Subject to any disclaimer, the term of this patent is extended or adjusted under 35 U.S.C. 154(b) by 115 days.

(21) Appl. No.: 16/392,238

(22) Filed: Apr. 23, 2019

(65) Prior Publication Data

US 2019/0249976 A1 Aug. 15, 2019

Related U.S. Application Data

(63) Continuation of application No. 15/265,508, filed on Sep. 14, 2016, now Pat. No. 10,317,187, which is a
(Continued)

(51) Int. Cl.
  *G01B 7/00* (2006.01)
  *A63B 24/00* (2006.01)
  (Continued)

(52) U.S. Cl.
  CPC .......... *G01B 7/003* (2013.01); *A63B 24/0062* (2013.01); *A63B 47/00* (2013.01); *G01C 21/08* (2013.01); *G01C 21/20* (2013.01); *G01C 21/206* (2013.01); *G01R 33/0035* (2013.01); *G01R 33/02* (2013.01); *G01V 3/08* (2013.01); *G09B 29/007* (2013.01); *A63B 24/0021* (2013.01); *A63B 2024/0025* (2013.01); *A63B 2024/0028* (2013.01); *A63B 2024/0053* (2013.01); *A63B 2102/02* (2015.10); *A63B 2102/24* (2015.10);
  (Continued)

(58) Field of Classification Search
  USPC ........................ 324/207.11, 207.16; 473/425
  See application file for complete search history.

(56) References Cited

U.S. PATENT DOCUMENTS

| 5,662,205 A * | 9/1997 | Levasseur ................ G07D 5/00 194/317 |
| 2006/0122525 A1 | 6/2006 | Shusterman |

(Continued)

FOREIGN PATENT DOCUMENTS

| CN | 10 1701823 A | 5/2010 |
| DE | 10 2008 057 705 A1 | 5/2010 |
| WO | 2009/021068 A1 | 2/2009 |

OTHER PUBLICATIONS

Application of Geomagnetic Field in Navigation and Localization System, Journal of Chinese Inertial Technology, vol. 15 No. 6, Dec. 2007.
(Continued)

*Primary Examiner* — Vincent Q Nguyen
(74) *Attorney, Agent, or Firm* — Sterne, Kessler, Goldstein & Fox P.L.L.C.

(57) ABSTRACT

Methods for determining performance information for an object located within an area include obtaining magnetic field information for the area, measuring first magnetic field data when the object is located at a first position within the area, and determining performance information for the object within the area based on the magnetic field information for the area and the first magnetic field data.

10 Claims, 37 Drawing Sheets

Related U.S. Application Data continuation of application No. 13/797,361, filed on Mar. 12, 2013, now Pat. No. 9,500,464.

(51) Int. Cl.
    *G01C 21/20*     (2006.01)
    *A63B 47/00*     (2006.01)
    *G01C 21/08*     (2006.01)
    *G01R 33/02*     (2006.01)
    *G01V 3/08*     (2006.01)
    *G01R 33/00*     (2006.01)
    *G09B 29/00*     (2006.01)
    *A63B 102/24*     (2015.01)
    *A63B 102/32*     (2015.01)
    *A63B 102/02*     (2015.01)

(52) U.S. Cl.
    CPC ....... *A63B 2102/32* (2015.10); *A63B 2220/10* (2013.01); *A63B 2220/30* (2013.01); *A63B 2220/35* (2013.01); *A63B 2220/40* (2013.01); *A63B 2220/53* (2013.01); *A63B 2225/74* (2020.08); *A63B 2243/007* (2013.01); *A63B 2243/0025* (2013.01); *A63B 2243/0037* (2013.01)

(56) References Cited

U.S. PATENT DOCUMENTS

2009/0108835 A1     3/2009     Englert et al.
2013/0130843 A1*     5/2013     Burroughs ............... A43B 5/02
                                                                       473/415

OTHER PUBLICATIONS

European Search Report for corresponding European Patent Application No. 14157584.5, The Hague, Netherlands, dated Nov. 10, 2017.

* cited by examiner

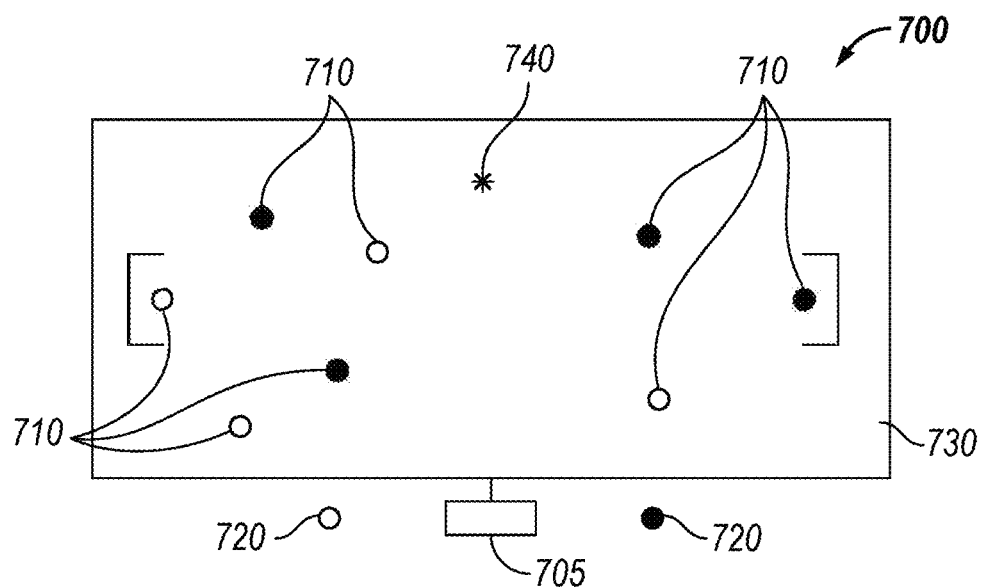
FIG. 17
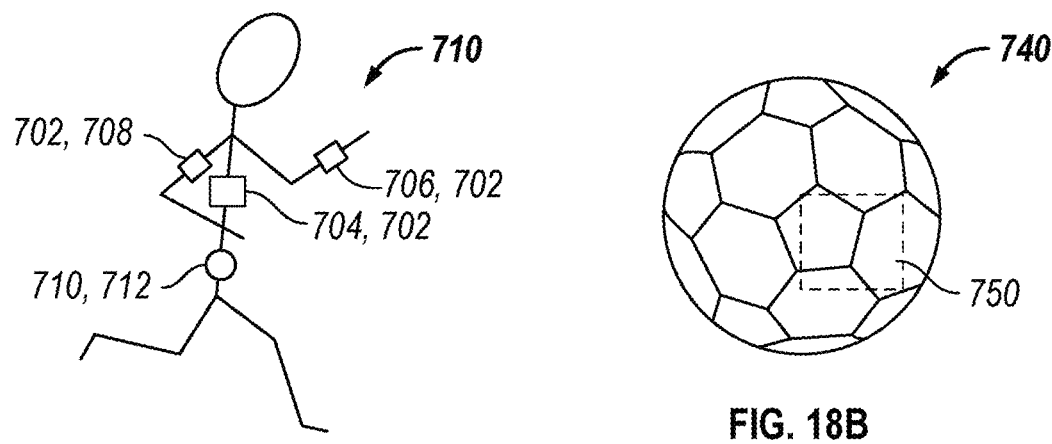
FIG. 18A
FIG. 18B
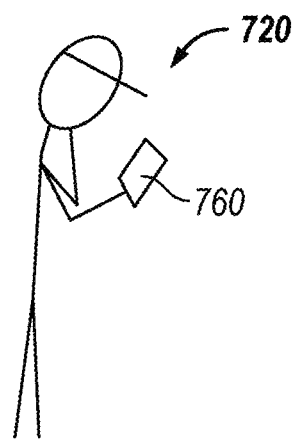
FIG. 19

FIG. 31

METHODS OF DETERMINING PERFORMANCE INFORMATION FOR INDIVIDUALS AND SPORTS OBJECTS

CROSS-REFERENCE TO RELATED APPLICATION AND INCORPORATION BY REFERENCE

The present application is a continuation of and claims priority to U.S. patent application Ser. No. 15/265,508 filed on Sep. 14, 2016, which is a continuation of and claims priority to U.S. patent application Ser. No. 13/797,361 filed on Mar. 12, 2013, now U.S. Pat. No. 9,500,464, both of which are incorporated herein by reference in their entirety.

FIELD OF THE INVENTION

Embodiments of the present invention generally relate to methods of determining performance information for an object based on magnetic field information. More particularly, embodiments of the present invention relate to methods of determining performance information for an object, such as the position or speed of the object, by mapping magnetic field information of an area and comparing magnetic field measurements taken as the object moves about the area to the mapped magnetic field information.

BACKGROUND OF THE INVENTION

Technologies such as satellite navigation systems are useful for navigation and tracking movement of an object in an outdoor environment. However, these systems do not function well in areas without a clear pathway between the satellite and receiver, such as indoor, urban, subterranean and underwater environments, where satellite navigation system signals are often unavailable. Thus, it would be advantageous to have a positioning system that works in both outdoor and indoor environments that can be used in place of or in combination with a satellite navigation system.

Embodiments of the present invention determine performance information for an object based on local magnetic field data. The earth's magnetic field across a wide area is generally the same, with little variation. Thus, in most instances, a standard compass will generally point to the earth's magnetic pole. However, on a local level, the earth's magnetic field, although generally stable, may be non-uniform. Both the intensity and direction of the earth's magnetic field can vary locally. Of particular relevance, within a man-made structure such as a building, variations in the magnetic field can be influenced, for instance, by the building materials. For example, the magnetic field measured near a large steel support beam may be different than the magnetic field measured in the center of a large room. Accordingly, the intensity and direction of the magnetic field can vary when measured at various locations throughout a building.

By measuring and recording local magnetic field data, a magnetic field "map" of an area can be created that includes magnetic field information for the entire area. Measurements taken at a point later in time can be compared with the magnetic field map information to determine a location of an object within the mapped area. This can be useful for numerous activities, for example, navigating through a building or tracking the movement of an object within an enclosed structure. More specifically, certain athletic activities are commonly performed inside gyms, training facilities, arenas or stadiums that are partially or completely enclosed. For example, sports such as basketball, football and soccer are often played indoors. It is becoming increasingly important to track performance metrics of athletes during both training and competition. Satellite navigation system-based technology, although potentially useful in outdoor environments to track the position, movement and performance of players or sports equipment (e.g., a ball), often encounters accuracy problems in indoor environments. Thus, it would be advantageous to have a positioning system that is capable of tracking the position, movement and performance of players or sports equipment in indoor environments based on local magnetic field data.

BRIEF SUMMARY OF THE INVENTION

The methods and systems disclosed herein relate to detecting, determining and tracking the position of one or more objects within an area based on local magnetic field data. The methods and systems are generally described herein with respect to indoor environments that are partially or completely enclosed, but are equally suitable for other environments, for example, outdoor, urban, subterranean and underwater environments. The methods and systems are also generally described herein with respect to athletic activities, but can be employed for many other uses, such as, but not limited to, indoor and outdoor navigation and product tracking. Although the methods and systems disclosed herein are generally described using magnetic field data, other types of data to determine and track the position of individuals and objects within an area are also contemplated. Examples of other types of data include, but are not limited to, thermal (IR) and/or visible spectrum data, optical data, image data and/or electromagnetic data.

Embodiments of the present invention relate to a method for determining performance information for an object located within an area, the method including obtaining magnetic field information for the area, measuring first magnetic field data when the object is located at a first position within the area, wherein the first magnetic field data includes magnetic field intensity data and/or magnetic field direction data, and determining performance information for the object within the area based on the magnetic field information for the area and the first magnetic field data.

Embodiments of the present invention also relate to a method for determining performance information for an object located within an athletic field area, the method including obtaining magnetic field map data for the athletic field area, measuring magnetic field data when the object is located within the athletic field area, filtering the measured magnetic field data, and determining performance information for the object within the athletic field area based on the magnetic field map data and the filtered measured magnetic field data.

Embodiments of the present invention further relate to a method for determining a position of an object within an area at a given time, the method including obtaining magnetic field information for the area, measuring first magnetic field data when the object is located at a first position within the area, comparing the first magnetic field data with the magnetic field information for the area, determining a set of possible locations of the first position of the object within the area based on the comparison of the first magnetic field data with the magnetic field information for the area, measuring second magnetic field data when the object is located at a second position within the area, comparing the second magnetic field data with the magnetic field information for the area, applying constraints to the second magnetic field data to determine a possible location of the second position of the object based on the constraints and the comparison of the first magnetic field data and the second magnetic field data with the magnetic field information for the area, and repeating the steps of measuring magnetic field data and applying constraints to determine the position of the object within the area at a given time.

Embodiments of the present invention also relate to a method for determining performance information for an object located within an area, the method including measuring first magnetic field data when the object is located at a first position within the area at a first time, determining a location of the first position of the object at the first time based on the first magnetic field data, measuring second magnetic field data when the object is located at a second position within the area at a second time, determining a location of the second position of the object at the second time based on the second magnetic field data, and determining performance information for the object based on the location of the first position of the object at the first time and the location of the second position of the object at the second time.

Embodiments of the present invention further relate to a method for tracking a first object and a second object as they move about an area during a period of time, the method including obtaining magnetic field data for the first object as it moves about the area during the period of time, obtaining magnetic field data for the second object as it moves about the area during the period of time, and tracking positions of the first object and the second object at given times as they move about the area during the period of time based on the obtained magnetic field data for the first object and the obtaining magnetic field data for the second object.

Embodiments of the present invention also relate to a method for mapping a magnetic field of an athletic field area, the method including measuring magnetic field data at a plurality of locations within the athletic field area during a mapping session and generating a map of the magnetic field of the athletic field area based on the measured magnetic field data.

Embodiments of the present invention further relate to a method for determining performance information for an object located within an area, the method including obtaining magnetic field information for the area, performing a statistical analysis of the variability of the magnetic field information for the area, measuring a statistical variable of magnetic field data as the object moves within the area, and determining performance information for the object based on the measurement of the statistical variable of magnetic field data.

Embodiments of the present invention also relate to a group monitoring device for monitoring a plurality of individuals engaged in an athletic activity, the device including a display configured to display, during an athletic activity, a representation depicting locations on a playing field of a plurality of individuals engaged in the athletic activity, and a location of a movable sports object (e.g., a ball), wherein the representation is based on location information generated by individual monitors coupled to individuals of the plurality of individuals, and location information generated by an object monitor coupled to the sports object.

Embodiments of the present invention further relate to a method for monitoring a plurality of individuals engaged in an athletic activity, the method including displaying, during the athletic activity, a representation depicting locations on a playing field of a plurality of individuals engaged in the athletic activity, and a location of a movable sports object, wherein the representation is based on location information generated by individual monitors coupled to individuals of the plurality of individuals, and location information generated by an object monitor coupled to the sports object.

Embodiments of the present invention also relate to a method for defining a playing field, the method including displaying, using an administrative device, an instruction to locate a sensor at a first location, receiving first data from the sensor, defining the first data as the position of the first location, displaying, using the administrative device, an instruction to locate the sensor at a second location, receiving second data from the sensor, and defining the second data as the position of the second location, wherein the position of the first location and the position of the second location together define the playing field.

Additional embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention by way of example, and not by way of limitation, and, together with the description, further serve to explain the principles of the invention and to enable a person skilled in the pertinent art to make and use the invention.

FIG. 17 is an illustration of a monitoring system, according to an embodiment of the present invention.

FIG. 18A is an illustration of an individual monitor and associated components, according to an embodiment of the present invention.

FIG. 18B is an illustration of an object monitor, according to an embodiment of the present invention.

FIG. 19 is an illustration of a group monitoring device, according to an embodiment of the present invention.

FIG. 31 is an illustration of a display of a group monitoring device, according to an embodiment of the present invention.

DETAILED DESCRIPTION

Figure 1:
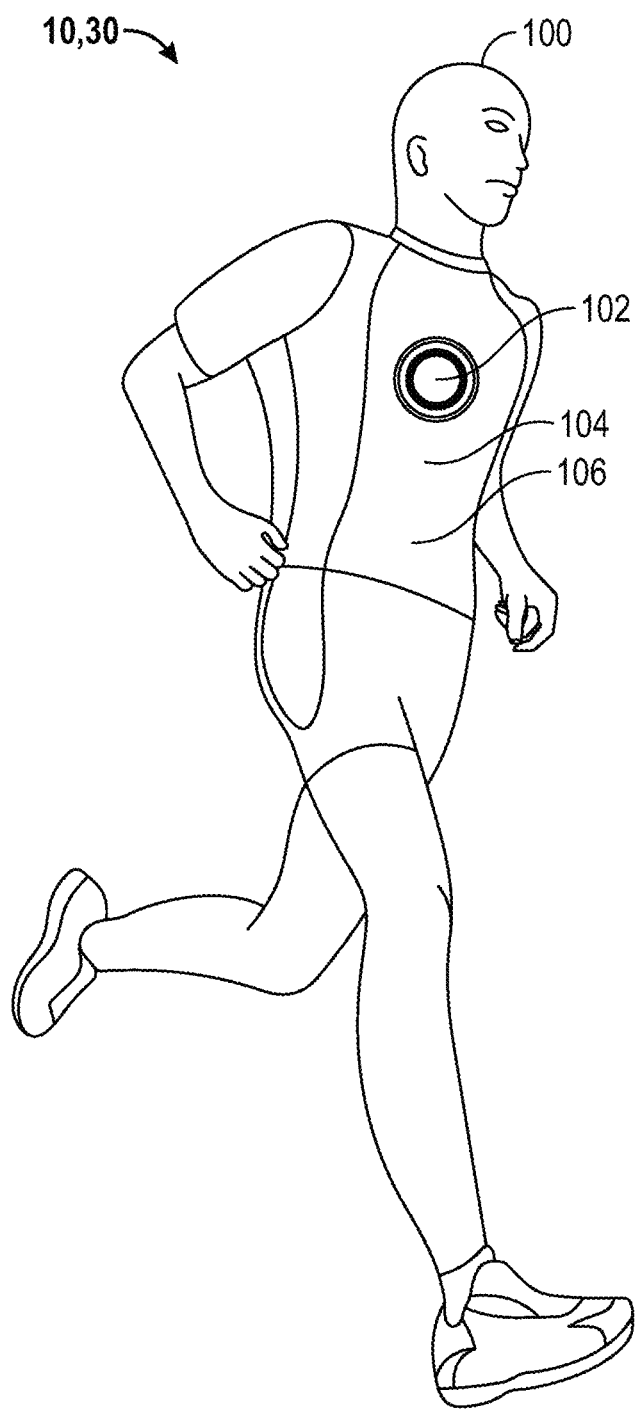
FIG. 1 is an illustration of an individual using an athletic activity monitoring system, according to an embodiment of the present invention.

The present invention will now be described in detail with reference to embodiments thereof as illustrated in the accompanying drawings. References to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The term "invention" or "present invention" as used herein is a non-limiting term and is not intended to refer to any single embodiment of the particular invention but encompasses all possible embodiments as described in the application.

Various aspects of the present invention, or any parts or functions thereof, may be implemented using hardware, software, firmware, tangible computer readable or computer usable storage media having instructions stored thereon, or a combination thereof, and may be implemented in one or more computer systems or other processing systems.

The present invention generally relates to methods of determining performance information for an object based on measuring the local magnetic field. More particularly, embodiments of the present invention relate to methods of determining performance information for an object, such as the position or speed of the object, within an area by mapping magnetic field information of the area and comparing magnetic field data measurements taken as the object moves about the area to the mapped data.

For example, if the individual is participating in an activity that involves the use of a sport ball, such as playing in a soccer (i.e., football) match, it may be desirable, for example, to be able to determine the speed at which the soccer ball (i.e., football) was kicked by the individual, to be able to determine the location of the soccer ball on the playing field in relation to a boundary line or goal, or to be able to determine the relative amount of time the soccer ball spent in various areas of the playing field during a match.

As a further example, it may be desirable to be able to determine the location of an individual playing a sport, for example basketball, at a specific time or over the course of a game. It may also be desirable to determine the speed at which the individual moves about the court and the path the individual takes as they move about the court during a game.

In an embodiment, the positions and movement and of the bodies of a plurality of individuals engaged in an athletic activity (e.g., teammates or opponents in a team sport) and/or the movement of a plurality of pieces of athletic equipment used by the individuals during the athletic activity may be monitored. In some embodiments, real-time monitoring and/or feedback may be provided, while in other embodiments post-activity feedback may be provided.

By using an athletic activity monitoring system including one or more portable sensors, embodiments of the present invention described below may advantageously enable an individual (or their coach, teammate, or a spectator) to obtain this or other information about the position of the individual's body or the position of a piece of the individual's athletic equipment during the course of the athletic activity. Data obtained by sensors may be processed in a variety of ways to yield useful information about the position and movement of an object of interest during the activity. In some embodiments, sensor data may be processed to determine changes in the spatial orientation (i.e., changes in position, relative to a specific location on the earth, the playing field or other point of reference) of the individual's body or a piece of the individual's athletic equipment. In other embodiments, sensor data may be processed by reference to stored reference data for a particular area, such as the playing field.

In one embodiment, information about the position and movement of the individual's body or the position and movement of a piece of the individual's athletic equipment may be used, for example, to provide coaching to the individual about how their position or movement could be improved, or as a check on the accuracy of a referee, umpire, or other athletic competition judge's judgment related to the position or movement of the individual's body or athletic equipment.

Suitable monitoring systems and components may include, for example, the systems and components disclosed in commonly owned U.S. patent application Ser. No. 13/446,937, titled "ATHLETIC ACTIVITY MONITORING METHODS AND SYSTEMS," U.S. patent application Ser. No. 13/446,982, titled "SPORT BALL ATHLETIC ACTIVITY MONITORING METHODS AND SYSTEMS," and U.S. patent application Ser. No. 13/446,986, titled "WEARABLE ATHLETIC ACTIVITY MONITORING METHODS AND SYSTEMS," whose disclosures are incorporated herein by reference in their entireties.

FIG. 1 is an illustration of an individual 100 using an athletic activity monitoring system 10 according to an embodiment of the present invention. The individual 100 may desire to obtain information about the position and movement of the individual's 100 body or the position and movement of a piece of the individual's 100 athletic equipment during the course of the athletic activity using athletic activity monitoring systems 10 according to the present invention.

Athletic activity monitoring systems 10 according to embodiments of the present invention may be suitable for use by individuals 100 for team or individual athletic activities and for competitive and informal training sessions. For example, athletic activity monitoring systems 10 according to embodiments of the present invention may be suitable for use by individuals 100 engaged in athletic activities such as baseball, basketball, bowling, boxing, cricket, cycling, football (i.e., American football), golf, hockey, lacrosse, rowing, rugby, running, skateboarding, skiing, soccer (i.e., football), surfing, swimming, table tennis, tennis, or volleyball, or during training sessions related thereto.

Athletic activity monitoring systems 10 according to embodiments of the present invention may include a sensor module 102. The sensor module 102 may include one or more sensors, and may be physically coupled to an object 104 during an athletic activity conducted by an individual 100. As explained in further detail below, the sensor module 102 may be used to monitor changes in the spatial orientation of the individual's 100 body 106 or a piece of the individual's athletic equipment 108 in some embodiments, while the sensor module 102 may be used in combination with predetermined correlation data stored in a data structure to determine a correlation between body 106 or equipment 108 movement data and an activity metric in other embodiments.

In one embodiment, as illustrated in FIG. 1, the monitored object 104 may be the individual's 100 body 106, and the sensor module 102 may be physically coupled to the individual's 100 body 106. In the illustrated embodiment, the sensor module 102 is configured to be physically coupled to the portion of the individual's 100 body 106 known as the chest. In other embodiments, the sensor module 102 may be configured to be physically coupled to other portions of the individual's 100 body 106 such as, for example, the individual's head, neck, shoulder, back, arm, wrist, hand, finger, waist, hip, leg, ankle, foot, or toe.

In some embodiments, the sensor module 102 may be configured to be physically coupled to the portion of the individual's 100 body 106 with one or more layers of clothing, an article of footwear, or athletic protective equipment existing between the sensor module 102 and the individual's 100 body 106. Regardless of whether intervening articles are present, the sensor module 102 may be physically coupled to the portion of the individual's 100 body 106 by a variety of releasable or non-releasable coupling means such as, for example, straps, adhesives, pockets, clips, or by being integrated into an article of clothing (e.g., shirt, pants, sock, glove, or hat), footwear, or athletic protective equipment worn by the individual 100.

In one embodiment, the sensor module 102 may be configured to be placed in a sensor module 102 retention element of a garment that is configured to retain the sensor module 102. In some exemplary embodiments, the retention element may be sized and shaped to correspond to the size and shape of the sensor module 102, to be capable of nesting sensor module 102 therein and holding the sensor module 102 in place so as to minimize the effect of movement of a wearer of the garment on the sensor module 102. Additional elements may be used to help minimize this effect, such as, for example, bands and spacer elements. The sensor module 102 retention element may be coupled to textile a layer of a garment by, for example, being integral therewith, being adhered, stitched, welded, tied, clipped, snapped, or mounted thereto, or any combination of these and other techniques. In some exemplary embodiments, sensor module 102 retention element is formed integrally with a textile layer of the garment.

In some embodiments, the sensor module 102 retention element may be positioned to correspond to the upper back of a wearer of the sensor module 102. The sensor module 102 retention element to correspond to a high position on the wearer, such as the upper back, may help minimize interference and maximize range and signal strength of the sensor module 102 within the sensor module 102 retention element when the sensor module 102 sends or receives data. Additionally, positioning the sensor module 102 retention element to correspond to the upper back minimizes interference with athlete movements by the sensor module 102. In some exemplary embodiments, sensor module 102 retention element is positioned to correspond to other than the upper back of a wearer.

Figure 2:
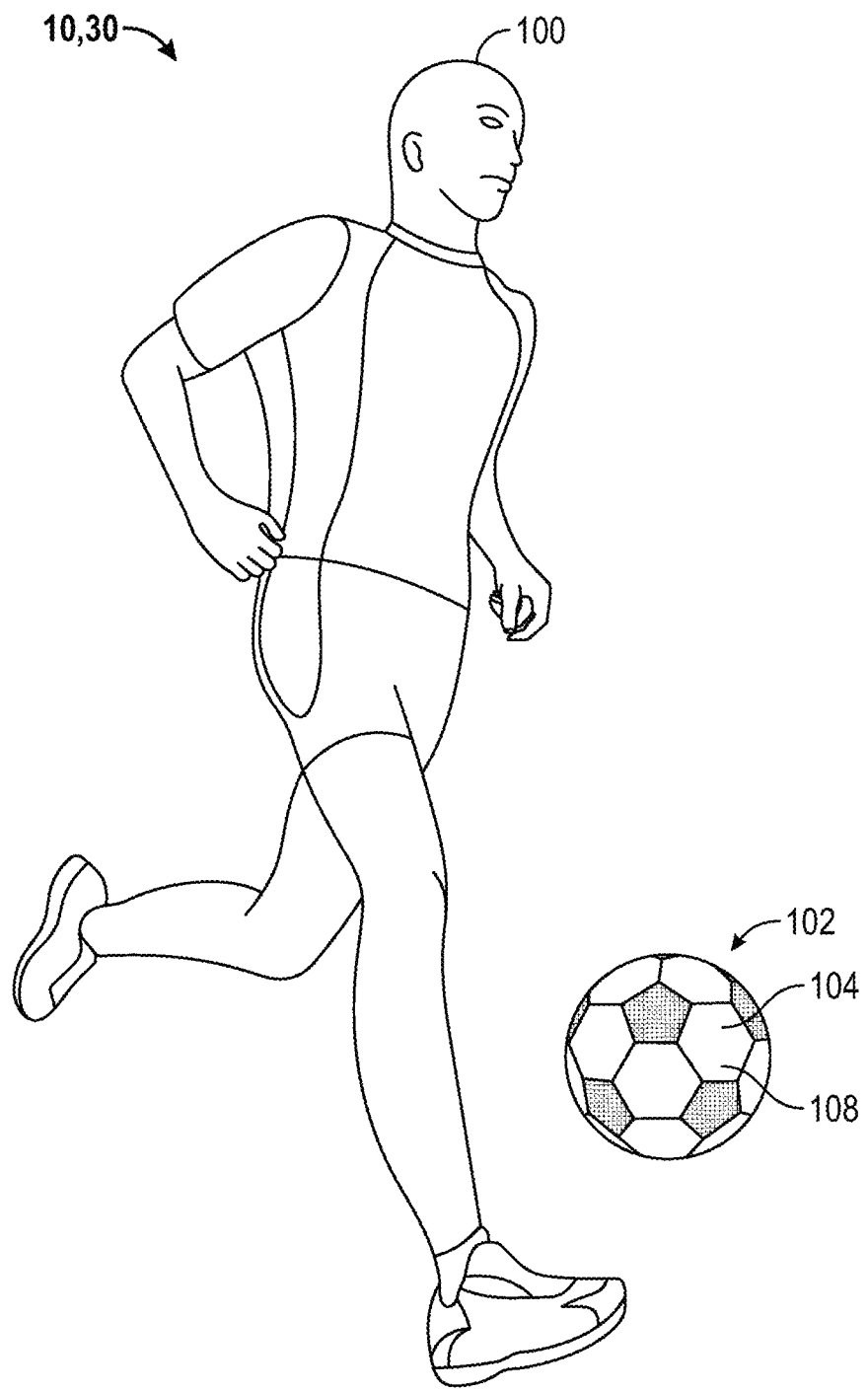
FIG. 2 is an illustration of an individual using an athletic activity monitoring system, according to an embodiment of the present invention.

In another embodiment, as illustrated in FIG. 2, the object 104 may be a piece of athletic equipment 108 used by the individual 100 during the athletic activity, and the sensor module 102 may be physically coupled to the piece of athletic equipment 108. In the illustrated embodiment, the sensor module 102 is physically coupled to a piece of athletic equipment 108 that is a soccer ball. In other embodiments, the sensor module 102 may be configured to be physically coupled to other pieces of athletic equipment 108 such as, for example, any type of sport ball, any type of sport "stick" (e.g., a baseball bat, hockey stick, golf club, table tennis paddle, or tennis racquet), a sport glove, a bicycle, an oar, a shoe, a boot, a ski, a hat or cap, a skateboard, a surfboard, or a pair of glasses or goggles.

The sensor module 102 may be physically coupled to the piece of athletic equipment 108 by a variety of coupling means depending on the nature of the piece of athletic equipment 108 and the athletic activity. For example, the sensor module 102 may be physically coupled to a sport ball by being attached to the exterior of the ball, by being attached to an interior surface of a hollow ball, by being suspended by a suspension system in the interior of a hollow ball, or by being integrated into the outer layer or other layer of a multi-layer ball. Also, the sensor module 102 may be physically coupled to a non-hollow sport ball (e.g., a baseball, bowling ball, or golf ball) by, for example, being attached to the exterior of the ball, being integrated between layers of a multi-layer ball, by being embedded in a solid portion of the ball. As further examples, the sensor module 102 may be releasably or non-releasably physically coupled to a sport "stick" by being wrapped around a portion of the sport stick, by being clipped to a portion of the sport stick, by being attached to an exterior surface of the sport stick, by being attached to an interior surface of a hollow or non-hollow sport stick, by being suspended by a suspension system in the interior of a hollow sport stick, or by being integrated into the wall or other layer of a multi-layer or composite sport stick. The sensor module 102 may be physically coupled to the piece of athletic equipment 108 by a variety of coupling means such as, for example, straps, adhesives, or by being integrated into the piece of athletic equipment 108.

In other embodiments, the sensor module 102 may be integrated within an existing piece of athletic activity monitoring equipment such as, for example, a heart rate monitoring device, a pedometer, and accelerometer-based monitoring device, or other portable fitness monitoring device such as, for example, devices sold by adidas AG of Herzogenaurach, Germany under the MICOACH, PACER, ZONE, or SPEED CELL brand names.

Figure 3:
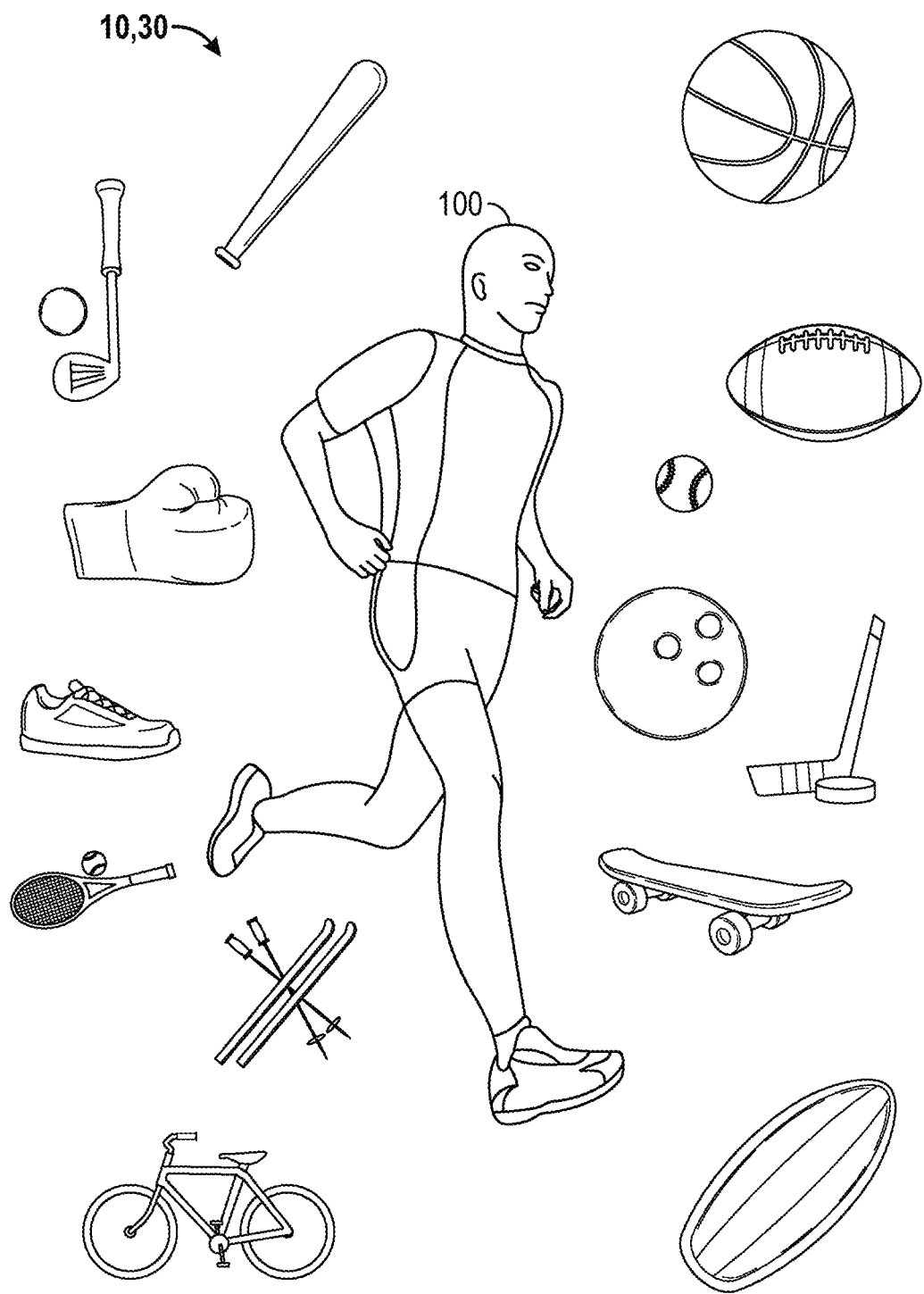
FIG. 3 is an illustration of various different pieces of athletic equipment, according to embodiments of the present invention.

FIG. 3 is an illustration of examples of various different pieces of athletic equipment 108 that could be used according to embodiments of the monitoring system 10 of the present invention. As illustrated, the monitoring system 10 of the present invention may be used with a variety of different pieces of athletic equipment 108, such as, for example, a basketball, a football, a baseball bat, a baseball, a bowling ball, a hockey stick, a hockey puck, a skateboard, a surfboard, a bicycle, a pair of skis, ski poles, a tennis racquet, a tennis ball, an article of footwear, a boxing glove, a golf club, or a golf ball.

Figure 4:
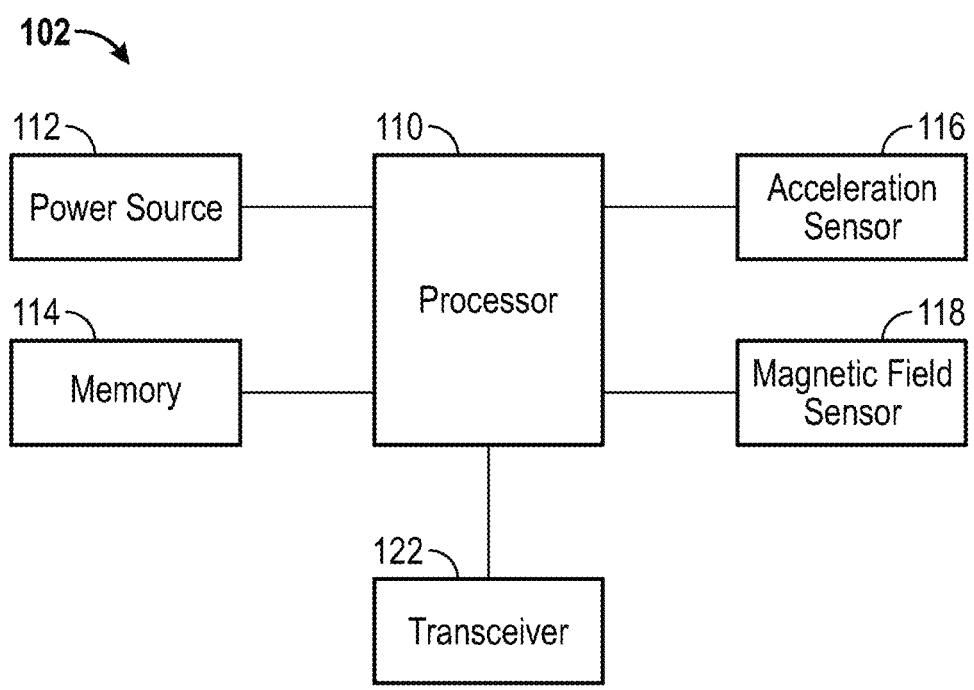
FIG. 4 is a block diagram of components of a sensor module, according to an embodiment of the present invention.

FIG. 4 is a block diagram of components of a sensor module 102 according to an embodiment of the present invention. In the illustrated embodiment, the sensor module 102 includes a processor 110, a power source 112, a memory 114, an acceleration sensor 116, a magnetic field sensor 118, and a transceiver 122 operatively connected to one another to carry out the functionality of the sensor module 102. In other embodiments, one or more of these sensor module 102 components may be omitted, or one or more additional components may be added. For example, in some embodiments that rely primarily or exclusively on magnetic field data to determine performance information for an object 104, such as the position or speed of the object 104, the sensor module 102 may include a magnetic field sensor 118 but omit an acceleration sensor 116.

The processor 110 may be adapted to implement application programs stored in the memory 114 of the sensor module 102. The processor 110 may also be capable of implementing analog or digital signal processing algorithms such as raw data reduction and filtering. For example, processor 110 may be configured to receive raw data from sensors and process such data at the sensor module 102. The processor 110 is operatively connected to the power source 112, the memory 114, the acceleration sensor 116, the magnetic field sensor 118, and the transceiver 122.

The power source 112 may be adapted to provide power to the sensor module 102. In one embodiment, the power source 112 may be a battery. The power source may be built into the sensor module 102 or removable from the sensor module 102, and may be rechargeable or non-rechargeable. In an embodiment, the power source 112 may be recharged by being plugged into a cable attached to a charging source, such as a universal serial bus ("USB") cable attached to a personal computer. In another embodiment, the power source 112 may be recharged by inductive charging, wherein an electromagnetic field is used to transfer energy from an inductive charger to the power source 112 when the two are brought in close proximity, but need not be plugged into one another via a cable. In some embodiment, a docking station may be used to facilitate charging.

The memory 114 may be adapted to store application program instructions and to store athletic activity data. In an embodiment, the memory 114 may store application programs used to implement aspects of the functionality of the athletic activity monitoring system 10 described herein. In one embodiment, the memory 114 may store raw data, recorded data, and/or calculated data. In some embodiments, as explained in further detail below, the memory 114 may act as a data storage buffer. The memory 114 may include both read only memory and random access memory, and may further include memory cards or other removable storage devices.

In some embodiments of the present invention, the memory 114 may store raw data, recorded data, and/or calculated data permanently, while in other embodiments the memory 114 may only store all or some data temporarily, such as in a buffer. In one embodiment of the present invention, the memory 114, and/or a buffer related thereto, may store data in memory locations of predetermined size such that only a certain quantity of data may be saved for a particular application of the present invention.

The acceleration sensor 116 may be adapted to measure the acceleration of the sensor module 102. Accordingly, when the sensor module 102 is physically coupled to an object 104 (such as an individual's 100 body 106 or a piece of athletic equipment 108), the acceleration sensor 116 may be capable of measuring the acceleration of the object 104, including the acceleration due to the earth's gravitational field. In one embodiment, the acceleration sensor 116 may include a tri-axial accelerometer that is capable of measuring acceleration in three orthogonal directions. In other embodiments one, two, three, or more separate accelerometers may be used.

The magnetic field sensor 118 may be adapted to measure the intensity and/or direction of magnetic fields in the vicinity of the sensor module 102. Accordingly, when the sensor module 102 is physically coupled to an object 104 (such as an individual's 100 body 106 or a piece of athletic equipment 108), the magnetic field sensor 118 may be capable of measuring the intensity and/or direction of magnetic fields in the vicinity of the object 104, including the earth's magnetic field. In one embodiment, the magnetic field sensor 118 may be a vector magnetometer. In other embodiments, the magnetic field sensor 118 may be a tri-axial magnetometer that is capable of measuring the magnitude and direction of a resultant magnetic vector for the total local magnetic field in three dimensions. In other embodiments one, two, three, or more separate magnetometers may be used.

In one embodiment of the present invention, the acceleration sensor 116 and the magnetic field sensor 118 may be contained within a single accelerometer-magnetometer module bearing model number LSM303DLHC made by STMicroelectronics of Geneva, Switzerland. In other embodiments, the sensor module 102 may include only one of the acceleration sensor 116 and the magnetic field sensor 118, and may omit the other if desired. For example, in some embodiments that rely primarily or exclusively on magnetic field data to determine performance information for an object 104, such as the position or speed of the object 104, the sensor module 102 may include a magnetic field sensor 118 but omit an acceleration sensor 116.

The transceiver 122 depicted in FIG. 4 may enable the sensor module 102 to wirelessly communicate with other components of the athletic activity monitoring system 10, such as those described in further detail below. In one embodiment, the sensor module 102 and the other local components of the athletic activity monitoring system 10 may communicate over a personal area network or local area network using, for example, one or more of the following protocols: ANT, ANT+ by Dynastream Innovations, Bluetooth, Bluetooth Low Energy Technology, BlueRobin, or suitable wireless personal or local area network protocols. Other known communication protocols suitable for an athletic activity monitoring system 10 may also be used.

In one embodiment, the transceiver 122 is a low-power transceiver. In some embodiments, the transceiver 122 may be a two-way communication transceiver 122, while in other embodiments the transceiver 122 may be a one-way transmitter or a one-way receiver. Wireless communication between the sensor module 102 and other components of the athletic activity monitoring system 10 is described in further detail below. In other embodiments, the sensor module 102 may be in wired communication with other components of the athletic activity monitoring system 10 that does not rely on transceiver 122.

In some embodiments of the present invention, a sensor module 102 having components such as those depicted in FIG. 4 may be physically coupled to an object 104 during an athletic activity conducted by an individual 100 to monitor changes in the spatial orientation of the individual's 100 body 106 or a piece of the individual's athletic equipment 108, to determine a correlation between body 106 or equipment 108 movement data and an activity metric, or to compare measured data to previously measured and recorded data. In these embodiments, the acceleration sensor 116 and the magnetic field sensor 118 may be responsible for collecting the data necessary to carry out the various monitoring calculations.

In some other embodiments, however, it may be desirable to have additional sensors included within the sensor module 102, or to have additional sensors in communication with the sensor module 102. In further embodiments, the sensor module 102 may be integrated within an existing piece of athletic activity monitoring equipment possibly having additional or different sensors such as, for example, a heart rate monitoring device, a pedometer, and accelerometer-based monitoring device, or other portable fitness monitoring device such as, for example, devices sold by adidas AG of Herzogenaurach, Germany under the MICOACH, PACER, ZONE, or SPEED CELL brand names.

In addition to the acceleration sensor 116 and the magnetic field sensor 118, other sensors that may be part of the sensor module 102 or separate from but in communication with the sensor module 102 may include sensors capable of measuring a variety of athletic performance parameters. The term "performance parameters" may include physical parameters and/or physiological parameters associated with the individual's 100 athletic activity. Physical parameters measured may include, but are not limited to, time, distance, speed, location, pace, pedal count, wheel rotation count, rotation generally, stride count, stride length, airtime, stride rate, altitude, strain, impact force, jump force, force generally, and jump height. Physiological parameters measured may include, but are not limited to, heart rate, respiration rate, blood oxygen level, blood lactate level, blood flow, hydration level, calories burned, or body temperature.

Actual sensors that may be capable of measuring these parameters may include, but are not limited to, a pedometer, a pulsimeter, a thermometer, an altimeter, a pressure sensor, a strain gage, a bicycle power meter, a bicycle crank or wheel position sensor, a magnetic sensor, an angular momentum sensor (e.g., a gyroscope), a resistance sensor, or a force sensor.

Figure 5:
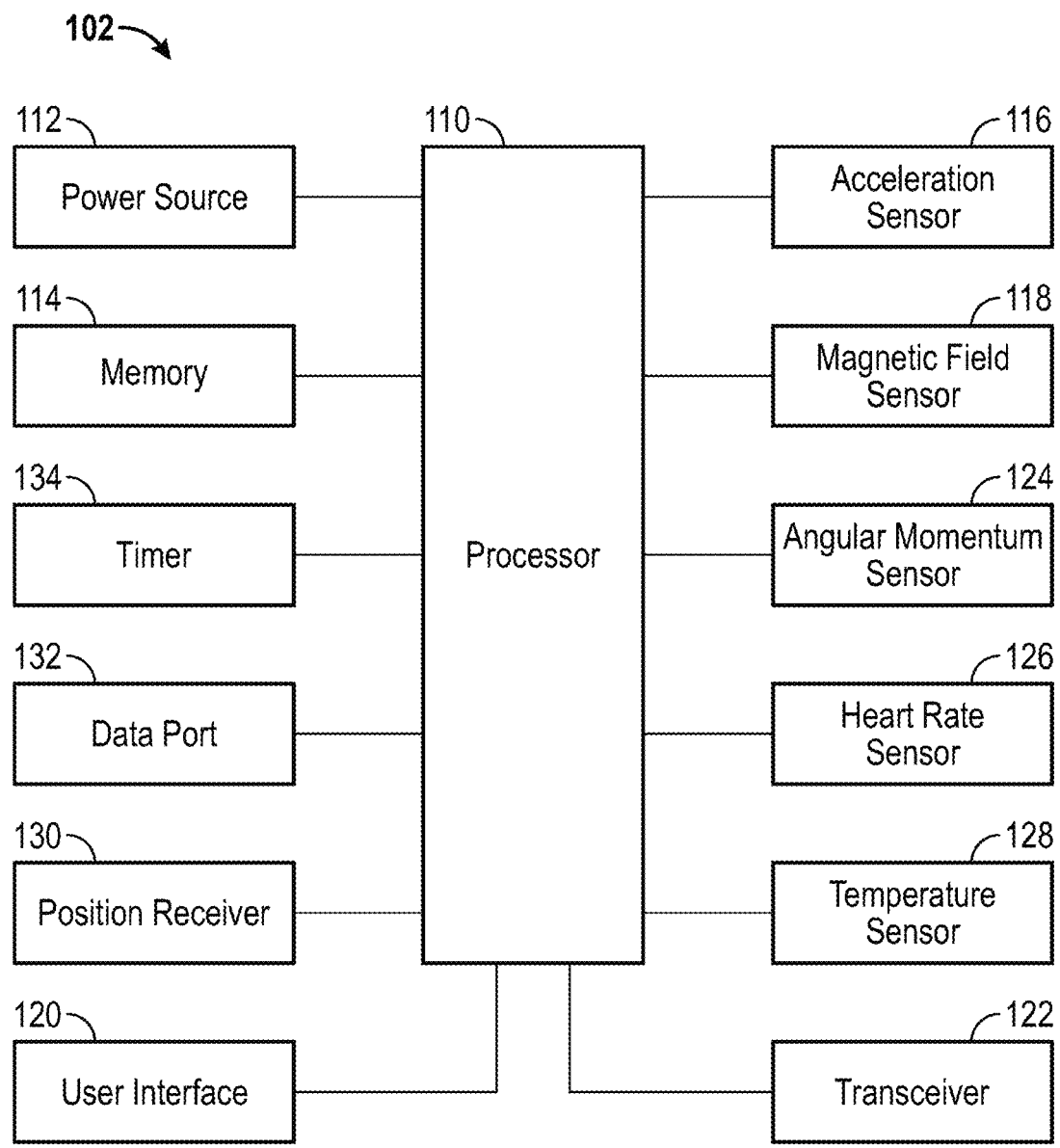
FIG. 5 is a block diagram of components of a sensor module, according to an embodiment of the present invention.

FIG. 5 is a block diagram of components of a sensor module 102 according to another embodiment of the present invention that may incorporate some of the additional sensors mentioned above, as well as other additional components. In the illustrated embodiment, the sensor module 102 includes a processor 110, a power source 112, a memory 114, an acceleration sensor 116, a magnetic field sensor 118, a user interface 120, and a transceiver 122, an angular momentum sensor 124, a heart rate sensor 126, a temperature sensor 128, a position receiver 130, a data port 132, and a timer 134 operatively connected to one another to carry out the functionality of the sensor module 102. In other embodiments, one or more of these sensor module 102 components may be omitted, or one or more additional components may be added.

The processor 110, the power source 112, the memory 114, the acceleration sensor 116, the magnetic field sensor 118, and the transceiver 122 of the embodiment of FIG. 5 may have structures and functions similar to those described above with respect to analogous components in FIG. 4.

The user interface 120 of the sensor module 102 may be used by the individual 100 to interact with the sensor module 102. In an embodiment, the user interface 120 may include one or more input buttons, switches, or keys, including virtual buttons, switches, or keys of a graphical user interface touch screen surface. The function of each of these buttons, switches, or keys may be determined based on an operating mode of the sensor module 102. In one embodiment, the user interface 120 may include a touch pad, scroll pad and/or touch screen. In another embodiment, the user interface 120 may include capacitance switches. In a further embodiment, the user interface 120 may include voice-activated controls.

In some embodiments, however, the sensor module 102 may not include a user interface 120. In these embodiments, the sensor module 102 may be capable of communicating with other components of the athletic activity monitoring system 10 which may themselves include user interfaces.

The angular momentum sensor 124, which may be, for example, a gyroscope, may be adapted to measure the angular momentum or orientation of the sensor module 102. Accordingly, when the sensor module 102 is physically coupled to an object 104 (such as an individual's 100 body 106 or athletic equipment 108), the angular momentum sensor 124 may be capable of measuring the angular momentum or orientation of the object 104. In one embodiment, the angular momentum sensor 124 may be a tri-axial gyroscope that is capable of measuring angular rotation about three orthogonal axis. In other embodiments one, two, three, or more separate gyroscopes may be used. In an embodiment, the angular momentum sensor 124 may be used to calibrate measurements made by one or more of the acceleration sensor 116 and the magnetic field sensor 118.

The heart rate sensor 125 may be adapted to measure an individual's heart rate. The heart rate sensor 125 may be placed in contact with the individual's 100 skin, such as the skin of the individual's chest, and secured with a strap. The heart rate sensor 125 may be capable of reading the electrical activity the individual's 100 heart.

The temperature sensor 128 may be, for example, a thermometer, a thermistor, or a thermocouple that measures changes in the temperature. In some embodiments, the temperature sensor 128 may primarily be used for calibration other sensors of the athletic activity monitoring system 10, such as, for example, the acceleration sensor 116 and the magnetic field sensor 118.

In one embodiment, the position receiver 130 may be an electronic satellite position receiver that is capable of determining its location (i.e., longitude, latitude, and altitude) using time signals transmitted along a line-of-sight by radio from satellite position system satellites. Known satellite position systems include the GPS system, the Galileo system, the BeiDou system, and the GLONASS system. In another embodiment, the position receiver 130 may be an antennae that is capable of communicating with local or remote base stations or radio transmission transceivers such that the location of the sensor module 102 may be determined using radio signal triangulation or other similar principles. In some embodiments, position receiver 130 data may allow the sensor module 102 to detect information that may be used to measure and/or calculate position waypoints, time, location, distance traveled, speed, pace, or altitude.

The data port 132 may facilitate information transfer to and from the sensor module 102 and may be, for example, a USB port. In some exemplary embodiments, data port 132 can additionally or alternatively facilitate power transfer to power source 112, in order to charge power source 112.

The timer 134 may be a clock that is capable of tracking absolute time and/or determining elapsed time. In some embodiments, the timer 134 may be used to timestamp certain data records, such that the time that certain data was measured or recorded may be determined and various timestamps of various pieces of data may be correlated with one another.

In some embodiments of the present invention, a sensor module 102 having components such as those depicted in FIG. 5 may be physically coupled to an object 104 during an athletic activity conducted by an individual 100 to monitor changes in the spatial orientation of the individual's 100 body 106 or a piece of the individual's athletic equipment 108, to determine a correlation between body 106 or equipment 108 movement data and an activity metric, or to compare measured data to previously measured and recorded data. In these embodiments, the acceleration sensor 116, the magnetic field sensor 118, and/or other included sensors may be responsible for collecting the data necessary to carry out the various monitoring calculations. In some other embodiments, however, it may be desirable to have additional sensors included within the sensor module 102, to have additional sensors in communication with the sensor module 102, or to have fewer sensors with the sensor module 102.

Figure 6A:
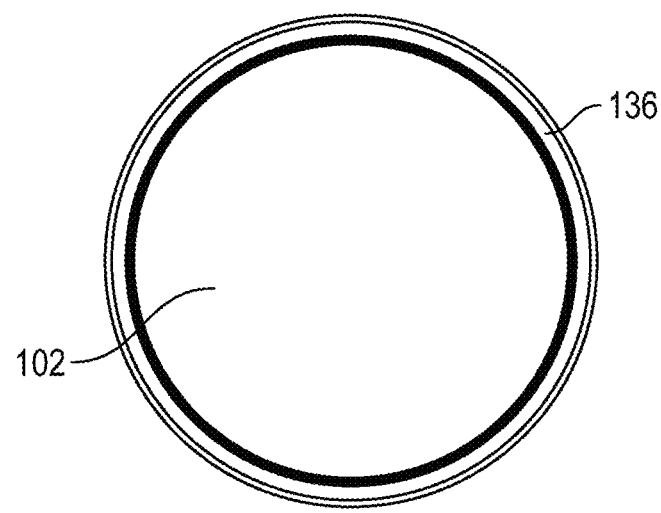
FIG. 6A is an illustration of a sensor module configured for monitoring an individual's body, according to an embodiment of the present invention.

FIG. 6A is an illustration of a sensor module 102 configured for monitoring an individual's 100 body 106 according to an embodiment of the present invention. The illustrated sensor module 102 may be similar to the sensor module 102 illustrated in FIG. 1 as being configured to be physically coupled to the portion of the individual's 100 body 106 known as the chest. In some embodiments of the present invention, the sensor module 102 of FIG. 6A may be physically coupled to an individual's 100 body 106 during an athletic activity to monitor changes in the spatial orientation of the individual's 100 body 106, to determine a correlation between body 106 movement data and an activity metric, or to compare measured data to previously measured and recorded data.

As illustrated in FIG. 6A, in one embodiment, the sensor module 102 may include a housing 136. The housing 136 may contain and protect the various electronic components of the exemplary sensor modules 102 described above with reference to FIG. 4 or FIG. 5. Though the housing 136 is illustrated as a circular disc-shaped housing in FIG. 6A, the housing may take on any suitable size and shape that is able to accommodate the necessary components of the sensor module 102 and to physically couple to the desired part of the individual's 100 body 106. In one embodiment, the housing may be made of plastic, such as, for example, TPU, or other suitably durable material.

In some embodiments, the sensor module 102 may also include a button and/or a display. The button may serve as the user interface of the sensor module 102. The button may be capable of turning the sensor module 102 on and off, toggling through various display options, or serving a variety of other functions. Alternatively, multiple buttons or no buttons may be provided. In one embodiment, the display may be a relatively simple LED display that is capable of conveying the status or battery life of the sensor module 102 to an individual 100. In another embodiment, the display may be a more advanced display that is capable of displaying performance parameter information, feedback, or other information to the individual 100, such as a seven-segment LCD display. Alternatively, no button or display may be provided, as illustrated in FIG. 6A.

Figure 6B:
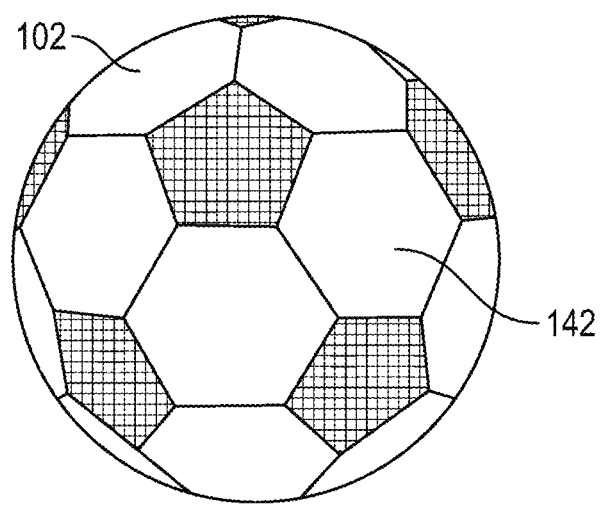
FIG. 6B is an illustration of a sport ball including a sensor module for monitoring a sport ball, according to an embodiment of the present invention.

FIG. 6B is an illustration of a sport ball comprising a sensor module 102 for monitoring the sport ball according to an embodiment of the present invention. The illustrated sensor module 102 may be similar to the sensor module 102 illustrated in FIG. 2 as being configured to be physically coupled to a piece of athletic equipment 108 that is a soccer ball. In some embodiments of the present invention, the sensor module 102 of FIG. 6B that is incorporated in the soccer ball may be used during an athletic activity to monitor changes in the spatial orientation of the soccer ball, to determine a correlation between ball movement data and an activity metric, or to compare measured data to previously measured and recorded data, as a result of, for example the individual 100 kicking the soccer ball.

As illustrated in FIG. 6B, the ball may include an outer layer 142 enclosing a hollow void of the ball. The outer layer 142 may be stitched, bonded, and/or glued together from panels of leather or plastic and laced to allow access to an internal air bladder, if necessary. In other embodiments, the ball may be a non-hollow sport ball (e.g., a baseball, bowling ball, or golf ball) including a single, solid layer or multiple different layers. In some embodiments, the sensor module 102 may be attached to or incorporated into the ball prior to sale to an individual, while in other embodiments the individual may later insert the sensor module 102 after purchasing the ball. In some embodiments, the ball may include a button and a display that may be similar to those described above with respect to the body-mounted sensor module 102, if present. Alternatively, no button or display may be provided, as illustrated in FIG. 6B.

In some embodiments of the present invention, the sensor module 102 may communicate with other components of the athletic activity monitoring system 10 via wired or wireless technologies. Communication between the sensor module 102 and other components of the athletic activity monitoring system 10 may be desirable for a variety of reasons. For example, to the extent that the sensor module 102 records and stores athletic activity information, it may be useful to transmit this information to another electronic device for additional data processing, data visualization, sharing with others, comparison to previously recorded athletic activity information, or a variety of other purposes. As a further example, to the extent that the sensor module 102 has insufficient processing power, wide area network transmission capabilities, sensor capabilities, or other capabilities, these capabilities can be provided by other components of the athletic activity monitoring system 10. With this in mind, possible communications means are described briefly below.

Wired communication between the sensor module 102 and a personal computer 204 may be achieved, for example, by placing the sensor module 102 in a docking unit that is attached to the personal computer 204 using a communications wire plugged into a communications port of the personal computer 204. In another embodiment, wired communication between the sensor module 102 and the personal computer 204 may be achieved, for example, by connecting a cable between the sensor module 102 and the computer 204. The data port 132 of the sensor module 102 and a communications port of the computer 204 may include USB ports. The cable connecting the sensor module 102 and the computer 204 may be a USB cable with suitable USB plugs including, but not limited to, USB-A or USB-B regular, mini, or micro plugs, or other suitable cable such as, for example, a FireWire, Ethernet or Thunderbolt cable. As previously explained above, in some embodiments, such cables could be used to facilitate power transfer to a power source 112 of the sensor module 102, in order to charge the power source 112. Alternatively, the power source 112 may be recharged by inductive charging, or by using a docking station.

Wired connection to a personal computer 204 may be useful, for example, to upload athletic activity information from the sensor module 102 to the personal computer 204, or to download application software updates or settings from the personal computer 204 to the sensor module 102.

Wireless communication between the sensor module 102 and the personal computer 204 may be achieved, for example, by way of a wireless wide area network (such as, for example, the Internet), a wireless local area network, or a wireless personal area network. As is well known to those skilled in the art, there are a number of known standard and proprietary protocols that are suitable for implementing wireless area networks (e.g., TCP/IP, IEEE 802.16, Bluetooth, Bluetooth low energy, ANT, ANT+ by Dynastream Innovations, or BlueRobin). Accordingly, embodiments of the present invention are not limited to using any particular protocol to communicate between the sensor module 102 and the various elements of the athletic activity monitoring system 10 of the present invention.

In one embodiment, the sensor module 102 may communicate with a wireless wide area network communications system such as that employed by mobile telephones. For example, a wireless wide area network communication system may include a plurality of geographically distributed communication towers and base station systems. Communication towers may include one or more antennae supporting long-range two-way radio frequency communication wireless devices, such as sensor module 102. The radio frequency communication between antennae and the sensor module 102 may utilize radio frequency signals conforming to any known or future developed wireless protocol, for example, CDMA, GSM, EDGE, 3G, 4G, IEEE 802.x (e.g., IEEE 802.16 (WiMAX)), etc. The information transmitted over-the-air by the base station systems and the cellular communication towers to the sensor module 102 may be further transmitted to or received from one or more additional circuit-switched or packet-switched communication networks, including, for example, the Internet.

Figure 7:
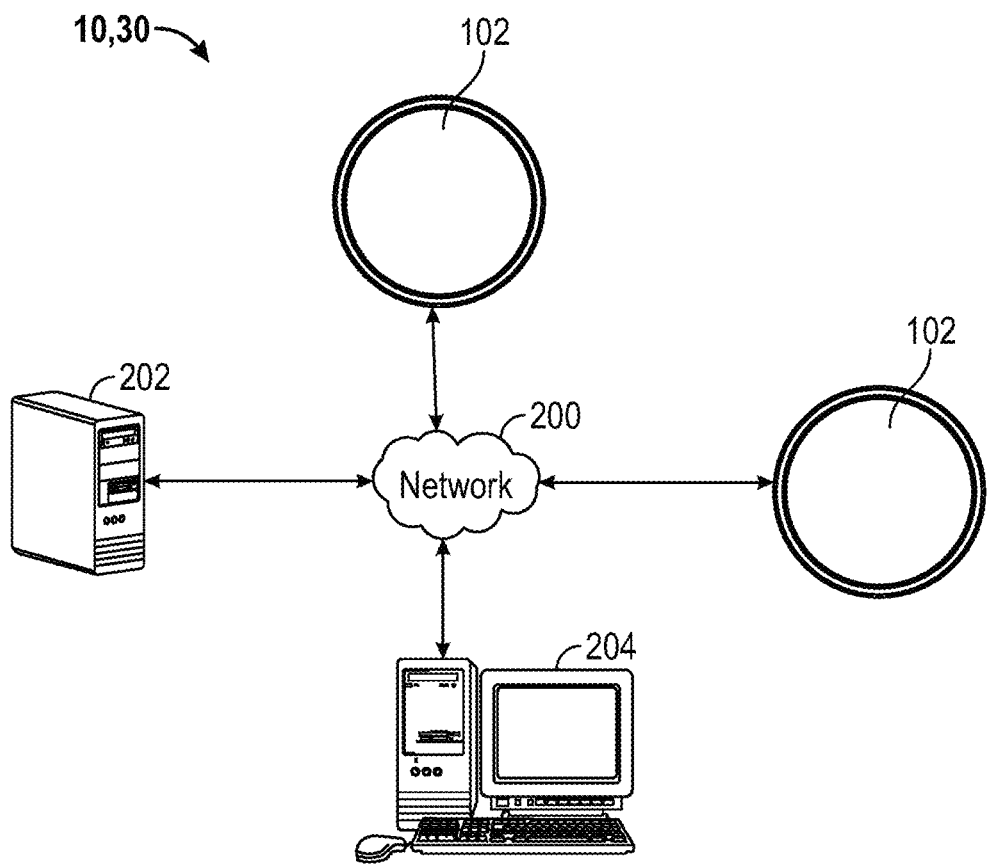
FIG. 7 is an illustration of various components of an athletic activity monitoring system communicating, according to an embodiment of the present invention.

As shown in FIG. 7, communication may also occur between the sensor module 102, a personal computer 204, and/or a remote server 202 via a network 200. In an embodiment, the network 200 is the Internet. The Internet is a worldwide collection of servers, routers, switches and transmission lines that employ the Internet Protocol (TCP/IP) to communicate data. The network 200 may also be employed for communication between any two or more of the sensor module 102, the personal computer 204, the server 202, and a docking unit. In an embodiment of the present invention, information is directly communicated between the sensor module 102 and the server 202 via the network 200, thus bypassing the personal computer 204.

A variety of information may be communicated between any of the sensor module 102, the personal computer 204, the network 200, the server 202, or other electronic components such as, for example, another sensor module 102, a mobile phone, a tablet computer, or other portable electronic devices. Such information may include, for example, performance parameter data, device settings (including sensor module 102 settings), software, and firmware.

Communication among the various elements of the present invention may occur after the athletic activity has been completed or in real-time during the athletic activity. In addition, the interaction between, for example, the sensor module 102 and the personal computer 204, and the interaction between the personal computer 204 and the server 202 may occur at different times.

In some embodiments of the present invention, an individual 100 using the athletic activity monitoring system 10 may participate in the activity with the sensor module 102 physically coupled to the individual's body 106 or to a piece of athletic equipment 108, but with no other portable electronic devices making up part of the athletic activity monitoring system 10 in the individual's immediate vicinity. In such an embodiment, the sensor module 102 would monitor the athletic activity using its sensors. The sensor module 102 may also perform calculations necessary to monitor changes in the spatial orientation of the individual's 100 body 106 or a piece of the individual's athletic equipment 108, perform calculations necessary to determine a correlation between body 106 or equipment 108 movement data and an activity metric, or to compare measured data to previously measured and recorded data.

Alternatively, in this scenario, other components of the athletic activity monitoring system 10 that are remotely located from the individual 100 during the activity could be relied upon to perform calculations necessary to monitor changes in the spatial orientation of the individual's 100 body 106 or a piece of the individual's athletic equipment 108, or perform calculations necessary to determine a correlation between body 106 or equipment 108 movement data and an activity metric. This could occur, for example after wireless transmission of athletic performance information directly from the sensor module 102 to a personal computer 204 or a server 202 during or after the activity, or after a wired transmission of athletic performance information directly from the sensor module 102 to a personal computer 204 after the activity.

Figure 8A:
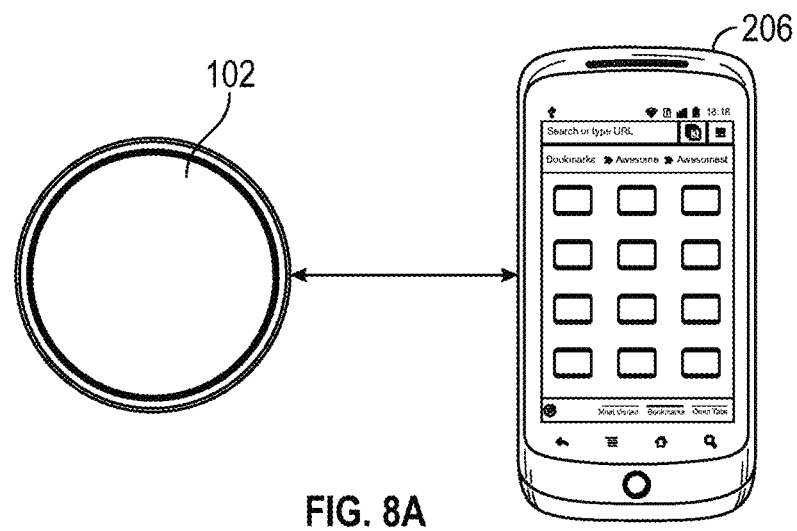
FIG. 8A is an illustration of various components of an athletic activity monitoring system communicating, according to an embodiment of the present invention.

However, in other embodiments of the present invention, as illustrated in FIG. 8A, the sensor module 102 may communicate with a portable electronic device 206 of the athletic activity monitoring system 10 that is also carried by the individual 100 during the athletic activity. In some embodiments, the portable electronic device 206 may be a watch, a mobile phone, a tablet computer, or other portable electronic device.

The portable electronic device 206 may serve a variety of purposes including, for example, providing additional data processing, providing additional data storage, providing data visualization, providing additional sensor capabilities, relaying information to a network 200, or providing for the playback of music.

In one embodiment of the present invention, the portable electronic device 206 may be a dedicated portable electronic device 206. The term "dedicated portable electronic device" indicates that the portable electronic device 206 is not capable of serving another purpose outside of the athletic activity monitoring system 10 of the present invention. For example, a mobile phone, a personal digital assistant, or a digital music file player (e.g., an MP3 player) may not be considered to be "dedicated portable electronic monitoring devices" as the term is used herein. In this manner, the dedicated portable electronic monitoring device 206 may in some embodiments provide a simpler and/or more efficient device.

The portable electronic device 206 illustrated in FIG. 8A is not a dedicated portable electronic monitoring device; the portable electronic device 206 illustrated in FIG. 8A is a mobile phone. In alternate embodiments, it may be possible for the sensor module 102 itself to be embodied by a mobile phone. Including a portable electronic device 206 in the athletic activity monitoring system 10, such as a mobile phone, may be desirable as mobile phones are commonly carried by individuals, even when engaging in athletic activities, and they are capable of providing significant additional computing and communication power at no additional cost to the individual 100.

In view of the above discussion, it is apparent that various processing steps or other calculations recited herein may be capable of being performed by various embodiments of the athletic activity monitoring system 10 disclosed herein, and are not necessarily limited to being performed by the sensor module 102, depending on the configuration of a particular embodiment of the present invention. For example, any of the processing steps or other calculations recited herein may be performed, in various embodiments, by the sensor module 102, by a server computer 202, by a personal computer 204, by a portable electronic device 206, and/or any other network component, or by more than one component.

Embodiments of the present invention may involve the use of so-called "cloud computing." Cloud computing may include the delivery of computing as a service rather than a product, whereby shared resources, software, and information are provided to computers and other devices as a utility over a network (typically the Internet). Cloud computing may entrust services (typically centralized) with a user's data, software and computation on a published application programming interface over a network. End users may access cloud-based applications through a web browser or a light weight desktop or mobile app while the business software and data are stored on servers at a remote location. Cloud application providers often strive to give the same or better service and performance than if the software programs were installed locally on end-user computers.

Figure 8B:
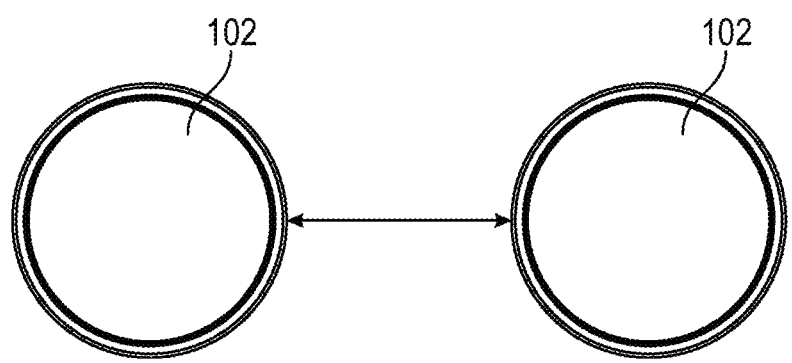
FIG. 8B is an illustration of two sensor modules communicating, according to an embodiment of the present invention.

FIG. 8B illustrates a first sensor module 102 in wireless communication with a second sensor module 102. In an embodiment, such communication may be desirable so that different individuals 100, including individuals 100 on the same athletic team, can compare their performance in athletic activities or otherwise exchange data without having to first transmit data through a remote computer such as a personal computer 204 or a server 202.

Figure 9:
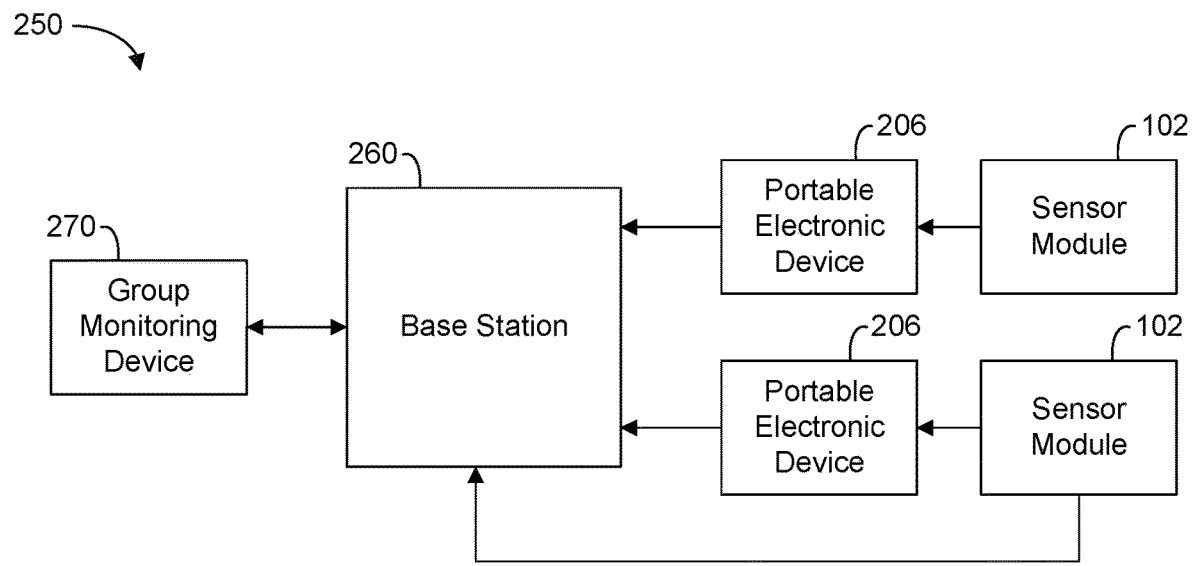
FIG. 9 is an illustration of a group monitoring system, according to an embodiment of the present invention.

FIG. 9 is an illustration of a group monitoring system according to an embodiment of the present invention. In an exemplary embodiment, group monitoring system 250, depicted in, for example, FIG. 9, includes portable electronic devices 206, a base station 260, and at least one group monitoring device 270. Portable electronic device 206 may be coupled to an individual 100. Portable electronic device 206 may include or be in communication with a sensor module 102 or individual sensors associated with an individual 100 or their athletic equipment 108, including, but not limited to, an acceleration sensor 116, a magnetic field sensor 118, a pedometer, a heart rate monitor, a position sensor, an impact sensor, a camera, a gyroscope, a microphone, a temperature sensor, and a wind sensor.

In an exemplary embodiment, the portable electronic device 206 and/or the sensor module 102 may include a sensor garment, a heart rate monitor, and a position sensor. The position sensor may include, for example, a position sensor for use with a satellite-based positioning system, a position sensor for use with a beacon system (e.g., position determination using triangulation and/or time differences of signals received by antennas at known positions about a field or activity area), or a position sensor for use with any other suitable position-determining system. In some exemplary embodiments, group monitoring device 270 may be used by a coach.

Sensor modules 102 may be mounted to individuals 100 in preparation for participation by individuals 100 in a session of athletic activity. Sensor modules 102 mounted to a particular individual 100 may be coupled, either via wires or wirelessly, to a portable electronic device 206, also mounted on the particular individual 100. The sensor modules 102 may sense characteristics about individuals 100 during participation by individuals 100 in the session of athletic activity, and transmit data indicative of the characteristics to the portable electronic device 206. The portable electronic device 206 in turn transmits the data to base station 260 during the session of athletic activity.

In some exemplary embodiments, this transmission occurs in real time. "Real time" as used herein may include delays inherent to transmission technology, delays designed to optimize resources, and other inherent or desirable delays that would be apparent to one of skill in the art. In some exemplary embodiments, this transmission is delayed from real time, or may occur after completion of the activity. Base station 260 may receive the data and may determine metrics from the data, where the metrics may be representations of the characteristics measured by sensor modules 102, or may be representations of further characteristics derived from the data through the use of algorithms and other data manipulation techniques. Base station 260 in turn may transmit the metrics during the session of athletic activity to group monitoring device 270, which may receive the metrics and display a representation of the metrics.

Group monitoring device 270 may receive metrics associated with a plurality of individuals 100, and may display the received metrics in association with the individuals 100 with which they are associated. In this way, a coach viewing group monitoring device 270 during the session of athletic activity receives detailed information about multiple individuals 100, and can act on that information as it is determined necessary or expedient, thereby efficiently monitoring and managing individuals 100 during the session of athletic activity.

Suitable group monitoring systems and components may include, for example, the systems and components disclosed in commonly owned U.S. patent application Ser. No. 13/077,494, titled "Group Performance Monitoring System and Method," U.S. patent application Ser. No. 13/077,510, titled "Group Performance Monitoring System and Method," and U.S. patent application Ser. No. 13/543,428, titled "Group Performance Monitoring System and Method," whose disclosures are incorporated herein by reference in their entireties.

An overview of exemplary embodiments of components of the athletic activity monitoring system 10 of the present invention, including exemplary sensor modules 102, has been provided above. A description of various exemplary methods of using the athletic activity monitoring system 10 of the present invention to monitor changes in the spatial orientation of the individual's 100 body 106 or a piece of the individual's athletic equipment 108, to determine a correlation between body 106 or equipment 108 movement data and an activity metric, or to compare measured data to previously measured and recorded data is now provided below.

An individual 100 engaged in an athletic activity (or another interested person such as a coach, teammate, or spectator) may desire to obtain information about the position and movement of the individual's 100 body 106 or the position and movement of a piece of the individual's athletic equipment 108 during the course of the athletic activity.

For example, if the individual 100 is participating in an activity that involves the use of a sport ball, such as playing in a soccer match, it may be desirable, for example, to be able to determine the various launch angles at which the soccer ball (i.e., football) was kicked by the individual 100, to be able to determine the rate of rotation of the soccer ball after it was kicked by the individual 100, to be able to determine various positions of the soccer ball on the field, or to be able to determine the peak speeds that the soccer ball was traveling at after being kicked by the individual 100.

As a further example, if the individual 100 is participating in an activity that involves various movements the individual's 100 chest, such practicing basketball skills, it may be desirable, for example, to be able to identify instances when the individual 100 cut to the left or cut to the right when trying to dribble around a defender, to be able to determine the position of and amount of time spent by the individual 100 at certain locations on the court, to be able to determine the height that the individual 100 jumped or the force that the individual 100 jumped with when taking jump shots, attempting dunks, or attempting to block shots, or to be able to determine the individual's 100 reaction time when working on basketball-related reaction time drills.

By using the athletic activity monitoring system 10 including the sensor module 102 described above, embodiments of the present invention may advantageously enable the individual 100 (or their coach, teammate, or a spectator) to obtain this or other information about the position and movement of the individual's 100 body 106 or the position and movement of a piece of the individual's 100 athletic equipment 108 during or after the course of the athletic activity.

While various embodiments of the present invention are described in the context of the sports of soccer (i.e., football) and basketball, the present invention is not so limited and may be applied in a variety of different sports or athletic activities including, for example, baseball, bowling, boxing, cricket, cycling, football (i.e., American football), golf, hockey, lacrosse, rowing, rugby, running, skateboarding, skiing, surfing, swimming, table tennis, tennis, or volleyball, or during training sessions related thereto. In addition, activity metrics described as being capable of being determined in soccer may be capable of being determined in basketball, or vice versa, when appropriate.

Data obtained by the sensor module 102 may be processed in a variety of ways to yield useful information about the motion of an object 104 of interest during the activity. In some embodiments, sensor module 102 data may be processed to monitor changes in the spatial orientation of the individual's 100 body 106 or a piece of the individual's 100 athletic equipment 108. In other embodiment, sensor module 102 data may be processed to by reference to a predetermined correlation between movement data and an activity metric stored in a data structure. In other embodiments, measured data may be compared with previously measured and recorded data.

Regardless of whether the athletic activity monitoring system 10 and the sensor module 102 are being used to monitor the individual's 100 body 106 or a piece of the individual's 100 athletic equipment 108, in embodiments of the present invention where there is a desire to monitor changes in the spatial orientation or movement of the individual's 100 body 106 or the piece of the individual's 100 athletic equipment 108, a common analytical framework may be used to carry out the monitoring. In such an embodiment, the individual 100 may use the sensor module 102 in the athletic activity monitoring system 10 to determine a change in spatial orientation or movement of the object 104. The sensor module 102 may detect movement of the object 104. In one embodiment, movement of the object 104 is detected based on acceleration data captured by the acceleration sensor 116 of the sensor module 102. In another embodiment, movement of the object 104 is detected based on magnetic field data captured by the magnetic field sensor 118 of the sensor module 102. In yet another embodiment, movement of the object 104 is detected based on both acceleration data and magnetic field data. In some embodiments, movement of the object 104 may detected based on satellite positioning system data.

In one embodiment, the magnetic field sensor 118 may be adapted to measure the intensity and/or direction of magnetic fields in the vicinity of the sensor module 102. In another embodiment, the magnetic field sensor 118 may be adapted to measure the intensity and/or direction of the earth's magnetic field in the vicinity of the sensor module 102. In some embodiments, the magnetic field sensor 118 may be capable of measuring the magnitude and/or direction of a resultant magnetic vector for the total local magnetic field and/or for the local earth's magnetic field.

If the monitored object 104 is a soccer ball, the detected movement may consist of the soccer ball rolling on the ground as a result of being dribbled by the individual 100. If the monitored object 104 is the chest of an individual 100 playing basketball, the detected movement may consist of the individual's chest moving forward as the individual dribbles a basketball down the court.

In some embodiments, the sensor module 102 may then determine that the movement of the object 104 indicates the occurrence of a movement to track. In one embodiment, the determination that the movement of the object 104 indicates the occurrence of a movement to track occurs when a threshold data value is met for a predetermined period of time. For example, the sensor module 102 may determine that a movement of the object 104 has resulted in a threshold acceleration and/or magnetic field change occurring for a predetermined period of time.

In some embodiments, the determination of the occurrence of a movement to track is an indication that the movement to track had already begun prior to the determination. In this case, it is still possible to capture all of the relevant data relating to the movement as the sensor module 102 may temporarily record a stream of data in a buffer in the event that data that had recently been recorded may need to be examined or more permanently recorded in response to a determination that an occurrence of a movement to track is found. In other embodiments, the determination of the occurrence of a movement to track is an indication that the movement to track is about to begin in the near future. In some embodiments, the sensor module 102 is adapted to store data permanently or temporarily, and may further be adapted to store data for predefined periods of time in certain circumstances, such as when populating a data buffer.

If the monitored object 104 is a soccer ball, the movement of the soccer ball as a result of the individual 100 swiftly kicking the ball in an attempt to make a goal may result in a determination that the motion of the ball in response to the kick—which could include motion of the ball before, during, and/or after the determination was made—should be tracked. If the monitored object 104 is the chest of an individual 100 playing basketball, the rotation of the individual's 100 chest through one-hundred and eighty degrees of rotation when making an offensive movement may result in a determination that the rotation of the individual's chest—which could include motion of the individual's 100 chest before, during, and/or after the determination was made—should be tracked.

In response to the determination of the occurrence of a movement to track, an initial spatial orientation of the object 104, which may include the object's position, may be determined. In some embodiments, the determination of an initial spatial orientation of the object 104 may be made by reference to a coordinate axis system.

Figure 10:
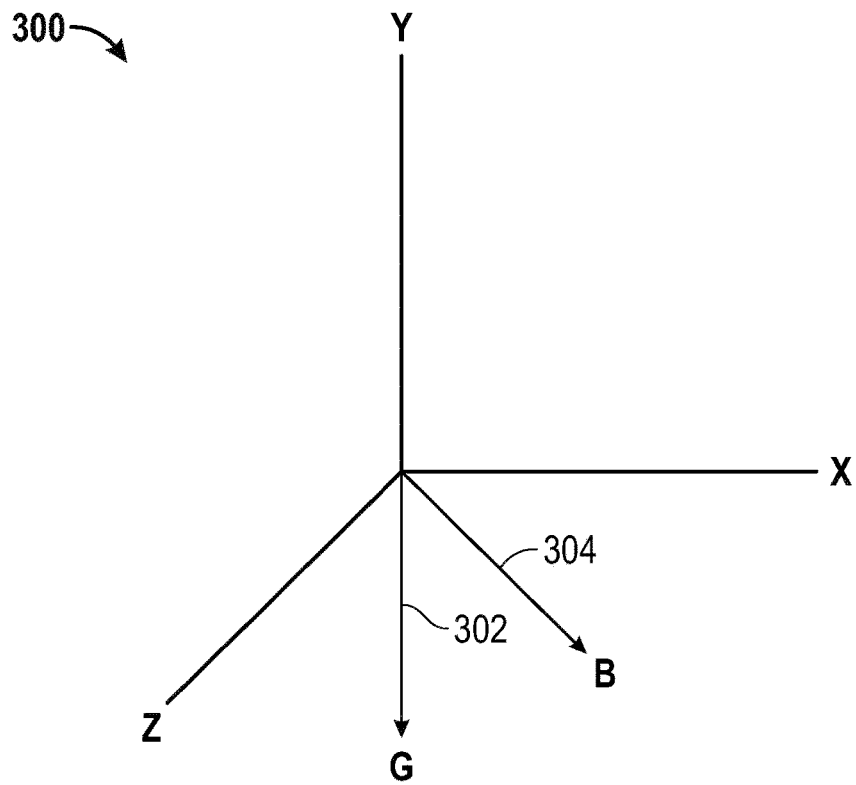
FIG. 10 is an illustration of an exemplary coordinate system, according to an embodiment of the present invention.

A coordinate axis system is a useful analytical tool for monitoring changes in the spatial orientation of an object 104. FIG. 10 illustrates an exemplary three-dimensional Cartesian coordinate axis system 300 having three axes—an X axis, a Y axis, and a Z axis. Two vectors, "G" and "B," are superimposed on the coordinate axis system 300 illustrated in FIG. 10. The G-vector 302 pointing in the—Y direction represents a gravity vector. The B-vector 304 represents a resultant magnetic field vector.

Figure 11:
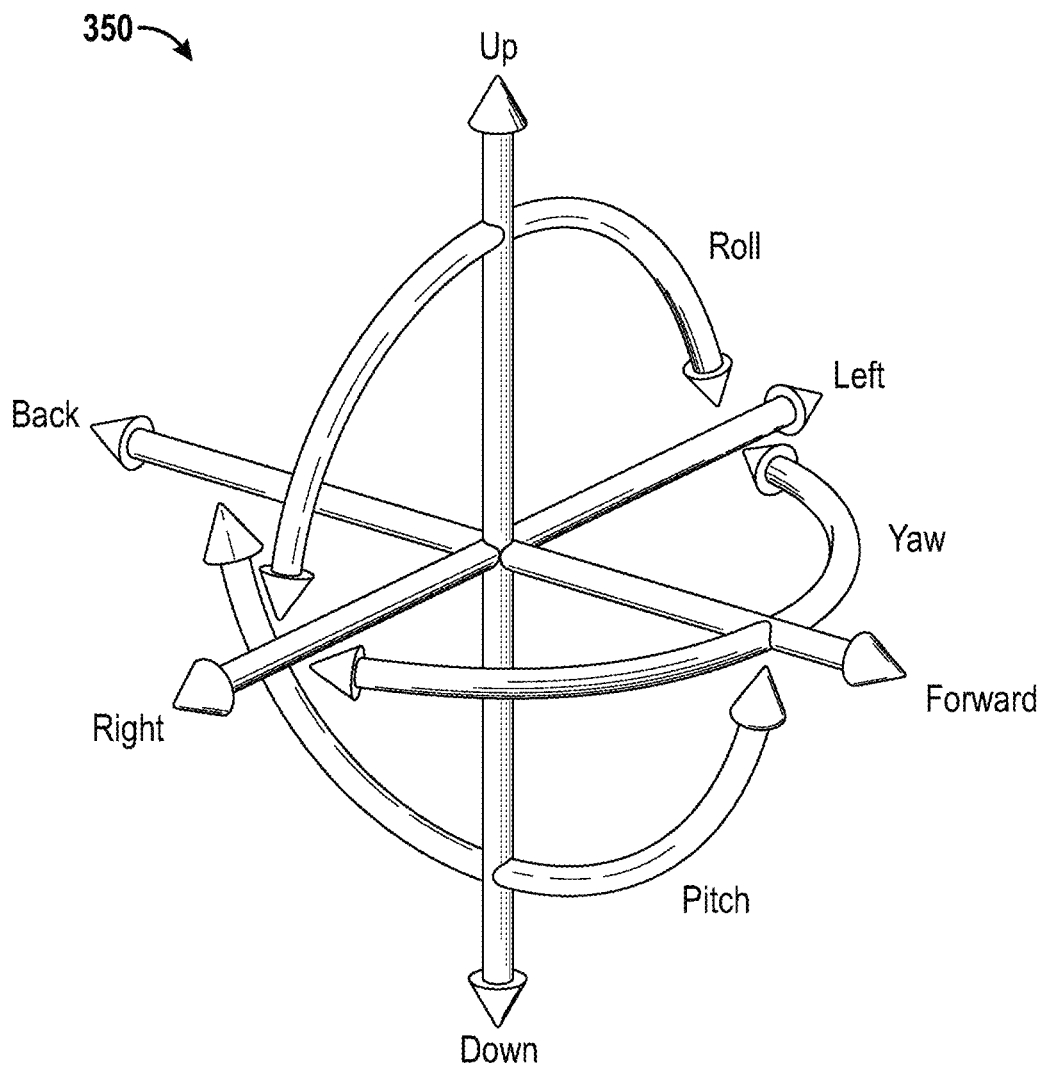
FIG. 11 is an illustration of an exemplary coordinate system, according to an embodiment of the present invention.

FIG. 11 illustrates another exemplary three-dimensional Cartesian coordinate axis system 350. This system 350 defines six degrees of freedom for a rigid body, such as the object 104. Six degrees of freedom refers to motion of a rigid body in three-dimensional space, namely the ability to move forward/backward, up/down, left/right (translation in three perpendicular axes) combined with rotation about three perpendicular axes (pitch, yaw, roll), as illustrated in FIG. 11.

In one embodiment, the determination of the initial spatial orientation of the object 104 may be made with respect to a gravity vector 302, such as that illustrated in FIG. 10. In another embodiment, the determination of the initial spatial orientation of the object 104 may be made with respect to an earth magnetic field vector 304, such as that illustrated in FIG. 10. In other embodiments, the determination of the initial spatial orientation of the object 104 may be made with respect to characterizations of the way that the object translated and rotated in three-dimensional space with six degrees of freedom, as explained with reference to FIG. 11.

After the determination of the initial orientation of the object 104 at a first time has been made, a change in the spatial orientation of the object 104 may be determined. In an embodiment, the determination of the change in the spatial orientation of the object 104 may be made similarly to the determination of the initial orientation of the object 104, except that additional information about changes in the orientation of the gravity vector 302 and/or the magnetic field vector 304 as the object moves may be additionally factored in.

An activity metric can be determined based on the change in the spatial orientation of the object 104 determined. The nature of the activity metric may change based on the athletic activity that the individual 100 is participating in, as well as particular object 104 that is being monitored. In one embodiment, the activity metric may relate to, for example, a launch angle, a rate of rotation, a speed, a location, a jump height, a jump force, a jump distance, a kick force, a kick distance, a characterization of a specific type of athletic movement, or a reaction time measurement. In other embodiments, the activity metric may be, for example, the rate of rotation, the plane of rotation, the jump force, force profile (force acting upon the body of the athlete or the ground or the object), stroke information in tennis, swing profile in golf, baseball, hockey stick, kick profile of a leg, angle position of a bike pedal, power output of a cyclist, fatigue (tremors starting to occur in repeated motion, i.e., running, lifting swimming, rowing etc.), posture, throwing or arm swing technique, and shooting technique.

An output can be provided that conveys the activity metric to the individual 100, a coach, a teammate, a spectator, or any other interested person. In one embodiment, the output may be an audible, visual, and/or haptic output.

In some embodiments of the present invention, the sensor module 102 may be capable of compensating for inherent deficiencies that may be present for various types of sensor contained within or in communication with the sensor module 102. Most real world sensors have limitations. For example, accelerometers, magnetometers, gyroscopes, and satellite positioning system receivers may have accuracy issues, particularly when used at speeds or under other conditions that differ from their initial calibration conditions.

In some systems, if sensor data, such as acceleration sensor 116 or magnetic field sensor 118 data, is temporarily lost or otherwise unavailable, the data from the unavailable sensor is not used in subsequent processing or calculations. In other systems, lost data may be estimated by "straight line" methods where, for example, it is assumed that the data stays constant or changes at a constant rate. However, in some embodiments of the present invention sensor data, such as one of acceleration sensor 116 or magnetic field sensor 118 data may be used to compensate for and/or estimate the changes in the other of acceleration sensor 116 or magnetic field sensor 118 data based on known, derived, or estimate correlations between the two types of data, or data extrapolation.

By combining the data produced by, for example, acceleration sensor 116 and a magnetic field sensor 118, systems and methods according to embodiments of the present invention are able to more accurately determine absolute data values or activity metrics even when data from one of the acceleration sensor 116 or the magnetic field sensor 118 is lost for any reason. Using the data that is not missing, the system can continue to provide data values or activity metrics to fill in the "holes" until the missing data is regained or otherwise again sampled.

In other embodiments of the present invention, angular momentum sensor 124 data, such as gyroscope data, may be used in combination with one or more of acceleration sensor 116 or magnetic field sensor 118 data for data calibration and/or extrapolation.

In some embodiments of the present invention, calibration and/or generation of correction factor data for an acceleration sensor 116 or magnetic field sensor 118—based sensor modules 102 may be performed under a variety of different use conditions, e.g., calibration data or correction factors may be generated for use at different movement speeds, for use with an individual's 100 body 106, with a piece of athletic equipment 108, for use in different sports, for use under different wind conditions, for use under different court or field conditions, etc. Moreover, this variety of correction factors and/or calibration data may be collected, in the background, over time, as the individual 100 continues using the system. In this manner, a "lookup table" or other "universe" or library of calibration data or correction factors may be built up and stored in the monitoring system (optionally in the portable portion of the system), such that an appropriate correction factor could be generated and applied for a full range of individual 100 or athletic equipment 108 speeds and/or other use conditions.

A microprocessor provided with the system (optionally in the portable portion of the system, in the personal computer, etc.) may be programmed to interpolate between and/or extrapolate from known calibration or correction factors to arrive at the most appropriate calibration or correction factor for use at any speed or other use condition(s). Also, in this manner, different calibration or correction factors may be applied at different times during a single athletic performance, e.g., based on the speed or other use conditions determined at a given time during the performance, to further help improve the overall accuracy of the speed and distance monitor. By having a variety of correction or calibration factors available under different performance conditions, the sensor module 102 will tend to become more accurate, particularly over time and with increased use, because of the increased number of calibration and correction factors generated with increased use.

In one embodiment of the present invention, the sensor module 102 may be affected by perturbations in local magnetic fields, such as the earth's magnetic field. The local magnetic field may be more variable at certain distances near the surface of the earth than at other distances further away from the earth. For example, the local magnetic field may be more variable or perturbed within approximately three feet of the surface of the earth than at more than approximately three feet away from the surface of the earth. Accordingly, in some embodiments, magnetic field sensor 118 data obtained from an object 104 when the object 104 is more than approximately three feet away from the surface of the earth may be used to extrapolate or otherwise estimate proper or likely magnetic field sensor 118 data from when the object 104 was within approximately three feet of the surface of the earth, if the magnetic field sensor 118 data from when the object 104 was within approximately three feet of the surface of the earth is otherwise deemed to be unreliable due to the relatively high variability in local magnetic fields, such as the earth's magnetic field, near the surface of the earth.

In some embodiments, sensor module 102 of monitoring system 10 can be mounted to an individual 100. In some embodiments, multiple sensor modules 102 can be mounted to individual 100 (e.g., one sensor module having axes at one or more oblique angles to another sensor module). In some embodiments, sensor modules 102 may be mounted to individual 100 at different locations (e.g., on the trunk of individual 100, on one or more appendages of individual 100). For example, individual 100 may be an athlete performing an athletic activity. Monitoring system 10 including sensor module 102 mounted to individual 100 is referred to as monitoring system 30. Sensor module 102 can be mounted to individual 100 using any suitable technique. For example, sensor module 102 may be worn by individual 100 by being coupled to an exterior or interior of individual 100, by being mounted to individual 100 using a harness system worn by individual 100, by being carried in a pocket of a garment worn by individual 100, by being affixed to the skin of individual 100 (e.g., using adhesive), by being carried by an article of equipment carried or worn by individual 100 (e.g., a helmet, a mouth guard, a jock strap, a protective pad, an article of footwear), or by being inserted within the body of individual 100 (e.g., surgically, orally). Exemplary techniques that can be employed to mount sensor module 102 to individual 100 are described in commonly owned U.S. patent application Ser. No. 13/077,520, filed Mar. 31, 2011, whose disclosure is incorporated herein by reference in its entirety.

In some embodiments, sensor module 102 can be activated (i.e., enter an active state) in response to sensing an activation motion or movement of individual 100 (the terms "motion" and "movement" are used interchangeably herein).

In some embodiments, the activation motion may be, for example, jumping above a predetermined height, jumping a predetermined number of times in within a predetermined period, walking a predetermined number of steps. In some embodiments, the activation motion may be, for example, a sequence of motions (e.g., motion in response to three jumps performed in quick succession, or within a predetermined time period such as, for example, 3 seconds). Upon activation, sensor module 102 begins to store (e.g., in memory 114) and/or transfer sensed data to a remote device, as described herein. In some embodiments, in an active state, sensor module 102 may continuously sense data (e.g., acceleration data (data representative of acceleration) is determined by acceleration sensor 116 of sensor module 102, and magnetic field data (data representative of a magnetic field) is determined by magnetic field sensor 118 of sensor module 102). In some embodiments, data is sensed by sensor module 102 periodically (e.g., every 50 milliseconds (ms), every 10 ms, every 1 ms).

In some embodiments, sensor module 102 can be deactivated (e.g., enter a low-power standby state, detecting acceleration at a low frequency relative to the active state) in response to sensing no motion of sensor module 102 for a predetermined period of time (e.g., 30 minutes). In some embodiments, sensor module 102 can be deactivated in response to sensing a deactivation motion individual 100. In some embodiments, the deactivation motion may be, for example, any of the motions described above as an activation motion. In some embodiments, a deactivation motion may be the same as an activation motion. In some embodiments, a deactivation motion may be different from an activation motion.

In some embodiments, data sensed by sensor module 102 may be time-correlated (e.g., stored in association with time data representing the time at which the data was sensed). The time at which data is sensed can be provided via timer 134. In operation, sensor module 102 of monitoring system 30 senses and processes signals as described herein to output representations of activity metrics of individual 100. In some embodiments, representations of activity metrics can be output to, for example, a display device (e.g., a display of personal computer 204, portable electronic device 206, or sensor module 102). Sensor module 102 can be powered by any suitable technique, including those described herein.

In some embodiments, monitoring system 30 including sensor module 102 mounted to individual 100 can be used to determine a variety of activity metrics about individual 100, including characteristics relating to motion of individual 100. For example, monitoring system 30 can be used to identify a motion characteristic of individual 100 (e.g., position of individual 100 or a portion thereof, orientation of individual 100 or a portion thereof, orientation and/or magnitude of speed of individual 100 or a portion thereof, orientation and/or magnitude of acceleration of individual 100 or a portion thereof, orientation and/or magnitude of forces applied to individual 100 or a portion thereof, duration of movement of individual 100 or a portion thereof, posture of individual 100 or a portion thereof, and/or rotation of individual 100 or a portion thereof); to identify a motion made by individual 100; to determine a jump characteristic of individual 100 (e.g., maximum jump height, jump force); or to determine reaction time of individual 100 (e.g., time to perform an instructed motion after being instructed, or time to reach a target, for example, to reach maximum speed, to reach a fully erect position from a crouch, to dive from an upright position). In some embodiments, monitoring system 30 can be used to define a motion.

For example, monitoring system 30 can be used to define a motion made by individual 100 in terms of data sensed by sensor module 102 during performance of the motion. Monitoring system 30 can perform operations as described herein to determine such activity metrics using any suitable components. For example, sensing operations, as described, may be carried out by a sensor of sensor module 102 of monitoring system 30 (e.g., acceleration sensor 116 or magnetic field sensor 118, as appropriate). Also for example, operations involving processing of data (e.g., identifying, determining, calculating, storing) may be carried out by processor 110 of sensor module 102, or by a processor of any other device of or in communication with monitoring system 30 (e.g., server 202, personal computer 204, or portable electronic device 206).

In some embodiments, calibration data is sensed by sensor module 102 when individual 100 (or at least sensor module 102) is in a calibration state. In some embodiments, sensor module 102 is in a calibration state when sensor module 102 is stationary (e.g., with respect to an external coordinate system (i.e., a coordinate system independent of sensor module 102), such as, for example, coordinate system 600 (depicted in FIG. 12), for a period of time (e.g., 10 ms or longer)). In some embodiments, sensor module 102 can be considered stationary when sensor module 102 senses resultant acceleration of about 1G (i.e., resultant acceleration within a threshold tolerance of 1G, for example, within 5% of 1G). In some embodiments sensor module 102 can be considered stationary at times while individual is performing a movement. For example, sensor module 102 can be stationary for a period of time within a period of time in which a basketball player jumps (e.g., a period of time connecting spanning the transition from downward motion of individual 100 while bending to initiation the jump, to upward motion of individual 100 to begin launch of the jump, sensor module 102 can be considered stationary, where resultant acceleration sensed by sensor module 102 is about 1G). Also for example, sensor module 102 can be stationary due to its location on individual 100, though individual 100 is performing a motion (e.g., a sensor module 102 connected to the foot of individual 100 may be considered stationary each time the foot is planted during a running movement of individual 100, where resultant acceleration sensed by sensor module 102 is about 1G).

Figure 12:
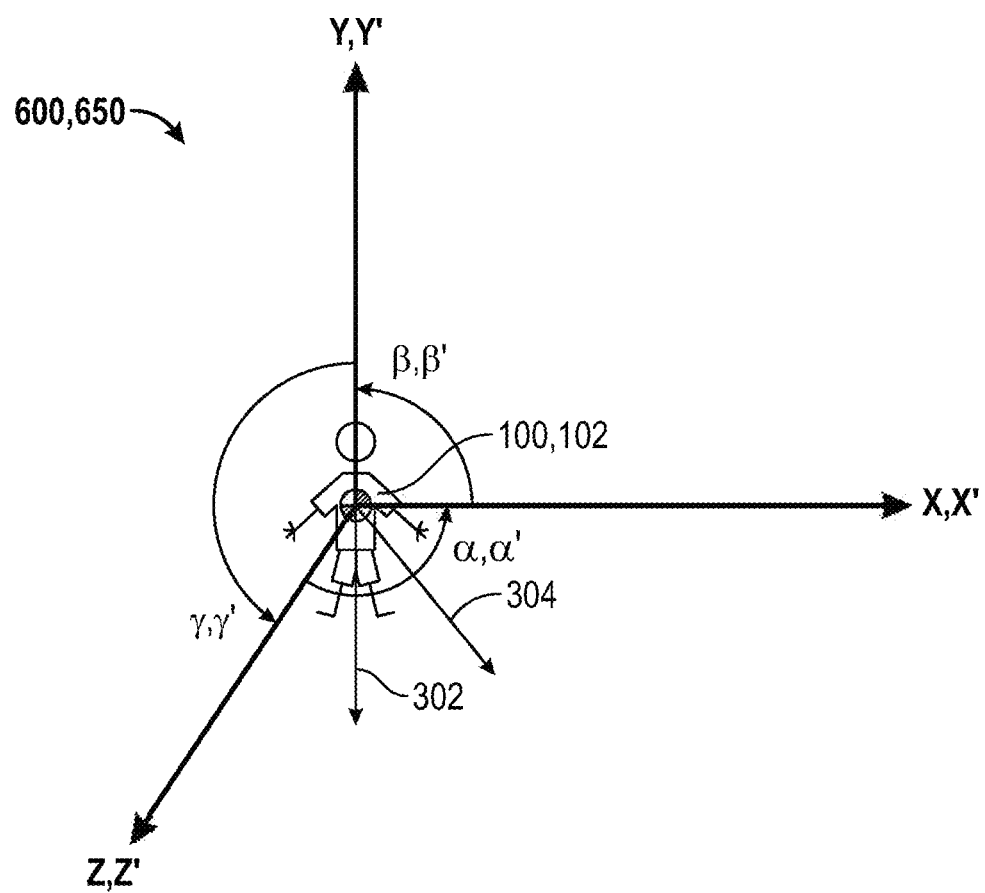
FIG. 12 is an illustration of an individual in a calibration state, according to an embodiment of the present invention.

Sensor module 102 is depicted in the calibration state in FIG. 12. Sensor module 102 may be in the calibration state at any point relative to an athletic activity (e.g., before, during, or after an athletic activity). In some embodiments, sensor module 102 is determined to be in a calibration state, and calibration data can be sensed, each time sensor module 102 is stationary. In some embodiments, sensor module 102 is determined to be in a calibration state, and calibration data can be sensed, each time sensor module 102 is stationary for more than a threshold duration (e.g., 1 second) where calibration data has not been sensed for a threshold duration (e.g., 1 minute, 10 minutes, 30 minutes).

In some embodiments, in the calibration state acceleration sensor 116 of sensor module 102 senses acceleration data. In some embodiments magnetic field sensor 118 of sensor module 102 senses magnetic field data (e.g., data relating to the magnetic field of the earth). In some embodiments, calibration data includes both acceleration data and magnetic field data. In some embodiments, calibration data includes one of acceleration data and magnetic field data.

In some embodiments, in the calibration state, the acceleration data sensed by acceleration sensor 116 of sensor module 102 is acceleration due to gravity, which can be used by monitoring system 30 to determine one or both of orientation of acceleration due to gravity with respect to sensor module 102 and magnitude of acceleration due to gravity at sensor module 102 (together, gravity vector 302).

In some embodiments, in the calibration state, magnetic field sensor 118 of sensor module 102 senses one or both of orientation of a magnetic field with respect to sensor module 102 and magnitude of the magnetic field at sensor module 102 (together, magnetic field vector 304).

In some embodiments sensor module 102 senses calibration data that is to be relied upon for one or more subsequent calculations. In some embodiments the calibration data sensed when sensor module 102 is in the calibration state can be used to establish external coordinate system 600. In some embodiments external coordinate system 600 can be established by reference to the orientation of gravity vector 302 (e.g., to establish the direction of "down," since gravity is known to cause downward acceleration). In some embodiments external coordinate system 600 can be established by reference to the orientation of magnetic field vector 304 (e.g., to establish a constant reference direction, since the magnetic field will typically be appreciably constant over the area of a typical play area for an athletic activity). In some embodiments external coordinate system 600 can be established by reference to the orientation of gravity vector 302 and the orientation of magnetic field vector 304.

During motion, individual 100 (and sensor module 102) may move in any or all of six degrees of freedom—three linear degrees: (1) up/down (e.g., along the Y axis in external coordinate system 600), (2) left/right (e.g., along the X axis in external coordinate system 600), and (3) backward/forward (e.g., along the Z axis in external coordinate system 600); and three rotational degrees: (1) yaw (e.g., in the angular α direction in external coordinate system 600), (2) roll (e.g., in the angular β direction in external coordinate system 600), and (3) pitch (e.g., in the angular γ direction in external coordinate system 600).

Individual 100 or other person may desire to know activity metrics of individual 100, for example, to learn the effects of actions of individual 100. Monitoring system 30 may determine such activity metrics (e.g., identification of forces acting on or applied by individual 100, identification of a motion made by individual 100, determination of a jump characteristic of individual 100, and determination of a reaction time of individual 100). Sensor module 102 may output data representative of such activity metrics (e.g., to a display device of personal computer 204 or portable electronic device 206). Such data may be outputted from sensor module 102 in raw form (e.g., unprocessed signals from acceleration sensor 116 and/or magnetic field sensor 118) or in representative form (e.g., data that results from processing signals from acceleration sensor 116 and/or magnetic field sensor 118). In some embodiments monitoring system 30 outputs a representation of one or more activity metrics in a manner perceivable by individual 100 and/or other person.

Data representative of such activity metrics can be processed and/or output in any suitable manner, such as, for example, those described herein.

In some embodiments movement data profiles (i.e., one or more of sensed acceleration data and magnetic field data that define a movement) for one or more movements may be stored within or otherwise accessible by monitoring system 30 such that monitoring system 30 can compare sensed acceleration data and magnetic field data with the movement data profiles.

In some embodiments, monitoring system 30 may compare sensed acceleration data and magnetic field data of individual 100 with one or more movement data profiles. In some embodiments, monitoring system 30 may perform such comparison continuously.

In some embodiments, upon determining a sufficient degree of correspondence between the sensed acceleration data and magnetic field data and a movement data profile or portion thereof, monitoring system 30 identifies the motion corresponding to that movement data profile as the movement performed by individual 100. In some embodiments, a sufficient degree of correspondence is determined where the difference between the sensed acceleration data and magnetic field data and the movement data profile is less than a predetermined threshold (the threshold may be different for different movement data profiles).

In some embodiments, movement data profiles can include expressions of acceleration data and magnetic field data, and variables derived therefrom (e.g., force, acceleration magnitude, acceleration orientation, magnetic field magnitude, magnetic field orientation), and can be expressed and/or stored as data structures within monitoring system 30, for example, as an algorithm, as a graphical curve, or as a lookup table.

In some embodiments, representations of activity metrics can be presented as functions of one another, or of other variables. For example, jump height can be presented as a function of trunk orientation, or of launch angle of a ball. Also for example, activity metrics can be presented as a function of location (e.g., location on a playing field, proximity to a player, proximity to a goal), as a function of an event (e.g., scoring of a field goal, committing a foul), as a function of an environmental condition (e.g., ambient temperature, precipitation), or as a function of a physiological condition of an individual (e.g., heart rate, body temperature). Information relating to such variables (e.g., location information, event information, environmental condition information, and physiological condition information) may be provided to monitoring system 30 from appropriate sensors incorporated therein, or from elements outside of monitoring system 30 that are in communication with monitoring system 30.

Figure 13:
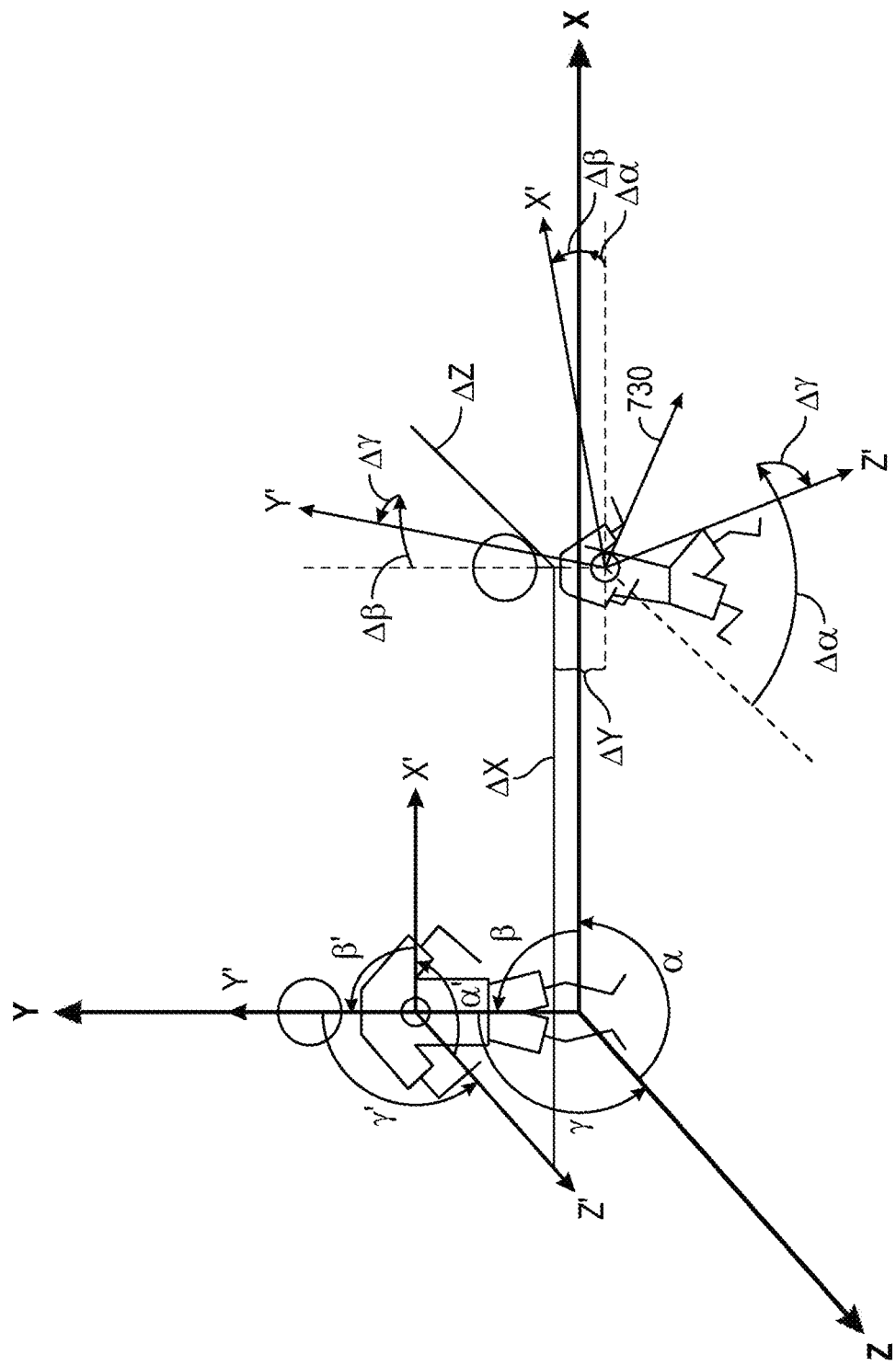
FIG. 13 is an illustration of an individual in motion, according to an embodiment of the present invention.

In some embodiments, for example, as shown in FIG. 12, an external coordinate system (e.g., external coordinate system 600) is determined at a first time, where sensor module 102 is in a calibration state at the first time. In some embodiments the orientation of an internal coordinate system fixed with reference to sensor module 102 (e.g., internal coordinate system 650) is determined relative to external coordinate system. For ease of description, internal coordinate system 650 is described herein to align with external coordinate system 600 at the first time, but it should be understood that internal coordinate system 650 need not align with external coordinate system 600 (e.g., internal coordinate system 650 may be established by an angular offset from external coordinate system 600), and that internal coordinate system 600 need not be characterized by traditional coordinate components, but may be characterized simply by some reference establishing the relative orientation of sensor module 102 with respect to the external coordinate system (e.g., external coordinate system 600). Components of internal coordinate system 650 are designated in the figures as X' (e.g., left/right), Y' (e.g., up/down), Z' (e.g., backward/forward), α' (e.g., yaw), β' (e.g., roll), and γ (e.g., pitch), and changes in the coordinate components are designated as ΔX, ΔY, ΔZ, Δα, Δβ, and Δγ, respectively (see, e.g., FIG. 13).

For example, as depicted in FIG. 12, in some embodiments acceleration sensor 116 is used to determine the orientation of gravity vector 302 with respect to sensor module 102 (i.e., with respect to internal coordinate system 650) at the first time, and in some embodiments magnetic field sensor 118 is used to determine the orientation of magnetic field vector 304 with respect to sensor module 102 at the first time. In some embodiments, the orientation of internal coordinate system 650 with respect to external coordinate system 600 can be determined based on one or both of gravity vector 302 and magnetic field vector 304. In this way an initial orientation of individual 100 can be determined based on the initial orientation of sensor module 102 (including internal coordinate system 650) within external coordinate system 600.

In some embodiments, monitoring device 30 determines and/or outputs one or more sensed motion characteristics of individual 100, including, for example, position of individual 100 or a portion thereof, orientation of individual 100 or a portion thereof, orientation and/or magnitude of speed of individual 100 or a portion thereof, orientation and/or magnitude of acceleration of individual 100 or a portion thereof, orientation and/or magnitude of forces applied to individual 100 or a portion thereof, duration of movement of individual 100 or a portion thereof, posture of individual 100 or a portion thereof, rotation of individual 100 or a portion thereof, and/or a degree of correspondence to a movement data profile, or changes therein.

In some embodiments, for example (see FIG. 13), rotation (e.g., three-dimensional rotation) of individual 100 (including, for example, rotation of individual 100 as a whole or of one or more monitored portions of individual 100, recognizing that portions of individual 100 may move relative to each other) can be determined between the first time and a second time, where individual is in motion at the second time. In some embodiments, such rotation can be output by monitoring system 30 and/or used by monitoring system 30 for further operations.

For example, in some embodiments the change in orientation of individual 100 between the first time and the second time is determined based on magnetic field data sensed by magnetic field sensor 118 from the first time to the second time. For example, the change in orientation of individual 100 between the first time and the second time may be expressed by the angular difference of axes X', Y', and Z' between the first time and the second time with respect to external coordinate system 600 (depicted as Δα, Δβ, and Δγ).

In some embodiments, for example (see FIG. 13), the change in position of individual 100 between the first time and the second time is determined based on acceleration data sensed by acceleration sensor 116 from the first time to the second time. In some embodiments, such change in position can be output by monitoring system 30 and/or used by monitoring system 30 for further operations.

For example, the change in position of individual 100 between the first time and the second time may be expressed by the linear difference in position of sensor module 102 along of axes X, Y, and Z between the first time and the second time with respect to external coordinate system 600 (depicted as ΔX, ΔY, and ΔZ).

As described, individual's 100 motion between two points in time can be characterized by change in position and change in orientation of sensor module 102 between the two points in time. In some embodiments, a more complete representation of individual's 100 motion can be characterized by monitoring change in position and change in orientation of sensor module 102 between multiple sequential points in time. In other words, the technique described above for characterizing individual's 100 motion between two points can be repeated from the second time to a third time. Change in position and change in orientation can be measured absolutely (e.g., with continuing reference to the position and orientation of sensor module at the first time (which may be a calibration state), or relatively (e.g., with reference to the immediately preceding position and orientation, or any other sensed position and orientation). As will be appreciated, the greater the rate of sampling of position and orientation, the more complete the representation of individual's 100 motion will be. In some embodiments, where change in position and change in orientation is measured relatively, sensor module 102 may not be calibrated with respect to an external coordinate system.

In some embodiments, as noted above, sensor module 102 of monitoring system 10 can be mounted in an object 104, which can be a piece of athletic equipment 108 such as, for example, ball 500. In some embodiments, multiple sensor modules 102 can be mounted in ball 500 (e.g., one sensor module having axes at one or more oblique angles to another sensor module). Ball 500 may be any ball, such as, for example, a ball typically used in an athletic activity, such as, for example, a soccer ball, a basketball, a baseball, an American football, a rugby ball, a tennis ball, a table tennis ball, a bowling ball, a golf ball, a billiards ball, a croquet ball, a marble, a tetherball, or a beach ball. Monitoring system 10 including sensor module 102 mounted to ball 500 is referred to as monitoring system 20. Sensor module 102 can be mounted to ball 500 using any suitable technique. For example, sensor module 102 may be affixed to an exterior or interior surface of ball 500, may be mounted within ball 500 using a harness system (e.g., suspended away from an inner wall of ball 500, for example at the center of ball 500), or may be embedded in a material of ball 500. Exemplary techniques that can be employed to mount sensor module 102 to ball 500 are disclosed in commonly owned U.S. Pat. No. 7,740,551, filed Nov. 18, 2009, whose disclosure is incorporated herein by reference thereto in its entirety.

In some embodiments, sensor module 102 can be activated (i.e., enter an active state) in response to sensing an activation motion of ball 500. In some embodiments, the activation motion may be, for example, motion in response to a kick of ball 500 (e.g., an acceleration impulse sensed above a threshold, or a drop in sensed acceleration to near zero). In some embodiments, the activation motion may be, for example, a kick of throw resulting in travel by ball 500 of at least a threshold distance or height (e.g., 2 meters) (e.g., an acceleration sensed to correspond to such motion). In some embodiments, the activation motion may be, for example, a sequence of motions (e.g., motion in response to a kick of ball 500 followed by travel by ball 500 of at least a threshold distance or height). Upon activation, sensor module 102 begins to store (e.g., in memory 114) and/or transfer sensed data to a remote device, as described herein. In some embodiments, in an active state, sensor module 102 may continuously sense data (e.g., acceleration data (data representative of acceleration) is determined by acceleration sensor 116 of sensor module 102 and magnetic field data (data representative of a magnetic field) is determined by magnetic field sensor 118 of sensor module 102). In some embodiments, data is sensed by sensor module 102 periodically (e.g., every 50 milliseconds (ms), every 10 ms, every 1 ms).

In some embodiments, sensor module 102 can be deactivated (e.g., enter a low-power standby state, detecting acceleration at a low frequency relative to the active state) in response to sensing no motion of sensor module 102 for a predetermined period of time (e.g., 30 minutes). In some embodiments, sensor module 102 can be deactivated in response to sensing a deactivation motion of ball 500. In some embodiments, the deactivation motion may be, for example, any of the motions described above as an activation motion. In some embodiments, a deactivation motion may be the same as an activation motion. In some embodiments, a deactivation motion may be different from an activation motion.

In some embodiments, data sensed by sensor module 102 may be time-correlated (e.g., stored in association with time data representing the time at which the data was sensed). The time at which data is sensed can be provided via timer 134. In operation, sensor module 102 of monitoring system 20 senses and processes signals as described herein to output representations of activity metrics of ball 500. In some embodiments, representations of activity metrics can be output to, for example, a display device (e.g., a display of personal computer 204, portable electronic device 206, or sensor module 102).

Figure 14:
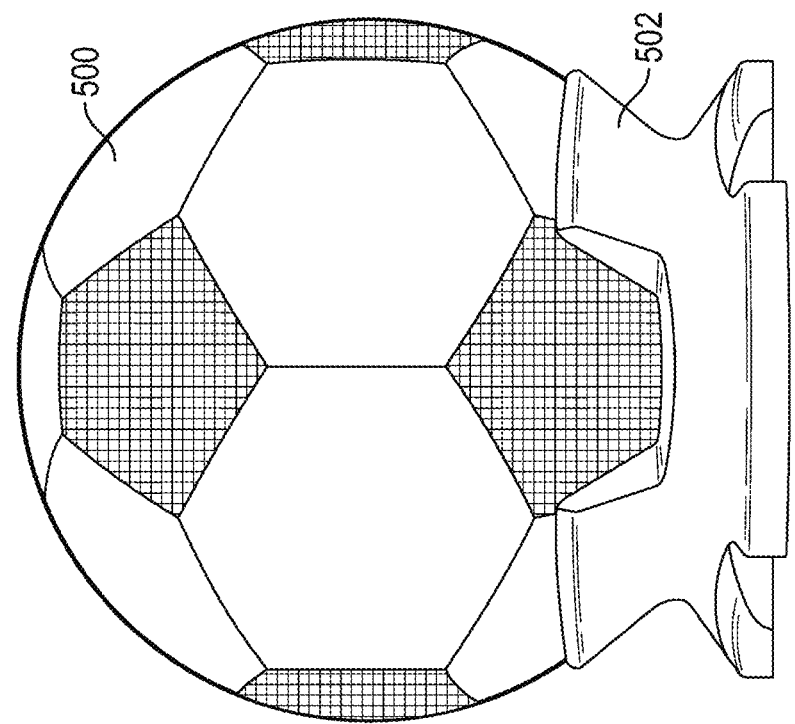
FIG. 14 is an illustration of a ball and a charging base, according to an embodiment of the present invention.
Figure 14:
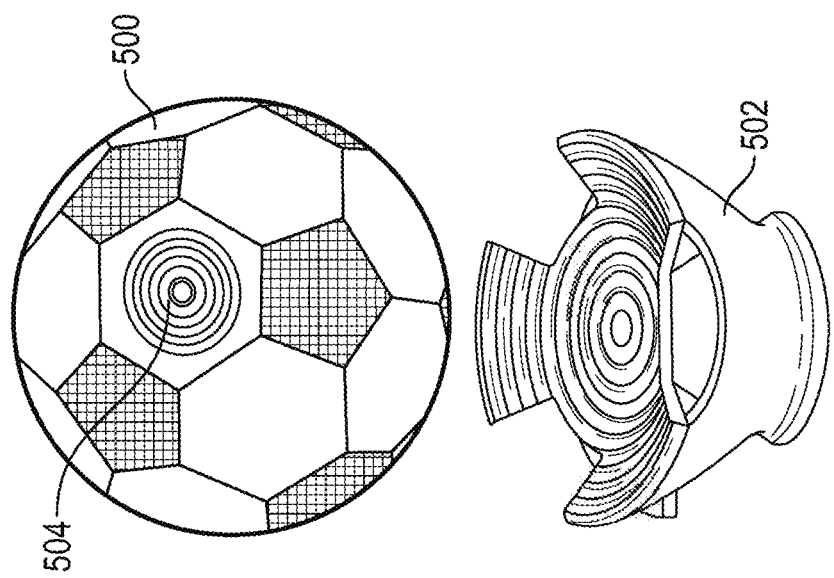

Sensor module 102 can be powered by any suitable technique, including those described herein. For example, sensor module 102 can be powered by charging via a charging base 502 (see, e.g., FIG. 14). For example, power source 112 of sensor module 102 may be powered by inductive charging, in which case an inductive coil may be mounted in ball 500 and coupled to power source 112 of sensor module 102. In some embodiments the inductive coil may receive power from an inductive charging device (e.g., charging base 502) when ball 500 is placed so that the inductive coil is sufficiently close to an inductive coil charging device. In some embodiments, ball 500 has exterior markings (e.g., marking 504) to indicate the location of the inductive coil, to facilitate optimum orientation of ball 500 (i.e., the orientation having the inductive coil closest to the inductive coil charging device). In some embodiments, sensor module 102 is coupled to a visual indicator, such as, for example, an externally-visible light emitting diode (LED) that gives an indication (e.g., LED emits light, light emitted by LED changes color, speed of LED blinking changes) of the strength of charge being received through the inductive coil, to facilitate optimum orientation of ball 500.

In some embodiments, monitoring system 20 including sensor module 102 mounted in ball 500 can be used to determine a variety of activity metrics about ball 500 (and/or an individual 100 interacting with ball 500), including characteristics relating to motion of ball 500. For example, monitoring system 20 can be used to determine location of ball 500, trajectory of ball 500, launch angle of ball 500, rotation rate of ball 500, orientation of rotation plane of ball 500, orientation of rotation axis of ball 500, travel speed of ball 500, launch speed of ball 500, force of a kick or other impact on ball 500, distance of travel of ball 500, and maximum acceleration of ball 500. Monitoring system 20 can perform operations as described herein to determine such activity metrics using any suitable components. For example, sensing operations, as described, may be carried out by a sensor of sensor module 102 of monitoring system 20 (e.g., acceleration sensor 116 or magnetic field sensor 118, as appropriate). Also for example, operations involving processing of data (e.g., identifying, determining, calculating, storing) may be carried out by processor 110 of sensor module 102, or by a processor of any other device of or in communication with monitoring system 20 (e.g., server 202, personal computer 204, or portable electronic device 206).

In some embodiments, calibration data is sensed by sensor module 102 when ball 500 is in a calibration state. In some embodiments, ball 500 is in a calibration state when ball 500 is stationary (e.g., with respect to an external coordinate system (i.e., a coordinate system independent of sensor module 102), such as, for example, coordinate system 600 (depicted in FIG. 15), for a period of time (e.g., 10 ms or longer)). In some embodiments, ball 500 can be considered stationary when sensor module 102 of ball 500 senses resultant acceleration of about 1G (i.e., resultant acceleration within a threshold tolerance of 1G, for example, within 5% of 1G). In some embodiments ball 500 can be considered stationary at times while being handled by an individual. For example, ball 500 can be stationary for a period of time within a period of time in which a basketball player takes a jump shot with ball 500 (e.g., before release of ball 500 from the hands of the individual, ball 500 can be considered stationary, where resultant acceleration sensed by sensor module 102 is about 1G). Also for example, ball 500 can be stationary for a period of time within a period of time in which a baseball player performs a throw of ball 500 (e.g., a period of time spanning the transition from rearward motion to forward motion of the individual's throwing motion, where resultant acceleration sensed by sensor module 102 is about 1G).

Figure 16:
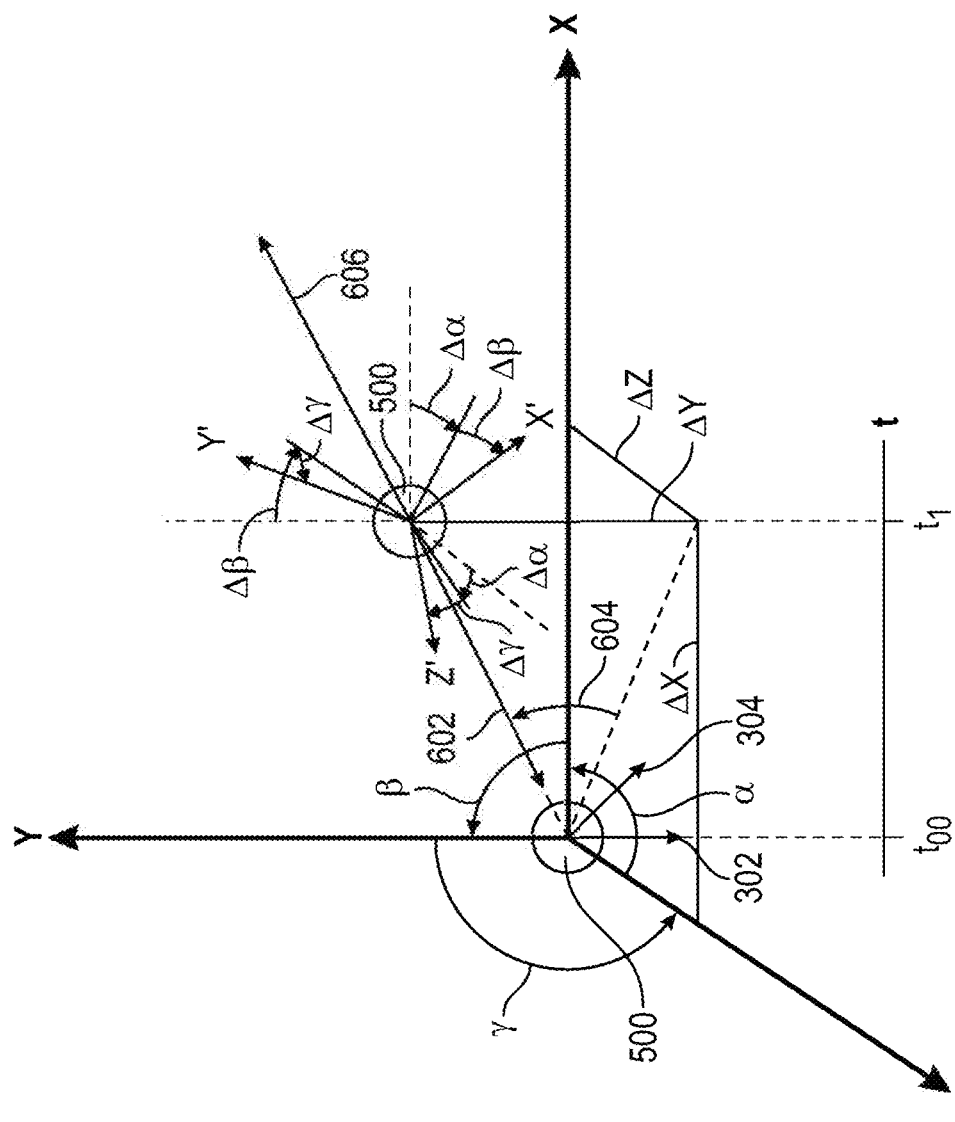
FIG. 16 is an illustration of a ball in motion, according to an embodiment of the present invention.

Ball 500 (including sensor module 102) is depicted in the calibration state at time $t_{00}$ in FIG. 16. Ball 500 may be in the calibration state at any point relative to an athletic activity (e.g., before, during, or after an athletic activity). In some embodiments, ball 500 is determined to be in a calibration state, and calibration data can be sensed, each time ball 500 is stationary for more than a threshold duration (e.g., 1 second). In some embodiments, ball 500 is determined to be in a calibration state, and calibration data can be sensed, each time ball 500 is stationary.

In some embodiments, in the calibration state acceleration sensor 116 of sensor module 102 senses acceleration data. In some embodiments magnetic field sensor 118 of sensor module 102 senses magnetic field data (e.g., data relating to the magnetic field of the earth). In some embodiments, calibration data includes both acceleration data and magnetic field data. In some embodiments, calibration data includes one of acceleration data and magnetic field data.

In some embodiments, in the calibration state, the acceleration data sensed by acceleration sensor 116 of sensor module 102 is acceleration due to gravity, which can be used by monitoring system 20 to determine one or both of orientation of acceleration due to gravity with respect to sensor module 102 and magnitude of acceleration due to gravity at sensor module 102 (together, gravity vector 302).

In some embodiments, in the calibration state, magnetic field sensor 118 of sensor module 102 senses one or both of orientation of a magnetic field with respect to sensor module 102 and magnitude of the magnetic field at sensor module 102 (together, magnetic field vector 304).

In some embodiments sensor module 102 senses calibration data that is to be relied upon for one or more subsequent calculations. In some embodiments the calibration data sensed when sensor module 102 is in the calibration state can be used to establish external coordinate system 600. In some embodiments external coordinate system 600 can be established by reference to the orientation of gravity vector 302 (e.g., to establish the direction of "down," since gravity is known to cause downward acceleration). In some embodiments external coordinate system 600 can be established by reference to the orientation of magnetic field vector 304 (e.g., to establish a constant reference direction, since the magnetic field will typically be appreciably constant over the area of a typical play area for an athletic activity). In some embodiments external coordinate system 600 can be established by reference to the orientation of gravity vector 302 and the orientation of magnetic field vector 304.

During motion of ball 500 (e.g., after ball 500 is kicked or hit) ball 500 may move in any or all of six degrees of freedom—three linear degrees: (1) up/down (e.g., along the Y axis in external coordinate system 600), (2) left/right (e.g., along the X axis in external coordinate system 600), and (3) backward/forward (e.g., along the Z axis in external coordinate system 600); and three rotational degrees: (1) yaw (e.g., in the angular α direction in external coordinate system 600), (2) roll (e.g., in the angular β direction in external coordinate system 600), and (3) pitch (e.g., in the angular γ direction in external coordinate system 600).

Individual 100 or other person may desire to know activity metrics of ball 500, for example, to learn the effects that actions of individual 100 have on ball 500 (e.g., a kick or throw of ball 500 by individual 100). Monitoring system 20 may determine such activity metrics (e.g., location of ball 500, trajectory of ball 500, launch angle of ball 500, rotation rate of ball 500, orientation of rotation plane of ball 500, orientation of rotation axis of ball 500, travel speed of ball 500, launch speed of ball 500, force of a kick or other impact on ball 500, distance of travel of ball 500, and maximum acceleration of ball 500). Sensor module 102 may output data representative of such activity metrics (e.g., to a display device of personal computer 204 or portable electronic device 206). Such data may be outputted from sensor module 102 in raw form (e.g., unprocessed signals from acceleration sensor 116 and/or magnetic field sensor 118) or in representative form (e.g., data that results from processing signals from acceleration sensor 116 and/or magnetic field sensor 118). In some embodiments monitoring system 20 outputs a representation of one or more activity metrics in a manner perceivable by individual 100 and/or other person.

Data representative of such activity metrics can be processed and/or output in any suitable manner, such as, for example, those described herein.

As noted herein, in some embodiments monitoring system 20 can determine and/or output a representation of instantaneous trajectory 606 of ball 500 over a period of time or at a particular point in time (the instantaneous trajectory being a representation of the direction of motion of ball 500 in motion). In some embodiments monitoring system 20 can determine and/or output a representation of the location of ball 500. In some embodiments monitoring system 20 can determine and/or output a representation of launch angle 604 of ball 500. In some embodiments launch angle 604 can be determined to correspond to instantaneous trajectory 606 of ball 500 at a point in time sufficiently close to initiation of motion of ball 500 (e.g., shortly after ball 500 has been kicked or hit). In some embodiments initiation of motion of ball 500 is determined based on a sensed impulse acceleration exceeding a threshold. In some embodiments, launch angle 604 can be determined to correspond to instantaneous trajectory 606 of ball 500 less than 150 ms (e.g., 100 ms to 150 ms) after initiation of motion of ball 500. In some embodiments, launch angle 604 can be determined to correspond to instantaneous trajectory 606 of ball 500 at the earliest time after initiation of motion of ball 500 at which acceleration magnitude can be sensed. In some embodiments, this time may immediately follow a period of less reliable data output by acceleration sensor 116 (where such data output is less reliable than data output by acceleration sensor 116 at other times). Such less reliable data output may be the result of, for example, a disturbance (e.g., railing) in sensed acceleration data (e.g., due to sudden change in acceleration, for example, upon an impact) or gain saturation of the acceleration sensor signal (e.g., a period during which the acceleration sensor outputs its maximum acceleration signal, because acceleration is higher than the maximum acceleration it can sense), which may result from, for example, the high initial acceleration of ball 500 in reaction to an impact (e.g., a kick, a throw, a shot). In some embodiments, such less reliable acceleration data output may be experienced for a time (e.g., 100-150 ms) after impact of a kick (e.g., about 10 ms for the duration of kick impact, and about 90 ms to 140 ms after impact).

Launch angle 604 can correspond to instantaneous trajectory 606 as the angle of the vertical component of the direction of travel of ball 500 in free flight sufficiently close to initiation of motion of ball 500. In some embodiments, free flight is determined based on acceleration data. Immediately upon entering free flight (e.g., upon ball 500 being thrown or kicked), acceleration data sensed by acceleration sensor 116 shows resultant acceleration of less than 1G (i.e., less than the acceleration due to gravity). For example, resultant acceleration may drop from 1G (e.g., in a stationary or non-free flight state) to 0.5G (e.g., in free flight). The time at which this drop takes place can be determined as the initiation of free flight. Continued free flight can be determined while resultant acceleration remains below 1G. In some embodiments, the magnitude of acceleration due to gravity can be predefined, or can be determined based on acceleration data sensed while ball 500 is stationary (e.g., in a calibration state).

The closer to initiation of motion that the angle of the vertical component of the direction of travel of ball 500 in free flight is determined, the more representative of launch angle it may be. Beyond initiation of motion, the angle of the vertical component of the direction of travel of ball 500 in free flight may change (e.g., decrease). In some embodiments, this change can be compensated for using a formula based on the instantaneous trajectory, speed (see below), and time (after initiation of motion), to increase the accuracy of the launch angle determination. In some embodiments, the path of ball 500 during a period of gain saturation (i.e., while the acceleration sensor is railed) can be determined based on magnetic field data sensed during that time. In some embodiments the launch angle at the moment of impact can be determined based on this path.

In some embodiments, instantaneous trajectory 606 (and/or launch angle 604) of ball 500 can be determined based on one or more of acceleration data and magnetic field data (e.g., sensed by acceleration sensor 116 and/or magnetic field sensor 118) at a first, earlier time, and one or more of acceleration data and magnetic field data (e.g., sensed by acceleration sensor 116 and magnetic field sensor 118) at a second, later time. In some embodiments, at the first time ball 500 is stationary (e.g., in a calibration state), and at the second time ball 500 is in motion (e.g., motion of ball 500 is initiated between the first time and the second time).

Figure 15:
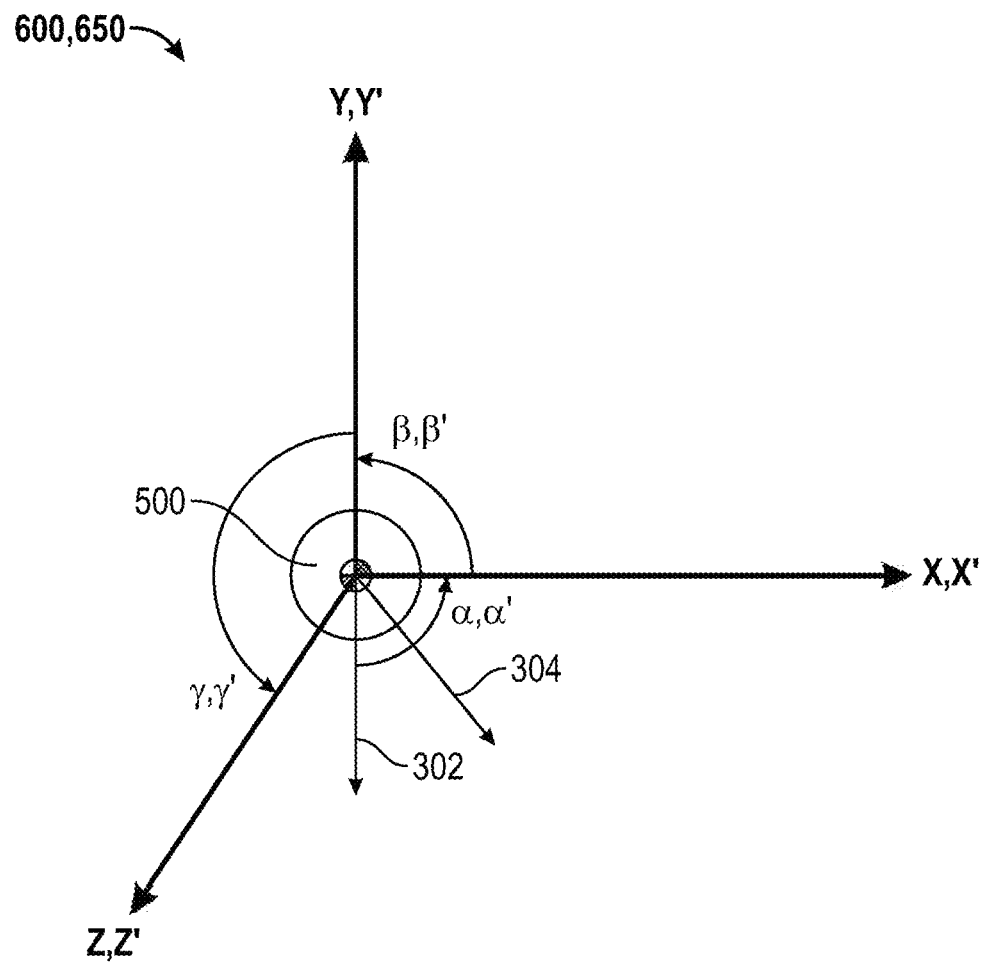
FIG. 15 is an illustration of a ball in a calibration state, according to an embodiment of the present invention.

In some embodiments, for example, as shown in FIG. 15, an external coordinate system (e.g., external coordinate system 600) is determined at a first time, where ball 500 is in a calibration state at the first time. In some embodiments the orientation of an internal coordinate system fixed with reference to sensor module 102 (e.g., internal coordinate system 650) is determined relative to external coordinate system 600. For ease of description, internal coordinate system 650 is described herein to align with external coordinate system 600 at the first time, but it should be understood that internal coordinate system 650 need not align with external coordinate system 600 (e.g., internal coordinate system 650 may be established by an angular offset from external coordinate system 600), and that internal coordinate system 600 need not be characterized by traditional coordinate components, but may be characterized simply by some reference establishing the relative orientation of sensor module 102 with respect to the external coordinate system (e.g., external coordinate system 600). Components of internal coordinate system 650 are designated in the figures as X' (e.g., left/right), Y' (e.g., up/down), Z' (e.g., backward/forward), α' (e.g., yaw), β' (e.g., roll), and γ (e.g., pitch), and changes in the coordinate components are designated as ΔX, ΔY, ΔZ, Δα, Δβ, and Δγ, respectively (see, e.g., FIG. 16).

For example, as depicted in, FIG. 15, in some embodiments acceleration sensor 116 is used to determine the orientation of gravity vector 302 with respect to sensor module 102 (i.e., with respect to internal coordinate system 650) at the first time, and in some embodiments magnetic field sensor 118 is used to determine the orientation of magnetic field vector 304 with respect to sensor module 102 at the first time. In some embodiments, the orientation of internal coordinate system 650 with respect to external coordinate system 600 can be determined based on one or both of gravity vector 302 and magnetic field vector 304. In this way an initial orientation of ball 500 can be determined based on the initial orientation of sensor module 102 (including internal coordinate system 650) within external coordinate system 600.

In some embodiments, for example, see FIG. 16, rotation (e.g., three-dimensional rotation) of ball 500 is sensed and measured between the first time and a second time, where ball 500 is in motion at the second time (e.g., shortly after motion is initiated, such as, for example, 100 ms after motion is detected). In some embodiments, such rotation can be output by monitoring system 20 and/or used by monitoring system 20 for further operations.

For example, in some embodiments the change in orientation of ball 500 between the first time and the second time is determined based on magnetic field data sensed by magnetic field sensor 118 from the first time to the second time. For example, the change in orientation of ball 500 between the first time and the second time may be expressed by the angular difference of axes X', Y', and Z' between the first time and the second time with respect to external coordinate system 600 (depicted as Δα, Δβ, and Δγ).

Also for example, in some embodiments the change in position of ball 500 between the first time and the second time can be determined based on acceleration data sensed by acceleration sensor 116 and/or magnetic field data sensed by magnetic field sensor 118 from the first time to the second time. In some embodiments, such change in position can be output by monitoring system 20 and/or used by monitoring system 20 for further operations.

For example, the change in position of ball 500 between the first time and the second time may be expressed by the linear difference in position of sensor module 102 along of axes X, Y, and Z between the first time and the second time with respect to external coordinate system 600 (depicted as ΔX, ΔY, and ΔZ).

In some embodiments, at the second time acceleration sensor 116 of sensor module 102 senses one or both of orientation of acceleration (i.e., the acceleration direction) of sensor module 102 (and thus ball 500) with respect to sensor module 102 and magnitude of acceleration of sensor module 102 (together, a resultant acceleration vector 602). In some embodiments, the acceleration sensed by sensor module 102 is substantially entirely due to the effects of drag (i.e., deceleration due to a drag force) on ball 500. (In some embodiments acceleration sensor 116 is an inertial system, and thus does not sense acceleration due to gravity when in free flight.)

In some embodiments, a plurality of individuals 100 may be monitored. For example, a plurality of individuals 100 may be monitored via a plurality of sensor modules 102 by a plurality of monitoring systems 30, or a plurality of individuals 100 may be monitored via a plurality of sensor modules 102 by the same monitoring system 30. Such individuals 100 may be monitored in any manner desired, for example, simultaneously, at different times, while participating in different athletic activities, while participating in the same athletic activity. Activity metrics derived from each of the plurality of individuals and activity metrics can be similarly compared, combined, and/or represented as described above. Such comparison, combination, and/or representations can be made based on each individual considered separately, on a subset of individuals grouped together (e.g., a team, midfielders of a team), or on all monitored individuals. In a game setting, such comparison, combination, and/or representations can be correlated to game events, such as a goal, a ball traveling out-of-bounds, a penalty kick, or a jump ball, which can be output in relation to contemporaneous activity metrics of individual(s) 100 as described.

Such comparing, combining, and/or representing data derived from monitoring individual(s) 100 and/or monitored objects can provide benefits to, for example, the individuals participating in an athletic activity, coaches, spectators, physicians, and game officials. Such persons may interact or work together during a session of athletic activity for a variety of reasons.

For example, it may be desired that a coach monitors the performance of the monitored individual(s) 100 and makes recommendations or otherwise influences their performance in order to maximize fitness level of individual(s) 100. Alternatively or additionally, it may be desired that the coach monitors and influences individual(s) 100 to help maximize the effectiveness of individual(s) 100 in the athletic activity. Further, it may be desired that the coach monitors and influences individual(s) 100 to help maximize the probability of success in the athletic activity (where success may be, for example, defeating an opposing team in a game, such as, for example, soccer, or achieving/maintaining a desired level of fitness for one or more individual(s) 100 participating in the athletic activity). A session of athletic activity may include, for example, a training session (e.g., a field session, a gym session, a track session) or a competitive session (e.g., a soccer match or a basketball game).

In some exemplary embodiments, the coach may monitor one or more individual(s) 100 and/or monitored objects and may provide feedback to individual(s) 100 in order to track and maintain or improve the health, safety, and/or performance of individual(s) 100.

The coach must consider these and other goals, monitor the activity of individual(s) 100 and/or monitored objects, and make decisions to influence the performance of individual(s) 100 both individually and as a group. In doing so, the coach depends on information about individual(s) 100 and their performance while participating in a session of athletic activity. A monitoring system (e.g., monitoring system 30) that provides data about individual(s) 100 (and/or monitored objects interacted with by the individuals) can provide the coach with easy-to-understand information about individuals participating in the athletic activity, beyond that which can be directly observed, thereby facilitating quick and effective decision-making by the coach to maximize the probability of achieving success in the athletic activity.

As noted above, a variety of information may be communicated between any of the elements of monitoring system 30, including, for example, sensor module 102, personal computer 204, portable electronic device 206, network 200, and server 202. Such information may include, for example, activity metrics, device settings (including sensor module 102 settings), software, and firmware.

Communication among the various elements of the present invention may occur after the athletic activity has been completed or in real-time during the athletic activity. In addition, the interaction between, for example, sensor module 102 and personal computer 204 and the interaction between, for example, the personal computer 204 and the server 202 may occur at different times.

In the case of a plurality of monitored individuals 100 and/or monitored objects, in some embodiments sensor devices (e.g., sensor module(s) 102) associated with each monitored individual 100 and/or object may each transmit data to a different associated remote device (e.g., personal computer 204 and/or portable electronic device 206). In some embodiments, multiple sensor devices (e.g., sensor module(s) 102) associated with monitored individual(s) 100 and/or objects may transmit data to the same associated remote device. In some embodiments, multiple sensor devices (e.g., sensor module(s) 102) associated with monitored individual(s) 100 and/or objects may transmit data to an intermediate device (e.g., a computer acting as a "base station" to receive data locally and transmit such data to one or more external devices, with or without processing such data, for example, as described herein) for re-transmission to remote devices (e.g., via network 200 and/or server 202). Such data transmission as described can occur in substantially real time (e.g., during an athletic activity, for real-time analysis), or can occur after completion of the athletic activity (e.g., for post-game analysis). Data transmitted can be in any form ranging from raw data sensed by sensors (e.g., acceleration sensor 116 and magnetic field sensor 118 of sensor module 102) or data resulting from any processing operation (e.g., such identifying, determining, calculating, or storing as described herein). Any processing of the data as described herein can take place at any device that receives data transmission as described.

Individuals participating in an athletic activity and trainers (e.g., a coach, physician, or other authorized individual) may work together during a session of athletic activity for a variety of reasons. For example, it may be desired that the trainer monitors the performance of the individuals and makes recommendations or otherwise influences their performance in order to maximize the individuals' fitness level. Alternatively or additionally, it may be desired that the trainer monitors and influences the individuals to help maximize the effectiveness of the individuals in the athletic activity. Further, it may be desired that the trainer monitors and influences the individuals to help maximize the probability of success in the athletic activity (where success may be, for example, defeating an opposing team in a game, such as, for example, soccer, or achieving/maintaining a desired level of fitness for one or more individuals participating in the athletic activity). A session of athletic activity may include, for example, a training session (e.g., a field session, a gym session, a track session) or a competitive session (e.g., a soccer match or a basketball game)

In some exemplary embodiments, the trainer may monitor and influence the individuals in order to track and maintain the individuals' health and safety. In such an embodiment, it may be beneficial for the trainer to be provided with information relating to health and safety, for example, injuries, illnesses, and dangerous conditions.

The trainer must consider these and other goals, monitor the individuals, and make decisions to influence the performance of the individuals both individually and as a group. In doing so, the trainer depends on information about the individuals and their performance while participating in a session of athletic activity. The trainer may benefit from receipt of information in addition to that which is directly observable by the trainer. A group monitoring system according to an exemplary embodiment of the present invention can provide the trainer with easy-to-understand information about individuals participating in the athletic activity, beyond that which can be directly observed, thereby facilitating quick and effective decision-making by the trainer to maximize the probability of achieving success in the athletic activity. Detailed player profiles with performance metrics over time can be generated and maintained. By using information provided by the group monitoring system, trainers can view trends over time, which can help identify, for example, unfit athletes, athletes who are over-training, and athletes having relatively high risk for injury. Special training programs can be planned to address these conditions enabling peak performance (e.g., at game time).

Conventionally, a trainer would plan a session of athletic activity hoping to deliver a certain workload (e.g., represented by target values for one or more metrics) to a team or to particular individuals or subsets thereof, but would not have a reliable way to measure if the intended workload was actually delivered. With a group monitoring system according to embodiments of the present invention, a trainer now can determine whether the intended workload was actually delivered (e.g., by direct measurement of one or more metrics indicating or providing the basis for a determination of total workload). This enables the trainer to more precisely plan and adapt sessions of athletic activity by basing such planning and adapting on measured values representing individual or team performance. Such a group monitoring system may provide feedback that the trainer can act on to revise training as needed. In an exemplary embodiment, the group monitoring system can provide alerts to the trainer to flag critical or important conditions that the trainer would not otherwise be able to observe directly, such as, for example, fatigue of an individual or heart rate of an individual being above a threshold value.

In an exemplary embodiment, group monitoring system 700, depicted in, for example, FIG. 17, includes individual monitors 712 (see FIG. 18A), an object monitor 750, a base station 705, and at least one group monitoring device 760 (see FIG. 19). Individual monitor 712 may be coupled to an individual 710, as shown in FIG. 18A. Object monitor 750 may be coupled to a sports object 740, as shown in FIG. 18B. Individual 710 may be, for example, a participant in an athletic activity (e.g., a player; a referee; or a support person such as a ball boy, golf caddy, or line man). Sports object 740 may be, for example a sports object, for example, any type of sport ball, any type of sport "stick" (e.g., a baseball bat, hockey stick, golf club, table tennis paddle, or tennis racquet), a sport glove (e.g., a boxing glove), a bicycle, an oar, a shoe, a boot, a ski, a hat, a helmet, a band, a skateboard, a surfboard, or a pair of glasses or goggles) used by an individual (e.g., individual 710) during an athletic activity. In certain embodiments, one or more individuals 710 and/or one or more sports objects 740 can be monitored.

Individual monitor 712 and/or object monitor 750 may include or be in communication with a variety of sensors 702, including, but not limited to, an accelerometer, a pedometer, a heart rate monitor, a position sensor, an impact sensor, a camera, a magnetometer, a gyroscope, a microphone, a temperature sensor, a pressure sensor, a respiration sensor, a posture sensor, a lactate sensor, and a wind sensor. Group monitoring system 700 can include any or all of these or other sensors, eliminating the need for separate systems to monitor different characteristics. Further, by integrating and processing data streams from multiple different sensors, group monitoring system 700 can determine and provide metrics based on data representing different monitored characteristics. This eliminates the need to manually combine data streams to determine metrics based on multiple data streams (e.g., to determine high level training insights).

In an exemplary embodiment, individual monitor 712 may include a sensor garment 704, a heart rate monitor 706, a position sensor 708, an acceleration sensor 710 or any other sensor (e.g., a magnetometer). In an exemplary embodiment, object monitor 750 may include a position sensor 708, an acceleration sensor 710 and a magnetometer. Position sensor 708 may include, for example, a position sensor for use with a satellite-based positioning system (e.g., GPS (global positioning system)), a position sensor for use with a beacon system (e.g., position determination using triangulation and/or time differences of signals received by antennas at known positions about a field or activity area), or a position sensor for use with any other suitable position-determining system. In certain embodiments, position sensor 708 can be the same device as the magnetometer.

In some exemplary embodiments, group monitoring device 760 may be used by a trainer 720, as shown in FIG. 19. In an exemplary embodiment, group monitoring system 700 and/or components thereof (e.g., individual monitor 712, object monitor 750) may include or be used with elements of another monitoring system, such as, for example, those disclosed in U.S. patent application Ser. No. 12/467,944, filed May 18, 2009; U.S. patent application Ser. No. 12/467,948, filed May 18, 2009; U.S. patent application Ser. No. 13/077,494, filed Mar. 31, 2011; U.S. patent application Ser. No. 13/077,520, filed Mar. 31, 2011; U.S. patent application Ser. No. 13/077,510, filed Mar. 31, 2011; U.S. patent application Ser. No. 13/446,937, filed Apr. 13, 2012; U.S. patent application Ser. No. 13/446,982, filed Apr. 13, 2012; and U.S. patent application Ser. No. 13/446,986, filed Apr. 13, 2012, whose disclosures are incorporated herein by reference in their entireties.

Generally, sensors 702 are mounted to individuals 710 in preparation for participation by individuals 710 in a session of athletic activity. Sensors 702 mounted to a particular individual 710 are coupled, either via wires or wirelessly, to individual monitor 712, also mounted on the particular individual 710. Sensors 702 in communication with an individual 710's individual monitor 712 may sense characteristics about individual 710 during participation by individual 710 in the session of athletic activity, and may transmit data indicative of the characteristics to individual monitor 712. Individual monitor 712 in turn may transmit the data to base station 705 during or after the session of athletic activity.

Sensors 702 in communication with an object 740's object monitor 750 may sense characteristics about object 740, for example while object 740 is used (e.g., by individual 710) during the session of athletic activity, and may transmit data indicative of the characteristics to object monitor 750. Object monitor 750 in turn may transmit the data to base station 705 during or after the session of athletic activity.

In some embodiments, a first individual monitor 712 may transmit data indicative of characteristics about its monitored individual 710 to a second monitor (e.g., an individual monitor 712 monitoring a different individual 710, or an object monitor 750 monitoring a sports object 740). In some embodiments, a first object monitor 750 may transmit data indicative of characteristics about its monitored object 740 to a second monitor (e.g., an individual monitor 712 monitoring an individual 710, or a second object monitor 750 monitoring a different sports object 740). Such communication among monitors 712, 750 may be wireless according to any suitable protocol. For example, such communication may be based on RFID (radio frequency identification) signals, magnetic signals, WLAN (wireless local area network) signals, ISM (industrial, scientific, and medical) band signals, Bluetooth® (or Bluetooth® Low Energy (BTLE)) signals, or cellular signals.

Such communication among monitors 712, 750 may facilitate determinations and calculations based on data from more than one source. For example, if two monitored individuals 710 kick a sports object 740 (e.g., a ball), object monitor 750 of sports object 740 can receive data from each of the individual monitors 712 of the individuals 710. Such data can be compared with data from the object monitor 750 of sports object 740 and can be used to determine (e.g., at sports object 740, base station 705, or an accessing device) which of the two individuals kicked sports object 740 first. Also for example, if a monitored individual 710 kicks a sports object 740 (e.g., a ball), individual monitor 712 of individual 710 can receive data from object monitor 750 of sports object 740 indicating the force with or speed at which the sports object 740 was kicked, or the resulting speed, direction of motion, or predicted landing location of the sports object 740 due to the kick. Such data may be sensed by a pressure sensor of the sports object 740, and transmitted wirelessly to the individual monitor 712 of the monitored individual 710. Such data can be compared with data from the individual monitor 712 and can be used to determine characteristics of the kick of individual 710. In some embodiments, based on such data, group monitoring system 700 may provide a recommendation as to how individual 710 may improve his or her kick (e.g., to achieve greater distance, speed, height).

In some exemplary embodiments, some or all of transmissions of data among system components of group monitoring system 700 may occur in real time. "Real time" as used herein may include delays inherent to transmission technology, delays designed to optimize resources, and other inherent or desirable delays that would be apparent to one of skill in the art. In some exemplary embodiments, some or all of these transmissions may be delayed from real time, or may occur after completion of the activity. Base station 705 receives the data and determines metrics from the data, where the metrics may be representations of the characteristics measured by sensors 702, or may be representations of further characteristics derived from the data through the use of algorithms and other data manipulation techniques. Metrics may be based on data from individual monitors 712 only, from object monitors 750 only, or from both individual monitors 712 and object monitors 750. Base station 705 in turn transmits the metrics during the session of athletic activity to group monitoring device 760, which receives the metrics and displays a representation of the metrics.

Group monitoring device 760 may receive metrics associated with a plurality of individuals 710 and/or one or more objects 740, and may display the received metrics in association with the individual 710 and/or object 740 with which they are associated. In this way, trainer 720 viewing group monitoring device 760 during the session of athletic activity receives detailed information about multiple individuals 710 and/or object(s) 740, and can act on that information as it is determined necessary or expedient, thereby efficiently monitoring and managing individuals 710 during the session of athletic activity.

Display of the metrics can represent real-time summaries of individuals 710 or groups thereof, and can facilitate comparison of one or more individuals 710 or groups thereof with one or more other individuals 710 or groups thereof, or comparison of one or more individuals 710 or groups thereof from a first time with one or more individuals 710 or groups thereof from a second time.

In some exemplary embodiments, individual monitors 712 and/or object monitors 750 calculate metrics based on the data (e.g., data generated by sensors 702), and transfer these metrics to base station 705 along with or instead of the data. In some exemplary embodiments, base station 705 transmits the data to group monitoring device 760, along with or instead of the metrics. In some exemplary embodiments, group monitoring device 760 calculates metrics based on the data.

Elements of individual monitor 712 (or object monitor 750) may interconnect with one another using a variety of techniques, such as, for example, wires, printed circuit boards, conductive yarn, conductive fabric, printed conductive layers on fabric, a printed (wire) harness, wireless communications technology, serial ports, serial peripheral interfaces, other connection techniques, or a combination thereof. Each monitor 712, 750 is portable with respect to base station 705. In some embodiments, each individual monitor 712 can be carried by an individual 710 participating in an athletic activity. Each monitor 712, 750 may itself include sensors 702, and/or may be in communication with sensors 702 carried by individual 710 and/or sports object 740 and located remotely from monitor 712, 750. Each monitor 712, 750 can be paired with base station 705 and associated with an individual 710 and/or sports object 740. Each monitor 712, 750 may include a unique identifier. The unique identifier may be represented by, for example, a number imprinted on a viewable surface of individual monitor 712 and/or object monitor 750 (or an article associated therewith, such as, for example, a garment or sports object), or data communicated or displayed when a button associated with individual monitor 712 and/or object monitor 750 is pressed or when a request signal is received from base station 705.

In an exemplary embodiment, individual monitor 712 is a pod-like device and includes a position module for determining data indicative of the location of individual monitor 712 (and thus the location of individual 710 carrying individual monitor 712), a heart rate monitor module for determining data indicative of the heart rate of individual 710, a three-axis acceleration sensor module for determining data indicative of the acceleration of individual 710, a gyroscope module for determining data indicative of the orientation of individual 710 with respect to, for example, a playing field and/or base station 305, and a magnetometer module for measuring local magnetic field data and calibrating body motion data determined by the gyroscope module and acceleration sensor module. Such a pod-like device can be carried by individual 710, for example, in a shirt, shoe, or other apparel or equipment worn by individual 710. In some embodiments, individual monitor 712 may be a near-field communication (NFC) device (e.g., a radio-frequency identification (RFID) tag) or any active or passive communication device.

Similarly, in an exemplary embodiment object monitor 750 is a device that includes a position module for determining data indicative of the location of object monitor 750 (and thus the location of sports object 740 carrying object monitor 750), a heart rate monitor module for determining data indicative of the heart rate of an individual (e.g., individual 710) interacting with sports object 740 (e.g., gripping or otherwise holding sports object 740 such that a heart rate sensor of object monitor 750 can sense a pulse of the individual), a three-axis acceleration sensor module for determining data indicative of the acceleration of sports object 740, a gyroscope module for determining data indicative of the orientation of sports object 740 with respect to, for example, a playing field and/or base station 705, and a magnetometer module for measuring local magnetic field data and calibrating motion data determined by the gyroscope module and acceleration sensor module. In some embodiments, object monitor 750 is a pod-like device, which may be configured for attachment to a sports object 740 (e.g., coupled to a racquet or bat upon an external surface thereof). In some embodiments, object monitor 750 is a chip integrated within a sports object 740 (e.g., coupled to a ball beneath the exterior surface thereof). In some embodiments, object monitor 750 may be a near-field communication (NFC) device (e.g., a radio-frequency identification (RFID) tag) or any active or passive communication device.

Additionally, the acceleration sensor module can be used in conjunction with the magnetometer module and gyroscope module in order to calibrate motion and position determinations. For example, information indicative of impact, change in motion, gravity, and change in direction can be obtained using the acceleration sensor module. Angular movement can be obtained using the gyroscope module, and the absolute "North" orientation or local magnetic field data, such as magnetic field intensity and/or direction, can be obtained using the magnetometer module. These sensor readings can be used to determine, for example, the posture of an individual 710, gravity, position and orientation of individual 710 and/or object 740 in space, and heading of individual 710 and/or object 740.

Base station 705 may be a self-contained portable system, containing all hardware required or desired to perform the functions of base station 705 described herein. In some exemplary embodiments, base station 705 weighs no more than 25 kilograms. In some exemplary embodiments, base station 705 is sized so as to fit easily into the trunk of a car or the overhead storage area of a passenger aircraft. In some exemplary embodiments, base station 705 includes a pair of wheels at one end, and a handle at the other end, to facilitate mobility of base station 705. In some exemplary embodiments, base station 705 is waterproof, and can withstand impacts associated with regular use and transport. In some exemplary embodiments, base station 705 is contained within a hard shell-style case. In some exemplary embodiments, base station 705 is contained within a soft duffel bag-style case.

In some exemplary embodiments base station 705 is configured to be portable. In some exemplary embodiments, base station 705 is configured to be positioned at an activity site. In some exemplary embodiments base station 705 is configured to be movable between activity sites such that it can be positioned at various activity sites. In some exemplary embodiments base station 705 is configured to be portable with respect to at least one of individual monitors 712, object monitors 750, and group monitoring device 760. In some exemplary embodiments base station 705 is configured to be portable with respect to each of individual monitors 712, object monitors 750, and group monitoring device 760.

In some exemplary embodiments, base station 705 itself includes sensors, such as, for example, a GPS sensor (or other position sensor), a gyroscope, a magnetometer, a temperature sensor, a humidity sensor, and/or a wind sensor. Such sensors can provide valuable data that can be used in algorithms to determine metrics associated with individuals 710 and/or sports objects 740, as will be described below.

In some exemplary embodiments, base station 705 includes a reference sensor (e.g., a GPS reference sensor), which may be physically included within base station 705 or independent of and located remote from base station 705 at a known position with respect thereto. The reference sensor can be connected to base station 705 via wires or wirelessly. The reference sensor can be used to detect a deviation signal and use it to calculate a correction signal for received position signals (e.g., GPS data). This correction signal can be sent to monitors 712, 750 (e.g., via base station 705). This correction signal can be used to correct position determinations of monitors 712, 750, thereby increasing their accuracy. Determining such a correction signal and then sending it to monitors 712, 750 achieves efficient use of processing capacity, because monitors 712, 750 are not burdened with determining a correction signal themselves, but simply receive and use a correction signal determined at base station 705 or the reference sensor.

Base station 705 may transmit and receive data from monitors 712, 750 via an antenna configured for one or more of RF communication, WLAN communication, ISM communication, cellular (e.g., GSM broad band 2.5G or 3G) communication, other suitable communication, or a combination thereof. Communication between base station 705 and monitors 712, 750 may be bi-directional or uni-directional. The antenna may be a high-gain antenna, and in some exemplary embodiments base station 705 includes multiple (e.g., 2) such antennas. In some exemplary embodiments, base station 705 includes an antenna configured to send and/or receive a positioning signal such as that of a satellite-based positioning system (e.g., GPS). Base station 705 can then determine metrics from the received data. Base station 705 can include a data reception module, a data processing module, a central synchronization (sync) module, a logic module, a web server module, and a base station database.

As described above, base station 705 receives data from monitors 712, 750. The data reception module of base station 705 may be in communication with each active monitor 712, 750. In some exemplary embodiments the data reception module receives data from monitors 712, 750 via the antenna in communication with monitors 712, 750 through the RF link described above. The data reception module writes the received data to a data file, which may be, for example, a comma-separated values file or a tab delimited file. The file may be, for example, a single file used to write the data to, or a rolling file (file roll) based on, for example, time, number of entries, or size. The data file may be updated using any suitable interval and parameters. For example, 30 monitors 712, 750 may be active and updating 5 data points at 2 Hz, in order to update the data file in near real time.

The data reception module may perform a data integrity check on the received data. In some exemplary embodiments the data reception module decrypts the received data. In some exemplary embodiments the data reception module is agnostic to the received data, and does not decrypt the received data. In some exemplary embodiments the data reception module buffers content as needed.

The data reception module may include a data read module that reads the data from the data file and transmits it to data processing module. The data read module may run at any suitable interval, such as, for example, 500 ms (milliseconds), to read the change in the data written to the data file.

Prior to monitors 712, 750 being used during a session of athletic activity, each monitor 712, 750 may be connected to base station 705 (e.g., by docking in docking port, or wirelessly) and may be assigned an encryption key by the data processing module. Monitors 712, 750 can use this encryption key to securely transmit data to the data reception module. The data processing module receives data from the data reception module, as described above, and de-crypts the data, if encrypted, by using the unique encryption key assigned to a particular monitor 712, 750. The data processing module transmits the decrypted data to the base station database, for storage.

The base station database is preferably configured for short term storage of data generated during sessions of athletic activity, while long term storage is accomplished by a web server system. The base station database may include sufficient storage space for at least all data expected to be generated in 1 session of the athletic activity. In some exemplary embodiments, the base station database includes sufficient storage space for at least all data expected to be generated in 3 sessions of the athletic activity (e.g., greater than approximately 2 gigabytes). In some exemplary embodiments, the base station database is configured for long term storage, and includes sufficient storage space, for example, for at least all data expected to be generated in 10 years of use monitoring athletic activities (e.g., greater than approximately 600 gigabytes).

Figure 20:
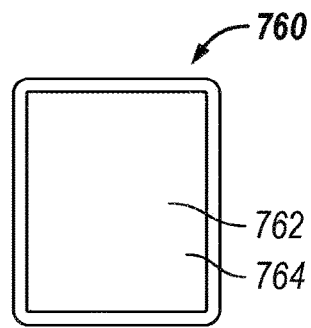
FIG. 20 is an illustration of a group monitoring device, according to an embodiment of the present invention.

In some exemplary embodiments, group monitoring device 760 includes a display 762 and an input 764, as shown, for example, in FIG. 20. In a preferred embodiment, group monitoring device 760 is a tablet computing-style device (such as a tablet personal computer or an iPad®, marketed by Apple Inc.®. Group monitoring device 760 may be, however, any other suitable device, such as, for example, a laptop computer, a smartphone, a personal computer, a mobile phone, an e-reader, a PDA (personal digital assistant), a smartphone, a wristwatch device, a display integrated into a garment (e.g., into a sleeve or arm band), or other similar device capable of receiving and displaying information and receiving input. In some embodiments, group monitoring system 700 includes a plurality of group monitoring devices 760, which may be carried by individuals 710 (e.g., during participation in a monitored athletic activity). For simplicity and clarity of explanation, group monitoring device 760 is herein described primarily as used by trainer 720. Group monitoring device may be used similarly, however, by any person, including individuals 710.

In some exemplary embodiments, during a session of athletic activity, trainer 720 may use group monitoring device 760 to receive real time information about individuals 710 and/or sports objects 740. This information may enable trainer 720 to more easily accomplish a variety of goals. In the case that the athletic activity is a fitness exercise, trainer 720 can leverage real time data received about the fatigue of particular individuals 710 or groups of individuals 710 in order to, for example, inform data-driven real time decisions that optimize the performance of individuals 710 and reduce the potential for injury. For example, trainer 720 may modify a current session of athletic activity (e.g., shorten, extend, pause, end, or change the schedule of activity for the session) based on the information received from group monitoring device 760. Trainer 720 may modify the session for particular individuals 710, or for groups of individuals 710. In the case that a present session of athletic activity has been scheduled using a plan module of monitoring device 760 (as described further herein), the planned schedule can be changed in real time to correspond to decisions of trainer 720. Similarly, in the case that the athletic activity is a competition (e.g., a soccer game), trainer 720 can leverage real time data received about the performance of particular individuals 710 and/or sports objects 740 or groups of individuals 710 and/or sports objects 740 in order to, for example, inform data-driven real time decisions that optimize the chance for success in the competition. In an exemplary embodiment, group monitoring device 760 can be used to monitor a single individual 710 and/or sports object 740 alone, as well as a group of individuals 710 and/or sports objects 740.

In some exemplary embodiments, group monitoring device 760 may be used by broadcasters of an athletic activity in order to, for example, determine and relay to their audience information about individuals 710 participating in the athletic activity and/or sports objects 740 being used for the athletic activity.

Display 762 functions to display representations of individual monitors 712, individuals 710, object monitors 750, and/or sports objects 740 (including, for example, identification information, attributes, metrics, and alerts) during participation in a session of athletic activity by individuals 710 and/or sports objects 740. The representations can take many forms, including, for example, charts, dashboards, graphs, maps, colors, symbols, text, images, and icons.

Various representations capable of being displayed by display 762 are described in detail herein. For simplicity and clarity of explanation, many of the representations are described with reference to individuals 710, and may not refer to sports objects 740. Information relating to one or more sports objects 740 may be displayed in any of these representations, or in formats similar to any of these representations, similarly as described for individuals 710. Information (including metrics) relating to such sports objects 740 may be displayed separately from information relating to individuals 710, or may be displayed together with information relating to individuals 710. Displayed information relating to sports objects 740 may be of the same or a different type (e.g., a different metric) than that displayed for individuals 710, whether displayed separately or together.

Input 764 is an interface that allows a user, such as trainer 720, to manipulate the representations displayed by display 762. In a preferred embodiment input 764 is a touch-screen input. Input 764 may be, however, any other suitable input, such as, for example, a keyboard, a voice-recognition audio input, or push-button inputs. Input 764 may further include a combination of various types of inputs. Input 764 may be manipulated by trainer 720 to cause display 762 to show desired representations. The representations can update in real time during the athletic activity through the communication of group monitoring device 760 with base station 705, which is in turn in communication with individual monitors 712 worn by individuals 710 participating in the athletic activity and/or object monitors 750 carried by sports objects 740 used for the athletic activity, as described above.

Figure 21:
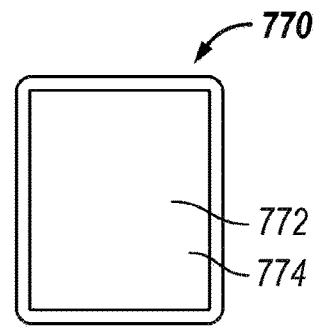
FIG. 21 is an illustration of an analysis device, according to an embodiment of the present invention.

A remote device (analysis device 770) is depicted in FIG. 21 and includes a display 772 and an input 774. In an exemplary embodiment, analysis device 770 is a tablet computing-style device (such as a tablet personal computer or an iPad®, marketed by Apple Inc.®). Analysis device 770 may be, however, any other suitable device, such as, for example, a laptop computer, a smartphone, or a personal computer. Analysis device 770 can access data in web server database and display the information to a user of analysis device 770 (e.g., trainer 720). In some embodiments, the information may be displayed using dedicated or general-purpose software (e.g., a dedicated software interface, a web browser). Although analysis device 770 and group monitoring device 760 are described separately herein, in some exemplary embodiments, group monitoring device 760 and analysis device 770 are the same device.

In some exemplary embodiments, analysis device 770 can be located at a remote location with respect to base station 705 or the relevant athletic activity, and can be used to access and display data and metrics in real time. In such an embodiment, base station 705 can transfer the data and metrics to a web server in real time, so that the data and metrics can be accessed for display by analysis device 770, as described above. Such an embodiment may be useful for a user to monitor an ongoing session of athletic activity from a remote location (e.g., a trainer 720 that could not be present at a match, or a team owner that desires to monitor a training session without physically attending the session).

In some embodiments, individual monitor 712 and/or object monitor 750 each includes a position module for determining data indicative of the location of individual monitor 712 and/or object monitor 750 (and thus the location of individual 710 carrying individual monitor 712 and/or sports object 740 carrying object monitor 750). In some embodiments, display 762 of group monitoring device 760 depicts the location of individuals 710 and/or sports objects 740, based on the data indicative of the location of individual monitor 712 and/or object monitor 750.

In some embodiments, such depiction of the location of individuals 710 and/or sports objects 740 may be in the form of a graphical representation such as, for example, a map (e.g., a map of the playing field on which individuals 710 and/or objects 740 are located, showing the locations of individuals 710 and/or objects 740 in relation to features of the playing field such as, for example, boundary lines and goals). For example, individuals 710 and a sports object 740 on a playing field can be shown, where individuals 710 are represented by their identifying numbers. Depiction of individuals 710 and/or sports object 740 with respect to features of the playing field can be helpful to a viewer of display 762 (e.g., a referee or official charged with overseeing the athletic activity) to monitor the activity (e.g., to determine whether an individual 710 traveled outside a boundary line, or whether a ball entered a goal zone).

In some embodiments, display 762 of group monitoring device 760 depicts the present locations of individuals 710 and/or sports objects 740. In some embodiments, display 762 of group monitoring device 760 depicts past locations of individuals 710 and/or sports objects 740 (e.g., replays display of the locations). In some embodiments display 762 of group monitoring device 760 depicts the past locations during the athletic activity. In some embodiments display 762 of group monitoring device 760 depicts the past locations after the athletic activity.

In some exemplary embodiments, display 762 of group monitoring device 760 depicts locations of individuals 710 and/or sports objects 740 simultaneously with orientations of individuals 710 and/or sports objects 740.

In some exemplary embodiments, display 762 of group monitoring device 760 displays recommendations based on metrics. For example, display 762 may display a recommendation based on location information of one or more individuals 710 (e.g., based on location information showing a concentration of individuals 710 in one area, display 762 may display a recommendation that individuals 710 spread out over the playing field). Such recommendations can be tailored as desired (e.g., to a particular situation, type of game, to play against a particular opposing team or player, to a particular situation).

In some exemplary embodiments, display 762 of group monitoring device 760 can display one or more alerts based on location information of one or more individuals 710 and/or sports objects 740. An alert may be triggered based on a determination that location(s) of one or more individuals 710 and/or sports object 740 meet an alert condition. For example, an alert may be triggered in response to a location of an individual being greater than a threshold distance from a target position, where the target position may be defined relative to, for example, a playing field or feature thereof, another individual 710, or a sports object 740. Also for example, an alert may be triggered based on a determination that there are no individuals 710 within a threshold distance of a goal (e.g., the goal area is unguarded). Also for example, an alert may be triggered based on a determination an individual 710 has crossed a boundary line (e.g., stepped out-of-bounds). Also for example, an alert may be triggered based on a determination that sports object 740 is within a goal area (e.g., a goal has been scored). Also for example, an alert may be triggered based on the character of movement of an individual 710's location (e.g., rapid alternating between faster and slower movement of an individual 710 may trigger an alert indicating that individual 710 is limping, and may be injured; minimal movement combined with orientation data showing individual 710 is prone or supine may trigger an alert indicating that individual 710 has fallen, and may be injured). Display 762 may display representations of such alerts as described herein. In some embodiments, a representation of an individual 710 to whom an active alert applies may be displayed in a different color when the alert applies than when the alert doesn't apply. In some embodiments, such an alert may itself include specific coaching advice based on the alert. For example, an alert indicating that an individual 710 is greater than a threshold distance from a target position may be accompanied by a recommendation for the individual 710 to move closer to the target position. Also for example, an alert indicating that there are no individuals 710 within a threshold distance of a particular area (i.e., there is a "gap" in field coverage) may be accompanied by a recommendation for one or more individuals 710 to move closer to the particular area (e.g., to eliminate or reduce the size of the gap).

Also for example, an alert may be triggered based on locations of multiple individuals 710 and/or sports objects 740. For example, an alert may be triggered where a first individual 710 is within a threshold distance from a sports object 740 (e.g., the first individual may be handling the ball), and wherein a second individual 710 is greater than a threshold distance from any opposing individual 710. The alert may provide notification (e.g., to trainer 720, first individual 710) that the second individual 710 is unguarded, which may be useful (e.g., to trainer 720, first individual 710) to prompt consideration of whether first individual 710 should pass the ball to second individual 710. In some embodiments, such an alert may itself include a recommendation for a strategic play, or for a modification to a current strategy (e.g., a calculated "best play," or a new target location for one or more individuals 710, given the known metrics, including location information). For example, the alert may provide a recommendation that the ball be passed from the first individual 710 to the second individual 710. Such alerts can be defined and tailored to any desired game situation, in order to facilitate analysis and speed decision-making during an athletic activity.

In some embodiments, display 762 of group monitoring device 760 depicts the path of one or more individuals 710 or sports objects 740. The path may be a curve tracing past locations of the one or more individuals 710 or sports objects 740 on a map of the playing field. The displayed path may be static (i.e., displaying the curve for a period of time with a defined beginning and end) or dynamic (e.g., displaying the curve for a period of time where either or both of the beginning and end is dependent on, for example, the current time). In depicting the path of one or more individuals 710 or sports objects 740, display 762 may show the position of the one or more individuals 710 or sports objects 740 as a function of time.

Figure 22:
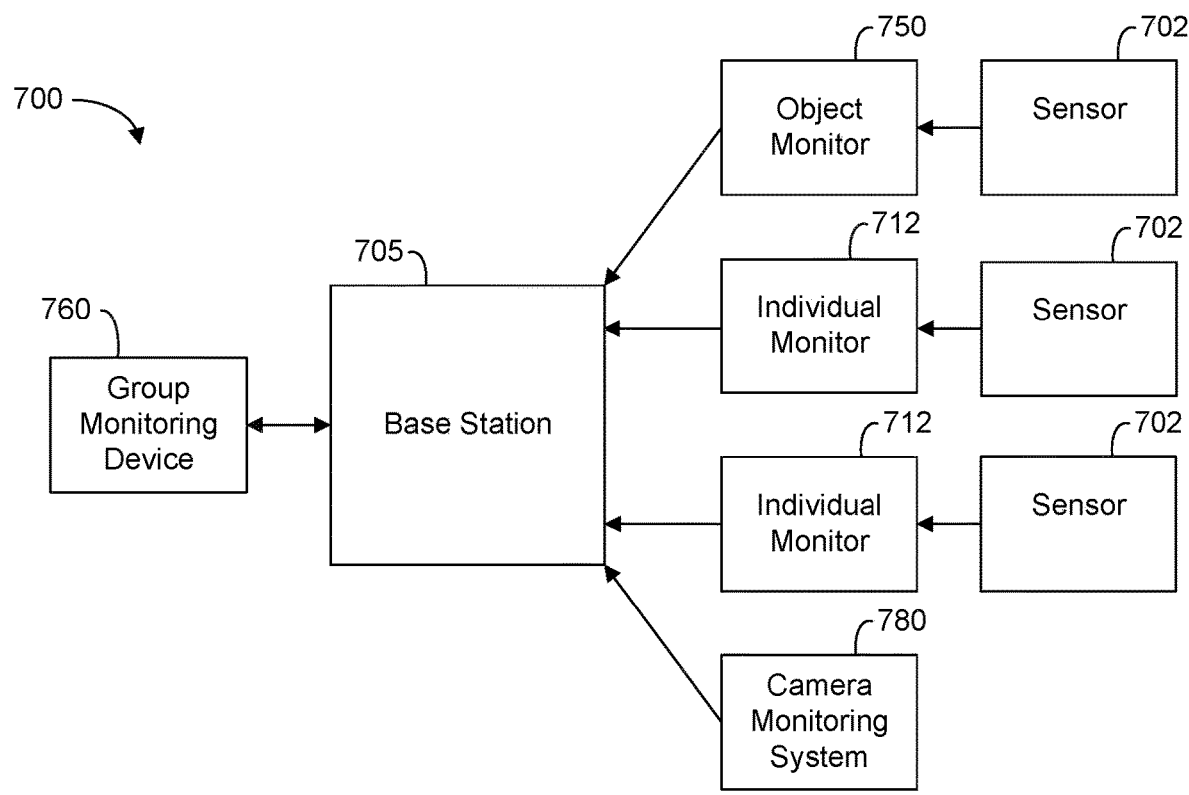
FIG. 22 is a diagram of a portion of a monitoring system, according to an embodiment of the present invention.
Figure 23:
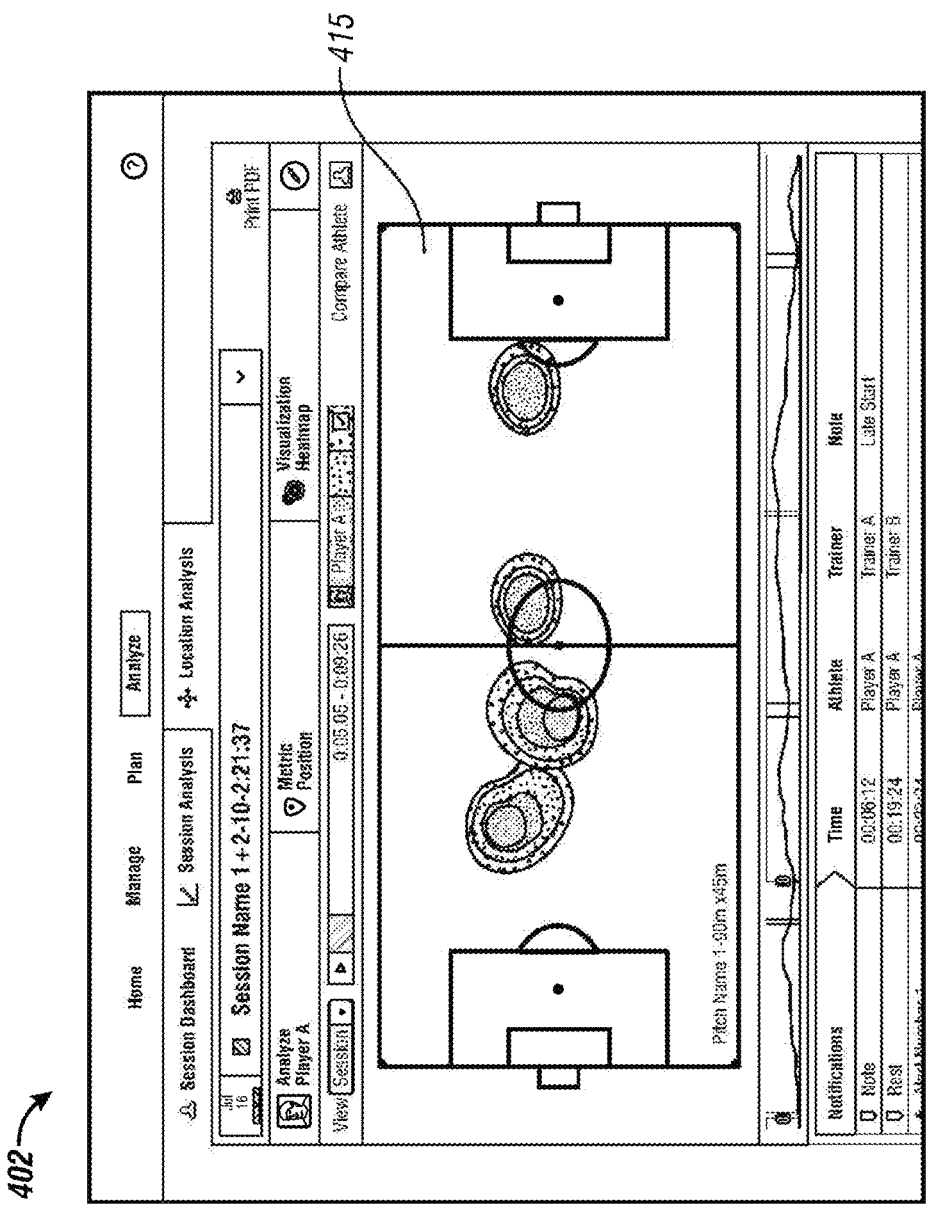
FIG. 23 is an illustration of a display of a group monitoring device, according to an embodiment of the present invention.
Figure 24:
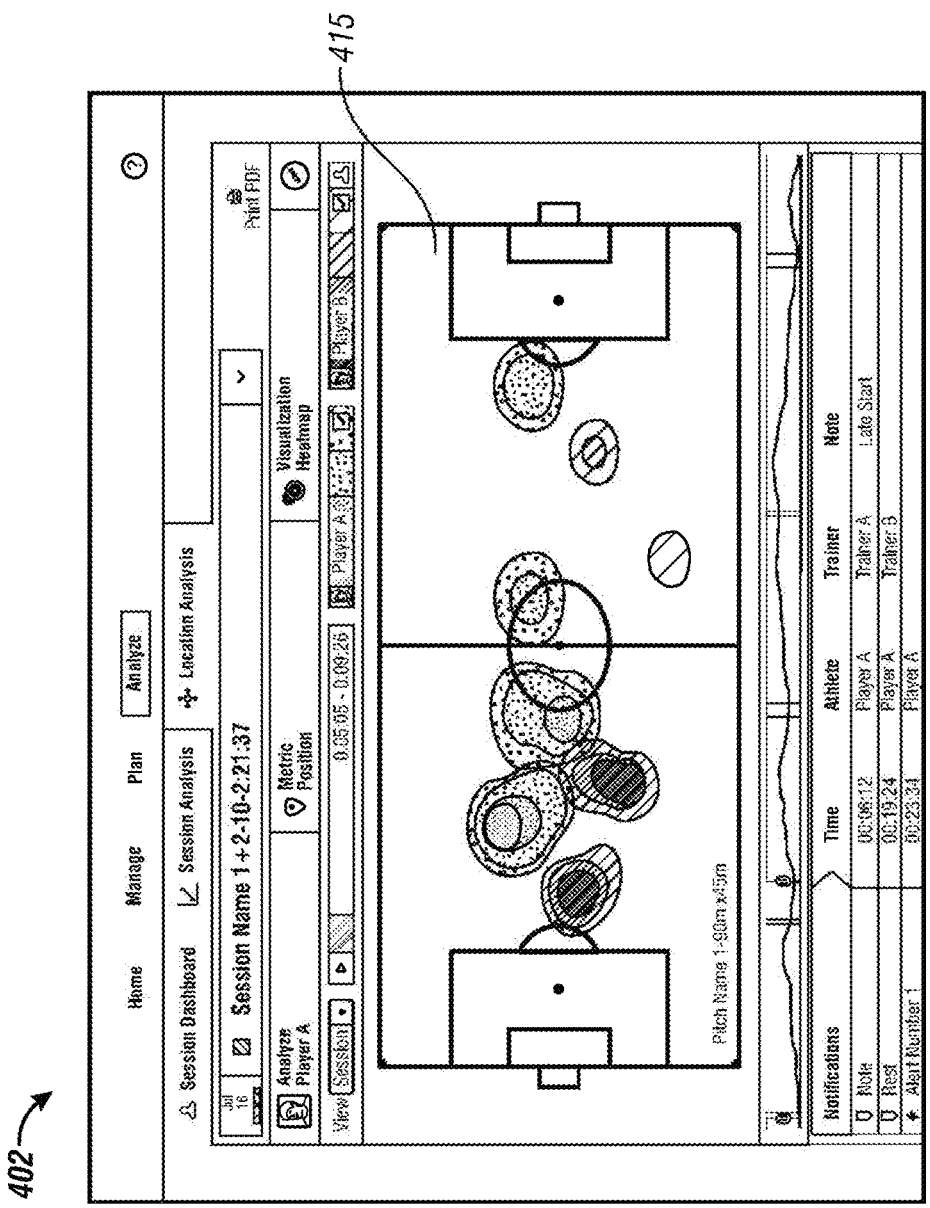
FIG. 24 is an illustration of a display of a group monitoring device, according to an embodiment of the present invention.
Figure 25:
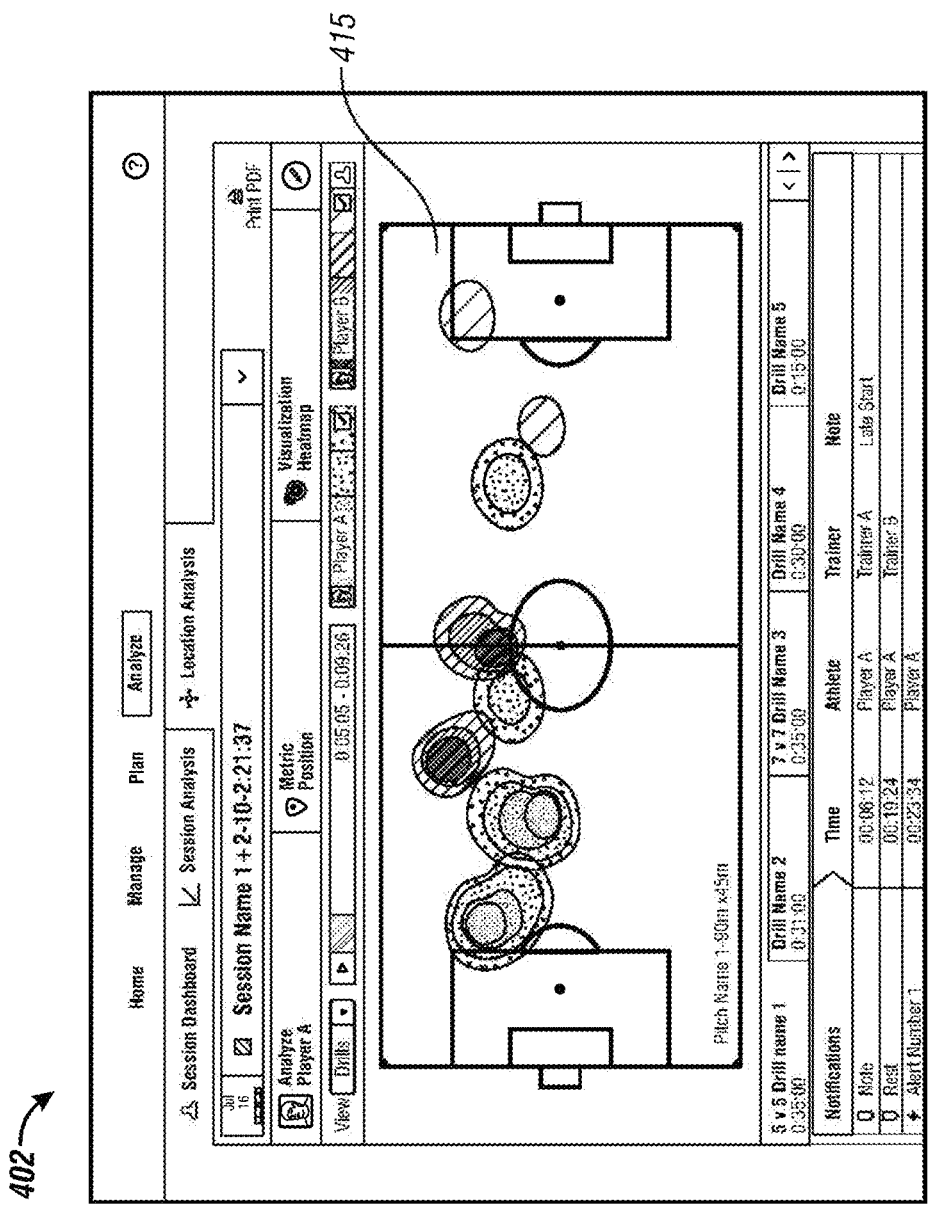
FIG. 25 is an illustration of a display of a group monitoring device, according to an embodiment of the present invention.
Figure 26:
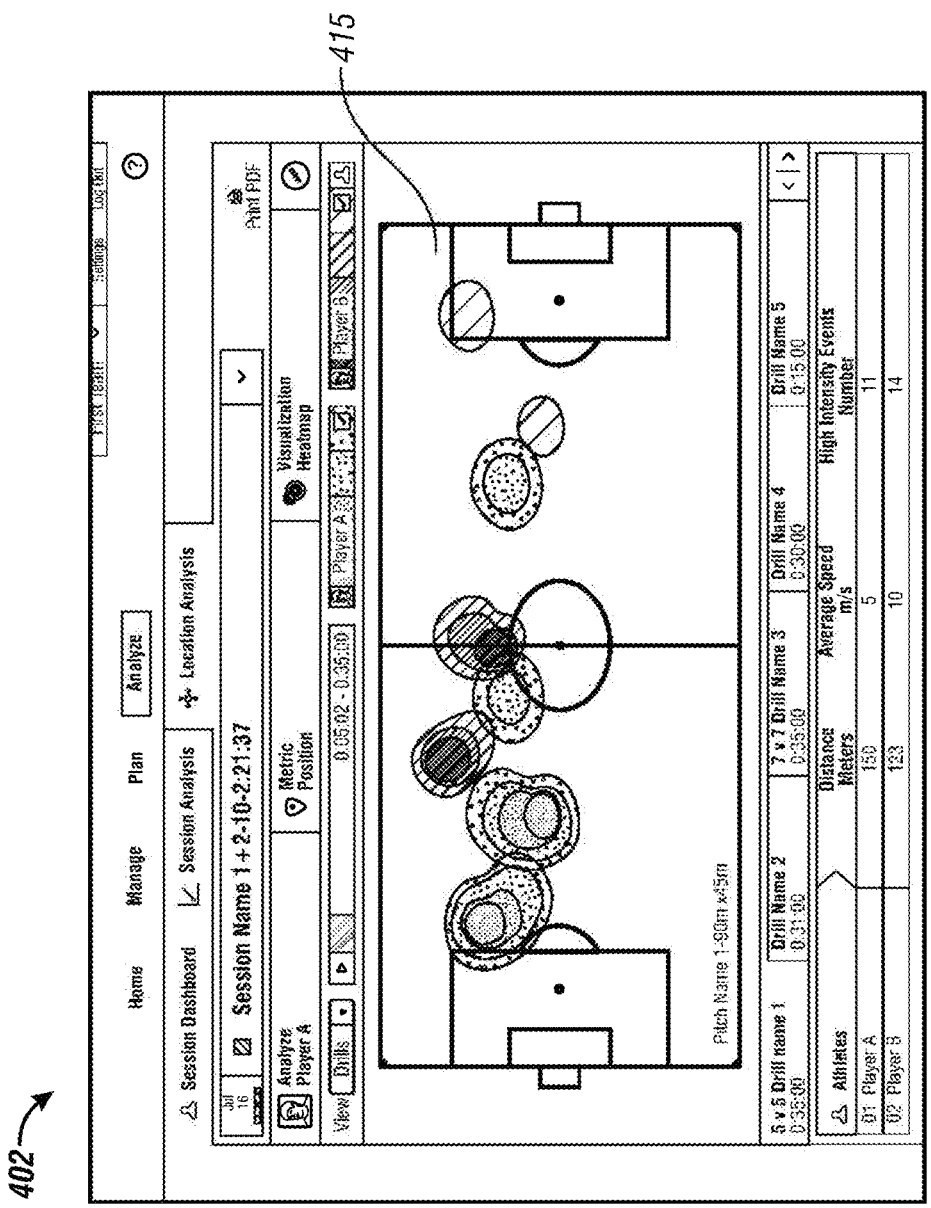
FIG. 26 is an illustration of a display of a group monitoring device, according to an embodiment of the present invention.
Figure 27:
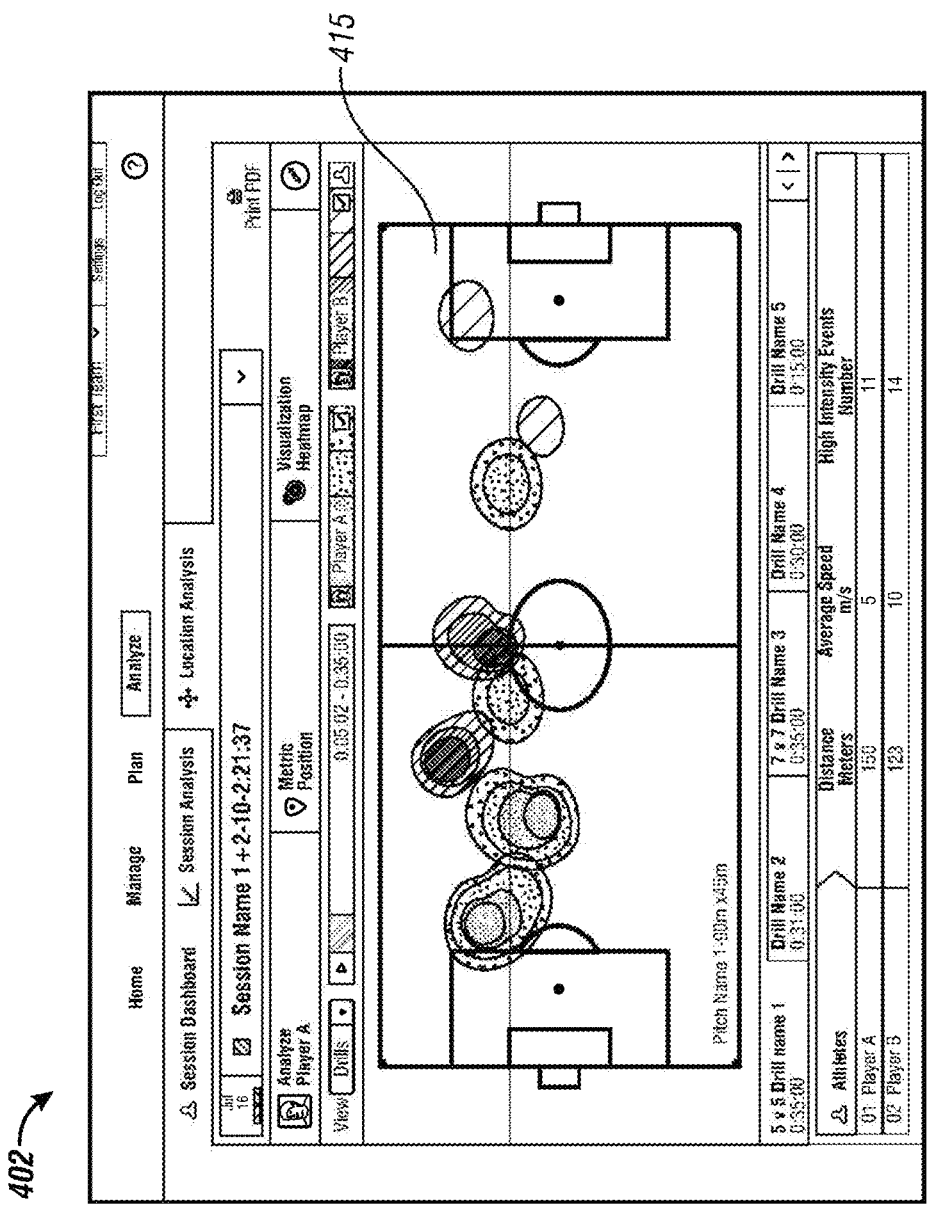
FIG. 27 is an illustration of a display of a group monitoring device, according to an embodiment of the present invention.

As shown, for example, in FIG. 22, group monitoring system 700 can include a combination of the components described above. Sensors 702 attached to multiple individual monitors 712 and object monitors 750 can provide data to base station 705. In certain embodiments, other information can be provided to base station 705, for example, video or images from camera system 780. Data generated by camera monitoring system 780 can be received by base station 705 and analyzed to determine positions of individuals 710 and/or other objects/areas of interest (e.g., sports objects 740). Base station 705 can provide all of this information to group monitoring device 760 to be displayed on display 762.

In some exemplary embodiments, as depicted in, for example, FIGS. 23-27, display 762 includes a heat map 415, which may provide a visual indication of time spent by one or more individual 710 in areas of the playing field. Such visual indication may include colored areas of a representation of the playing field that correspond to areas where individual 710 has spent more time, colored differently than colored areas of the representation of the playing field that correspond to areas where individual 710 has spent less time. In some embodiments (see, e.g., FIG. 23), heat map 415 may represent a single individual 710. In some embodiments (see, e.g., FIGS. 24-27), heat map 415 may represent multiple individuals 710, where visual indications of time spent by different individuals 710 are represented by different colors, or where individuals 710 on one team are represented by the same color while individuals 710 from an opposing team are represented by a different color. In some embodiments, heat map 415 may represent one or more sports objects 740 similarly as described with respect to individuals 710. In some embodiments, where individual 710 is wearing a garment having an illuminable area, the illuminable area may illuminate in a color corresponding to the color used to represent individual 710 on display 762 (e.g., on heat map 415).

Alternatively or additionally, heat map 415 may provide a visual indication of, for example, areas of the playing field where player 710 performed a certain type of activity (e.g., running, jumping), areas of the playing field where player 710 had a metric value above or below a threshold value, or areas of the playing field where player 710 had possession of or contact with a sports object (e.g., a ball). In some embodiments, heat map 415 may provide a visual indication of, for example, optimum positioning of one or more players 710 the playing field.

In some embodiments, display 762 of group monitoring device 760 depicts the location of an individual 710 or sports object 740 with respect to some other feature (which may be, for example, another individual 710 or sports object 740, or a point on the playing field). Such depiction can take the form of a distance measurement between (i.e., magnitude of separation of) the individual 710 or sports object 740 and the other feature, which may be represented, for example, as a history of the separation (e.g., a graph showing time v. separation) or as an integral map (e.g., a histogram) of the separation over a set period.

The various depictions of locations of individuals 710 and/or sports objects 740 can help a viewer (e.g., trainer 720, individual 710) to analyze plays made during a session of athletic activity. For example, the depictions may be useful in facilitating tactical training or strategy development, by facilitating design and monitoring of pre-planned plays, or the analysis of successful or failed plays to seek areas for improvement. Also for example, the depictions may be useful to determine the extent of separation between two individuals 710 with the same role on a team (e.g., two fullbacks), to optimize their coverage of the playing field (e.g., to ensure that the two fullbacks maintained at least a threshold separation during a game in order to ensure that areas of the field were not left undefended). Also for example, the depictions may be useful to analyze the effect of positioning of individuals 710 on game events, including the outcome of the game (e.g., the distance and frequency with which a fullback strayed from the corner of the penalty box, or the distances between the two fullbacks and the goalkeeper can be analyzed at key points, like when a goal against has been scored, to help identify and improve sub-optimal positioning and to help prevent future goals against from being scored). Also for example, the depictions may be useful to determine possession or change thereof (e.g., a successful pass) of a sports object 740 (e.g., ball) by an individual 710 (e.g., by identifying separation between the individual 710 and sports object 740 below a threshold distance for a threshold period of time).

In some embodiments, image data generated by a camera monitoring system can be overlaid or identified with data and metrics described herein. In such an embodiment the image data may be displayed synchronously with the data and metrics by or in conjunction with a display device (e.g., group monitoring device 760 or analysis device 770). This can help correlate data and metrics with actual images of individuals 710 and/or sports objects 740.

In some embodiments, as described above, one or more metrics may be based on a determination of position of individual 710 and/or sports object 740 with respect to a playing field or feature thereof. For example, in some embodiments, location signals (e.g., signals generated by position modules) are correlated with positions on playing field 430 using previously mapped magnetic field data, where the magnetic field data of the playing field are known by group monitoring system 700. Also for example, in some embodiments location signals are correlated with positions on playing field using relative location data (e.g., data representing a relative location with respect to a reference, which may be, for example, base station 705 or some other stationary beacon connected thereto), where the relative position of the playing field is known by group monitoring system 700. In some embodiments, the position of the playing field becomes known to group monitoring system by being defined by a user.

Figure 28:
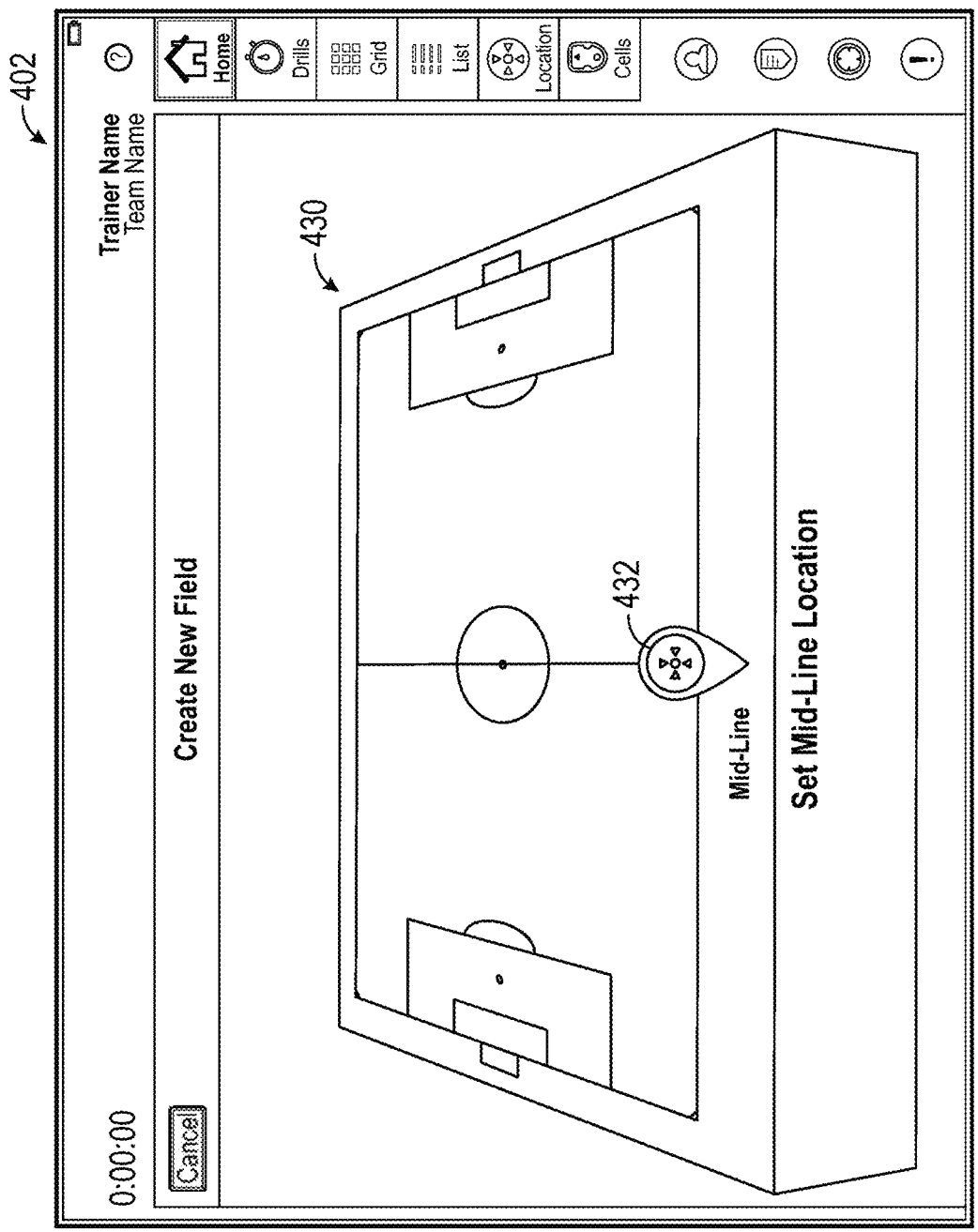
FIG. 28 is an illustration of a display of a group monitoring device, according to an embodiment of the present invention.

In some embodiments, a portable system component (e.g., an individual monitor 712, an object monitor 750, or group monitoring device 760) can be used to define the playing field (which may be, for example, a soccer field, a racing track, or other area). For example, in a field definition mode, display 762 of group monitoring device 760 or other administrative device may display an instruction to locate a position sensor at a first location on a playing field. For example, as shown in FIG. 28, display 762 may instruct a user to locate a position sensor, which could be a magnetic field sensor, at a mid-line location of a soccer field. Display 762 may display a graphical representation of the playing field 430, with an instruction marker 432 showing the user the location at which to position the sensor. The user may position the group monitoring device 760 at the location on the playing field corresponding to the displayed location, and may optionally provide input through input 764 of group monitoring device 760 to indicate that the group monitoring device 760 is positioned at the instructed location. Alternatively or additionally, in some embodiments, the user of group monitoring device 760 may direct an associated other portable device (e.g., an individual monitor 712 or object monitor 750 carried by another person) communicatively connected to the group monitoring device to the location on the playing field corresponding to the displayed location, and may optionally provide input through input 764 of group monitoring device 760 to indicate that the associated other portable device is positioned at the instructed location. Group monitoring device 760 may then receive position data identifying the location of the position sensor, and may define this position data as corresponding to the instructed location. As noted, such position data may be determined based on a comparison of previously mapped magnetic field data with measured magnetic field data or data representing relative location with respect to a reference.

Figure 29:
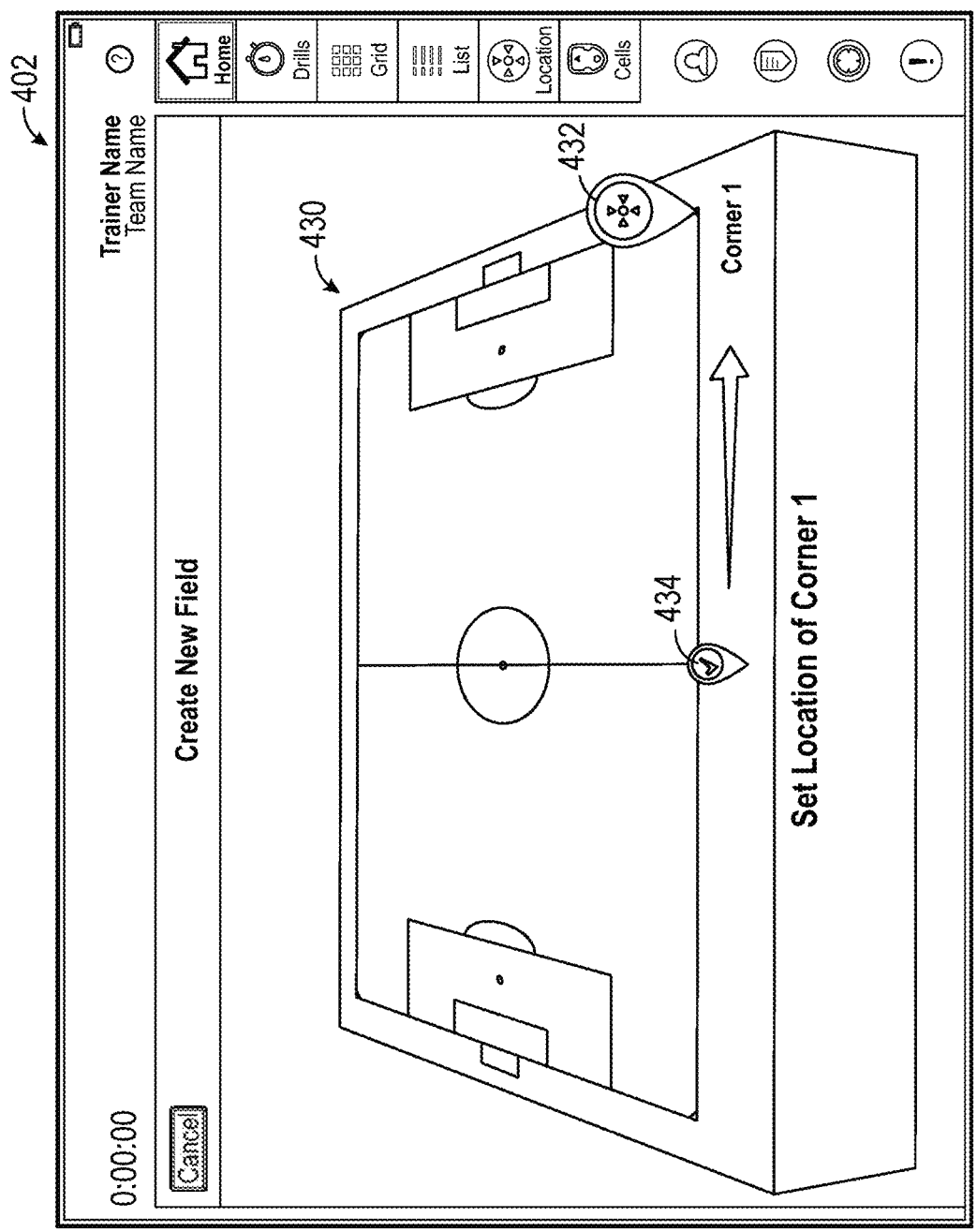
FIG. 29 is an illustration of a display of a group monitoring device, according to an embodiment of the present invention.
Figure 30:
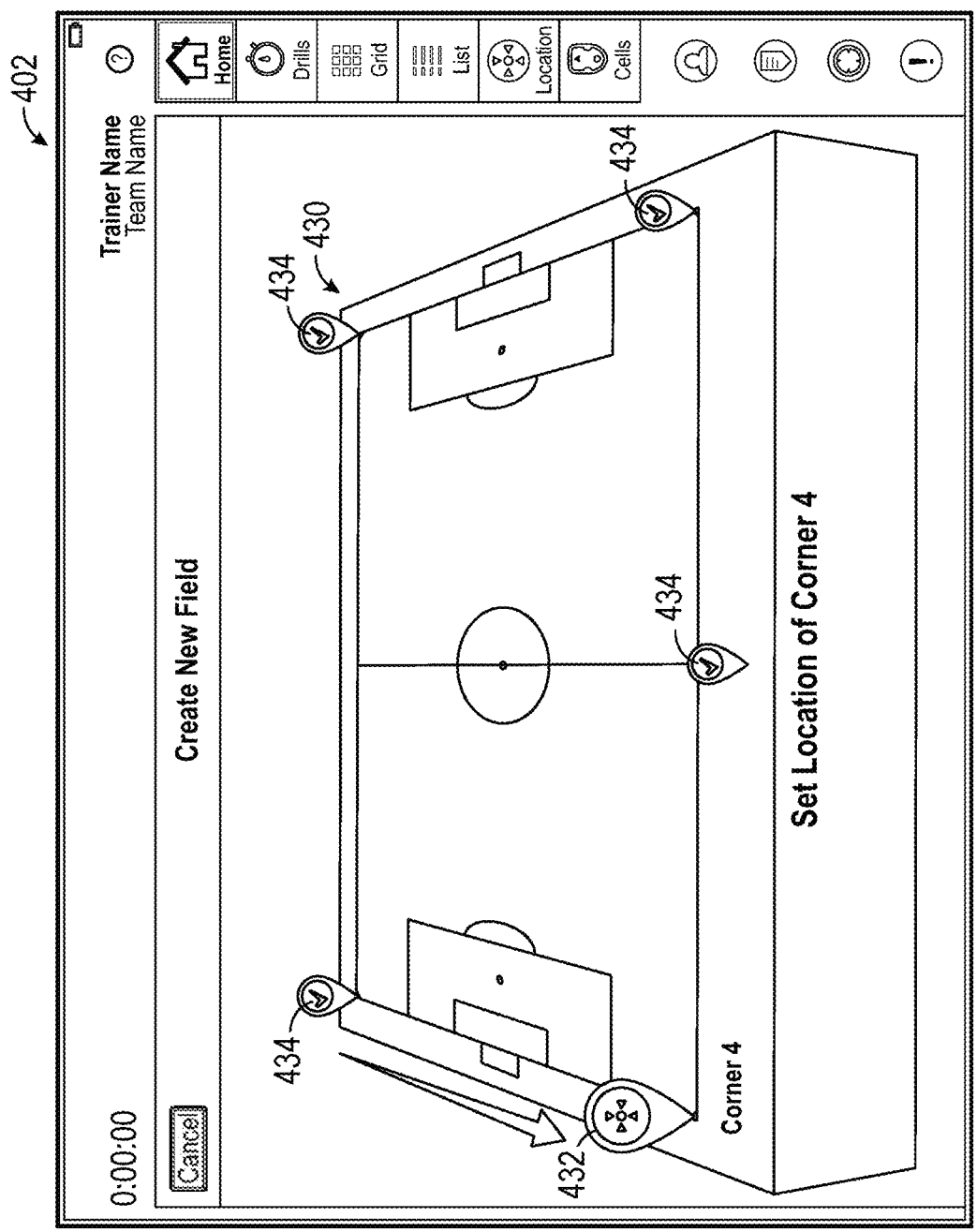
FIG. 30 is an illustration of a display of a group monitoring device, according to an embodiment of the present invention.

Display 762 of group monitoring device 760 may then display an instruction to locate the position sensor, which could be a magnetic field sensor, at additional locations on the playing field 430, which can be defined similarly as described for the first. For example, as shown in FIG. 29, display 762 may depict a confirmation marker 434 showing that the first point has been defined, and may show an instruction marker 432 showing the user a second location to be defined (e.g., a first corner of a soccer field). Display 762 of group monitoring device 760 may continue to show additional instructions to define additional locations on the playing field 430 (see, e.g., FIG. 30, showing four confirmation markers 434 indicating four defined positions, and one instruction marker 432 indicating a final position to be defined). The positions of the various defined locations may together define the playing field.

Group monitoring system 700 may be applied as described to define any playing field or other area, whether regular or irregular in shape. For example, group monitoring system 700 can be used to define a soccer field, tennis court, running track, football field, basketball court, baseball field, golf course, ski slope, or mountain bike track. The number of positions needed to fully define a playing field 430 may vary and may depend on the geometry of the playing field to be defined. For example, a typical soccer field (or other symmetrical rectangular-shaped field) can be considered fully defined with a minimum of three positions defined (e.g., three corners where the fourth corner can be determined based on the location of the defined three corners).

The minimum positions needed to fully define a playing field 430 may increase with increasing geometric complexity of the field shape as well as the extent and geometric complexity of field features to be defined. In some cases, defining some field features may be optional, or may be determined by group monitoring system based on known relationships with defined positions.

For example, defining a baseball field or golf course may involve defining a greater number of positions than does defining a soccer field or tennis court. For example, when defining a baseball field, it may be desired to define its field of play (which is often irregular and can vary from field to field), its foul lines, its base positions, its warning track, and its boundary between infield and outfield. When defining a soccer field or tennis court, simply defining three corners of the field or court may be sufficient for group monitoring system to determine remaining field features. Group monitoring system 700 may instruct definition of the minimum positions needed, or of more than the minimum positions needed (including optional positions). Defining more than the minimum number of positions needed may increase the accuracy of the field definition. Further, group monitoring system 700 may instruct definition of the same position once, or more than once. Defining the same position more than once may increase the accuracy of the definition of that position, thereby increasing the accuracy of the field definition.

Figure 31:
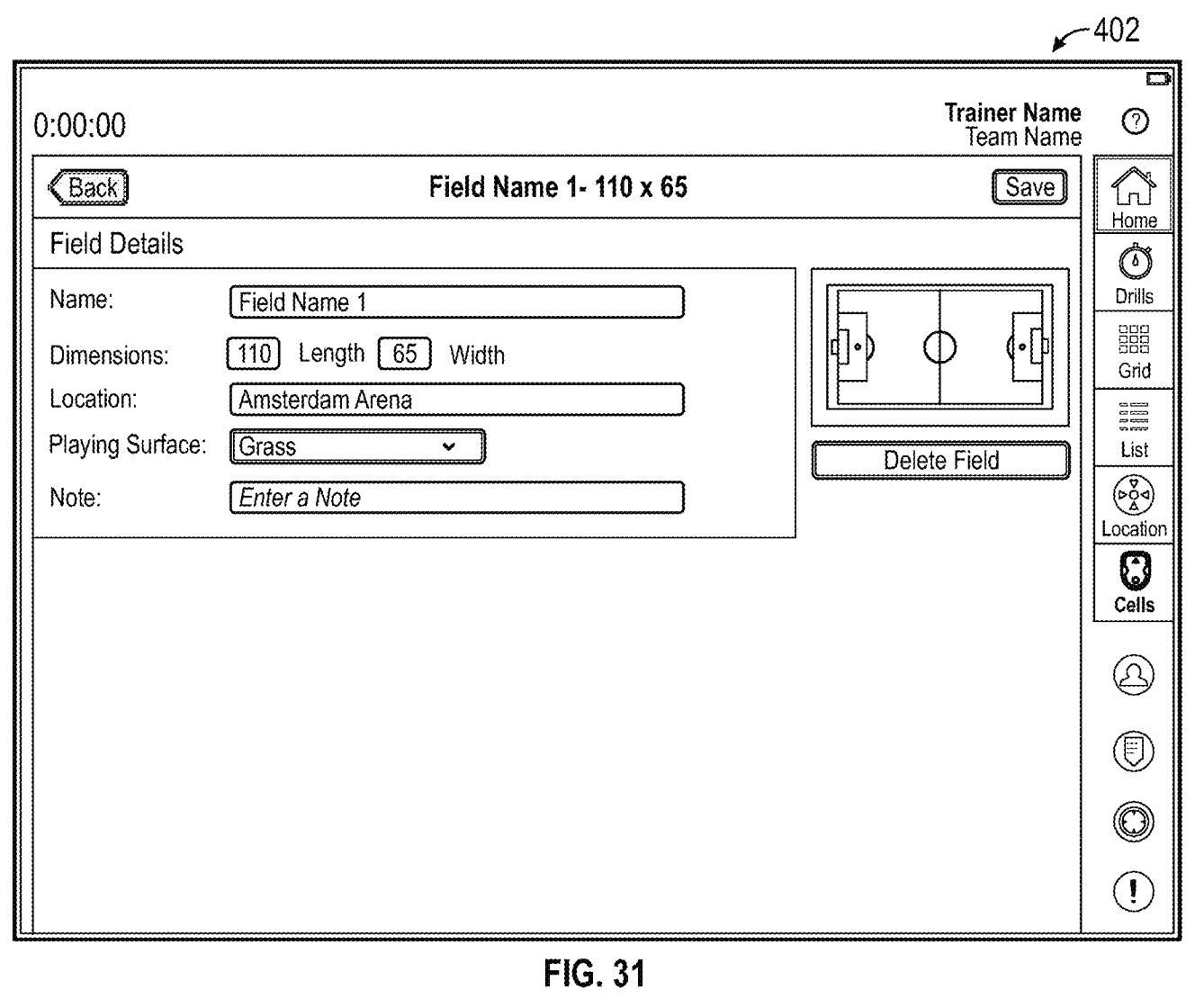

Once defined or otherwise obtained, a playing field may be saved in a storage medium of any system component (e.g., group monitoring device 760, base station 305, web server system). Attributes of the defined field may be saved in association therewith. For example, a field save screen is depicted on display 762 of group monitoring device 760 in FIG. 31. The field save screen includes fields for a user to input a field name, the field dimensions, the field location, the field playing surface, and any desired notes about the field. In some embodiments, certain field attributes may be determined by group monitoring system 700 (e.g., via a system component such as, for example, group monitoring device 760). For example, once a field is defined, group monitoring system 700 may calculate its dimensions or location (e.g., using magnetic field data).

As described above, group monitoring system 700 is portable, so it can be transported between and used at different areas during different sessions of athletic activity. The ability of group monitoring system 700 to define a new playing field and monitor activity thereon facilitates this portability. For example, the same group monitoring system 700 can be used to monitor training sessions at a team's training facility, at the team's home playing field, and at the playing fields of opposing teams visited by the team on the road. Each different field can be defined as described above. This facilitates use of group monitoring system 700 across different playing fields, and gives trainers 720 the ability to keep a consistent, repeatable set of measurements even when sessions of athletic activity occur at different locations (e.g., over the course of a season). Many conventional monitoring technologies require fixed installations, which prevents trainers from collecting data or requires them to use different technologies during a session of athletic activity away from their installation (e.g., when they are traveling).

In some embodiments, once group monitoring system 700 receives signals from individual monitors 712 or object monitors 750 monitoring individuals 710 or sports objects 740 in motion on the defined playing field, group monitoring system 700 may determine the type of playing surface of the defined field, based on the character of motion signals received from the individual monitors 712 or object monitors 750. For example, an object monitor 750 monitoring a sports object 740 traveling toward the ground at a given speed may sense different impact characteristics for the sports object 740 upon its striking the ground depending on the type of field, and may determine the type of field based on these characteristics. For example, a duration of impact may be shorter and bounce height may be higher for a hard-surfaced playing field (e.g., clay, hardwood, or asphalt) than for a soft-surfaced playing field (e.g., grass, sand). Also for example, an individual monitor 712 monitoring an individual 710 running on the ground may sense different impact characteristics for the footfalls of the individual 710 depending on the type of field, and may determine the type of field based on these characteristics.

In some embodiments, instead of or in addition to defining a field based on a plurality of positions, a playing field can be defined by lines that correspond to a path moved by a portable system component along boundaries of the playing field. The definition of such lines can be effected similarly as described above with respect to the definition of positions relative to the playing field. A line-based definition technique may be beneficial, for example, in defining fields having complex or non-standard shapes.

Saved fields may be stored and re-used, and may be shared or sold (e.g., via a website or social networking service, as described elsewhere herein). In some embodiments, group monitoring system 700 can download data representing a pre-defined field (e.g., via a system component, such as, for example, group monitoring device 760). Data defining such pre-defined fields may be available for download from, for example, a database, or directly from another user or website. Such pre-defined fields may have been defined previously by, for example, a user of the same or a different group monitoring system 700, or of any other suitable system (e.g., a position-recording or surveying system). In some embodiments, group monitoring system 700 can provide an interface to search for data representing a particular pre-defined field (e.g., via group monitoring device 760), or may suggest download of data representing particular pre-defined fields based on the position of one or more system components. For example, if base station 705 is determined to have coordinates proximate to those of Playing Field A, where data representing Playing Field A is pre-defined and available for download by group monitoring system 700, group monitoring system 700 may suggest such download (e.g., via an interface of, for example, group monitoring device 760), thereby eliminating the need to re-define Playing Field A before holding a session of athletic activity thereon.

For example, group monitoring system 700 may monitor data streams representing heart rate, power, speed, distance, acceleration, and position on a playing field. By combining these data streams and basing calculations on more than just a single data stream, group monitoring system can determine and output representations of new insights such as, for example, intensity and efficiency of an individual 710 or group thereof. Display 762 of group monitoring device 760 can display such representations in real time, thus enabling trainers to act on these insights during a training session to ensure that they are meeting their training goals.

Also for example, speed is typically used as a measure of intensity. Speed is an important part of many athletic activities. By monitoring an individual's speed a trainer can see if the individual is training at a target level (e.g., a level considered to correspond to success in a game). When a trainer plans a speed training session he or she can customize a live dashboard (e.g., displayed on display 762) to view speed-related data including peak speed, average speed, and number of high intensity sprints. The ability to manage speed training carefully can help prevent overtraining and can reduce the risk of injury.

Also for example, distance covered has long been a reference for training volume. The distance an individual covers (e.g., runs) during a session of athletic activity (e.g., a game or scrimmage) can vary. A real time measure of distance covered can allow a trainer to set individual or team targets for distance and ensure that all individuals have reached the target. At the end of a session of athletic activity the trainer can refer to the live dashboard to check distance covered. Individuals that fell short of the target may be instructed to continue to run.

Also for example, acceleration (including deceleration) can be a significant measure of performance. Acceleration can be important in sports where rapid change of direction is required. Understanding the rate and frequency of acceleration can influence a determination of overall training load.

Also for example, knowledge of position on the field may allow a trainer to see where the monitored individuals are or have been on the field. This can promote insights into tactical movements of the players. As described above, such positioning can be shown on a map, for instance a heat map, where positions are determined using a comparison of previously mapped magnetic field data with measured magnetic field data.

The principles, components and systems described above can be used to determine performance information for an object located within an area, for example, the position of a player or sport ball located within an area designated to host athletic activities. In certain embodiments, local magnetic field data can be measured and compared with previously measured and recorded magnetic field information for the area to determine the position of the object within the area.

Figure 32:
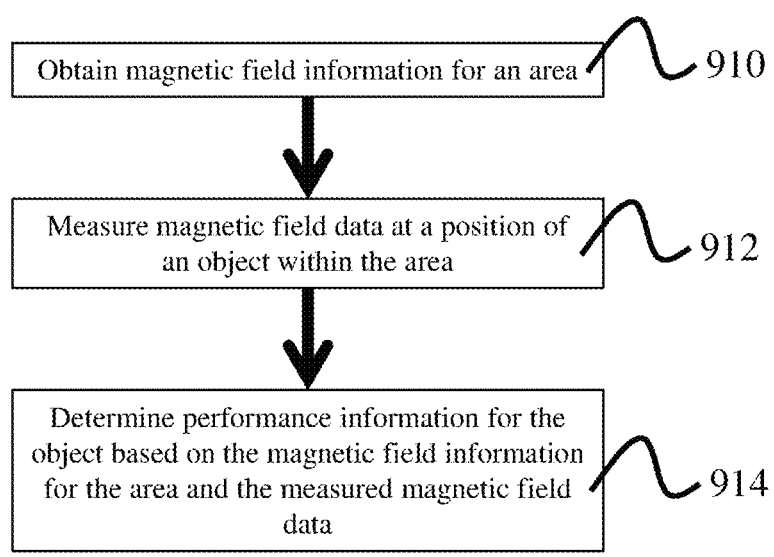
FIG. 32 is a flow chart illustrating a method for determining performance information for an object located within an area, according to an embodiment of the present invention.

For instance, FIG. 32 illustrates a method for determining performance information for an object located within an area, according to an embodiment. In certain embodiments, the area can be an indoor area, for example, an area designated to host athletic activities. In step 910, magnetic field information for the area can be obtained. In certain embodiments, the magnetic field information for the area can include the intensity and/or direction of the magnetic field.

In certain embodiments, magnetic field information can be collected to create a magnetic field data map. Magnetic field data can be measured at a plurality of locations within the area. In certain embodiments, the magnetic field information for the area can be recorded during a mapping session. The mapping session can be performed manually, for example, by a person walking within the area and taking magnetic field data measurements with a hand-held device at certain locations within the area. The mapping session can also be performed automatically, for example, by a robot designed to move within the area and record magnetic field data at predetermined time and/or distance intervals. In certain embodiments, magnetic field map data can be acquired by moving sensor module 102, which can include magnetic field sensor 118, through discrete positions within the area. For example, sensor module 102 can be passed through positions along a playing field in a grid-like pattern and magnetic field data can be recorded, for example, every one meter. Any other distance or measurement increment, for example, every half meter or every 10 cm, can also be used. Known points, for example, boundary lines and goals, can be noted as the magnetic field information is recorded. In certain embodiments, the magnetic field information can be stored, for example, in the memory of a computing device or in a database. The magnetic field information can be accessed at a later time to be compared with measured magnetic field data of an object within the area.

In certain embodiments, mapping of the magnetic field information can be enhanced by recording the mapping session with a video camera. For example, by using an overhead camera and intermittently flashing a strobe light located at sensor module 102, the video data can be compared to the magnetic field data recorded by sensor module 102 to define a virtual view of the area.

With continued reference to FIG. 32, at step 912, magnetic field data can be measured at a position of an object within the area. As described above, the object can be, for example, an individual 100 or piece of athletic equipment 108 (e.g., a ball), and the magnetic field data can be measured and recorded by, for example, sensor module 102, which can include magnetic field sensor 118 (e.g. a magnetometer). In certain embodiments, sensor module 102 can be coupled to the object. Magnetic field intensity data and/or magnetic field direction data can be measured and recorded by sensor module 102.

At step 914, performance information for the object can be determined based on the magnetic field information for the area and the measured magnetic field data. For example, a position of the object within the area can be determined by comparing measured magnetic field data to the magnetic field information for the area and determining a matching location.

Figure 33:
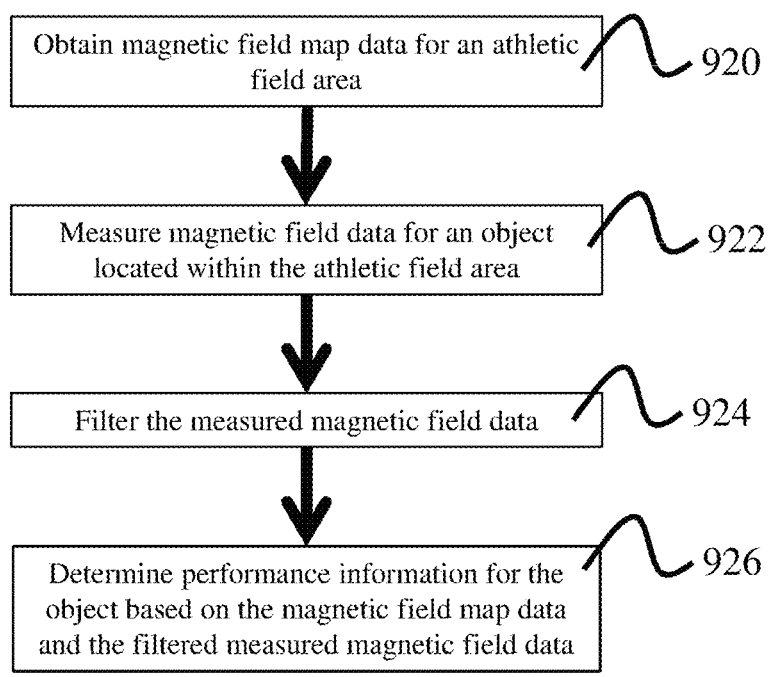
FIG. 33 is a flow chart illustrating a method for determining performance information for an object located within an area, according to an embodiment of the present invention.

In certain embodiments, as shown, for example, in step 924 of FIG. 33, measured magnetic field data can be filtered to improve the accuracy of determining the performance information for the object. FIG. 33 illustrates a method for determining performance information for an object located within an athletic field area by obtaining magnetic field map data for an athletic field area (step 920) and measuring magnetic field data for an object located within the athletic field areas (step 922). The measured magnetic field data can be filtered (step 924) to determine performance information for the object based on the magnetic field map data and the filtered measured magnetic field data (step 926).

Figure 34:
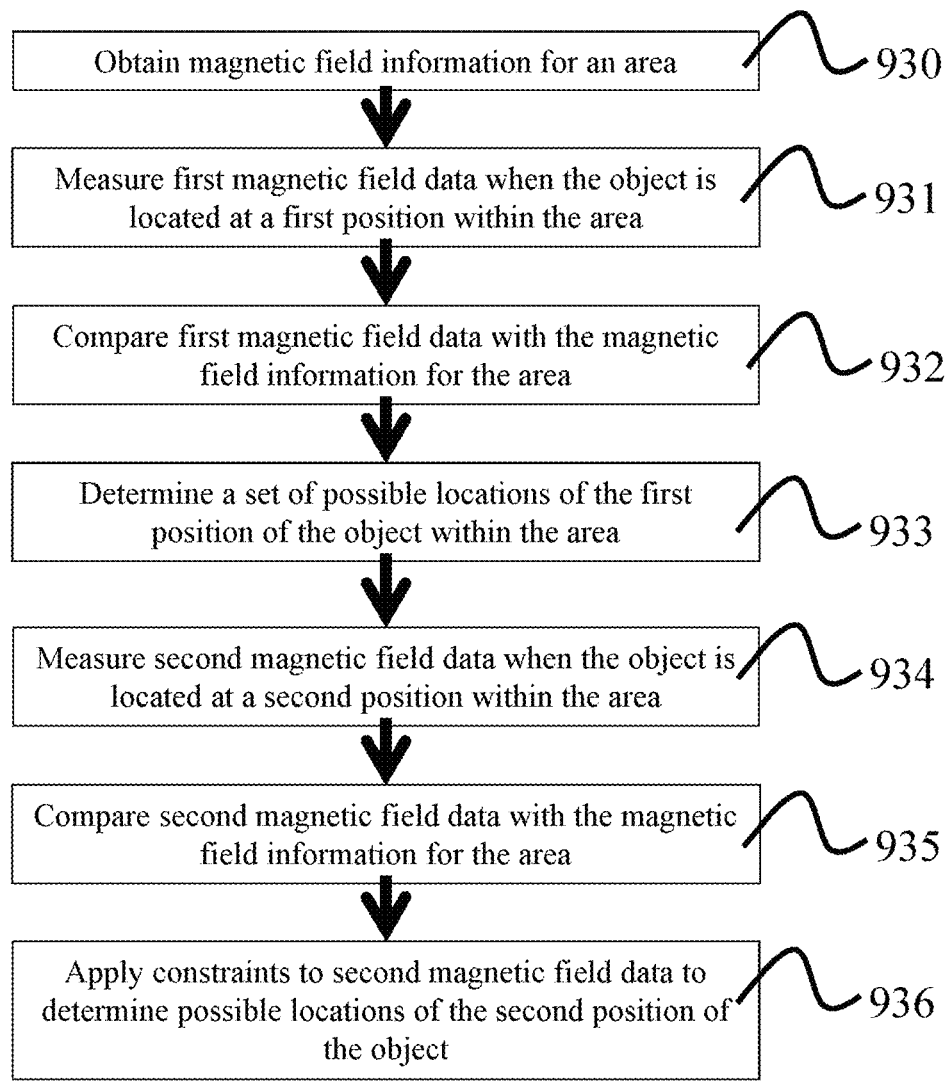
FIG. 34 is a flow chart illustrating a method for determining a position of an object within an area, according to an embodiment of the present invention.

With reference to FIG. 34, in certain embodiments, performance information for the object, such as the position of the object, can be determined through an iterative process. After obtaining magnetic field information for the area (step 930), first magnetic field data for the object can be measured at a first position (step 931). This first magnetic field data can be compared to the magnetic field information recorded for the area during the mapping session (step 932). This comparison may result in determining several possible locations of the object within the area (step 933). Thus, a second measurement of magnetic field data for the object can be taken at a second position (step 934), and this data can also be compared with the magnetic field information for the area (step 935).

As shown in step 936 of FIG. 34, the measured magnetic field data can then be filtered by applying constraints (e.g., by using a computer algorithm) to reduce the data being considered in order to determine the position of the object. The filter can include constraints such as physical space constraints, for example, field dimensions. The filter can also include human movement constraints, for example, motion dynamics extremes. Similar constraints can be applied for motion dynamics extremes of a piece of athletic equipment (e.g., a ball). These constraints can be applied in order to eliminate unlikely positions of the object. For instance, if two sets of magnetic field data are taken a fraction of a second apart, it would be illogical to include a second position point that is 50 meters away, when a human could not possibly cover that distance in the given time. Further iterations of magnetic field data measurements and filtering can be performed as necessary to further reduce the possible positions of the object within the area until the position of the object is determined with near certainty. Throughout the iterative process, probability values can be assigned to each of the potential locations of the object based on a degree to which each potential location matches the constraints at each iterative step. Locations with a low probability of matching can be eliminated at each iteration, reducing the number of potential locations of the object.

Once the position of the object is determined using the steps above, it becomes easier to predict and determine the position of the object because movement of the object must fall within physical space and object movement constraints. The number of possible locations of the object is, therefore, smaller than when first determining the position of the object within the area. In certain embodiments, in order to further improve the accuracy of determining the position of the object, additional sensor data can be utilized in conjunction with the magnetic field data measurements. For example, data from an accelerometer, gyroscope, infrared (IR) device, imaging device (e.g., a camera) or any other suitable sensor can be utilized to help approximate the direction in which the object is moving. The possible position of the object is thus narrowed by a directional constraint, therefore further increasing the accuracy of determining the position of the object within the area.

Figure 35:
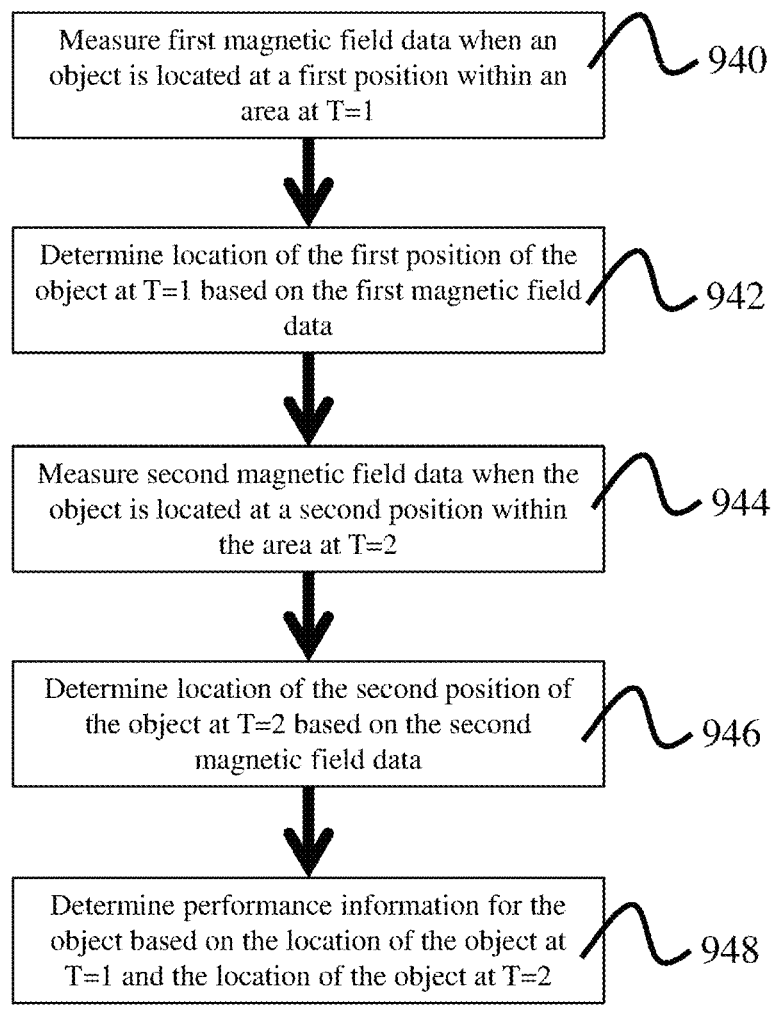
FIG. 35 is a flow chart illustrating a method for determining performance information for an object located within an area, according to an embodiment of the present invention.

Similar to the method above, FIG. 35 illustrates a method of determining performance information for an object at certain times. At steps 940 and 942, first magnetic field data can be measured at a first time to determine a first position of the object at the first time. At steps 944 and 946, second magnetic field data can be measured at a second time to determine a second position of the object at the second time. Once the first and second positions are determined, in step 948 performance data (e.g., distance traveled and speed) can be determined.

Figure 36:
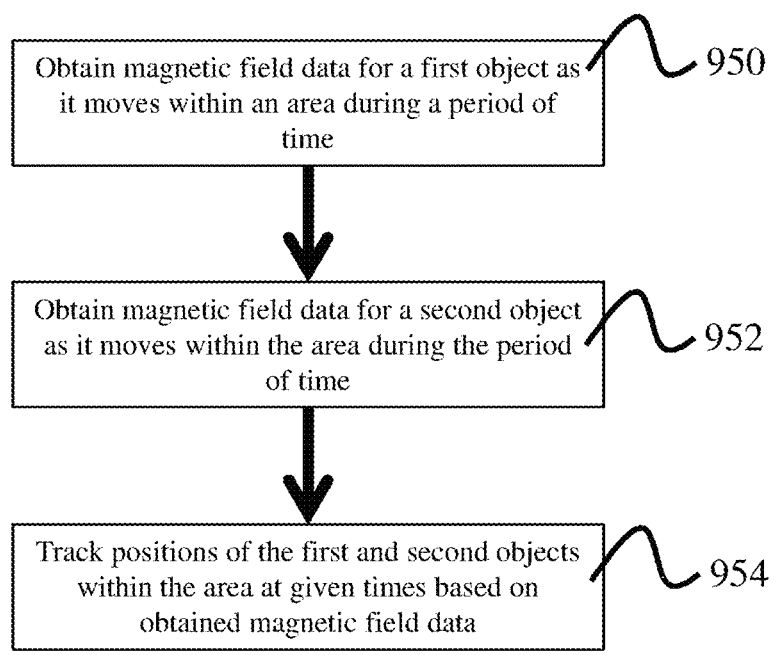
FIG. 36 is a flow chart illustrating a method for tracking a first and second object as they move about an area, according to an embodiment of the present invention.

As shown in FIG. 36, the methods described above can be used in the team sports context. At step 950, magnetic field data for a first object, for example a player, can be obtained (e.g., using sensor module 102) as the player moves within a field of play. At step 952, magnetic field data for a second object, for example a teammate, competitor or a sport ball, can be obtained as the second object moves within the area. In certain embodiments, multiple objects can be monitored as they move about the area. At step 954, the positions of both the first and second objects can be tracked within the area based on the measured magnetic field data. In certain embodiments, the first and second objects can be tracked in substantially real-time as they move about the area. In other embodiments, the first and second objects can be tracked at a later time after they finish moving about the area, for example, after an elapsed time period for a team sport event. The position information can be analyzed and displayed using the systems and methods described above. For example, a "heat map" showing the amount of time a player spent at certain locations on the field can be displayed on a monitoring device.

Figure 37:
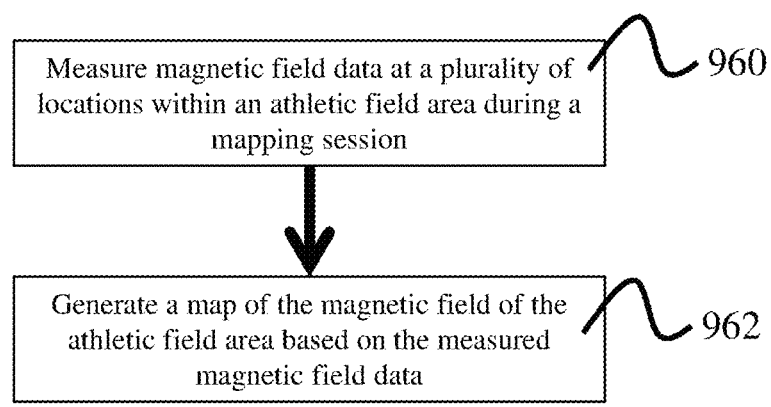
FIG. 37 is a flow chart illustrating a method for mapping a magnetic field of an athletic field area, according to an embodiment of the present invention.

FIG. 37 illustrates a method for mapping a magnetic field of an athletic field area. Athletic field areas can be located both outdoors and indoors. Examples of athletic field areas can include, but are not limited to, football fields, soccer fields, baseball fields, track and field areas, basketball courts, tennis courts, swimming pools and roads (such as for running or cycling events). Non-traditional athletic field areas, for example, the inside of a building, including staircases, such as for an indoor running event, are also contemplated within the broad scope of athletic field areas. At step 960, magnetic field information can be gathered by measuring magnetic field data at a plurality of locations within the athletic field during a mapping session. In certain embodiments, the measurement locations can be equally spaced apart from each other, such as in a grid pattern. In certain embodiments, measurement locations within the area can be associated with playing field structures, such as boundaries and goals. In certain embodiments, a mapping session can be recorded using a video camera to generate video data for the athletic field that can be correlated to the magnetic field data. At step 962, a map of the measured magnetic field data for the athletic field area can be generated (e.g., by a computing device) based on the measured magnetic field data. As described above, the magnetic field map can be subsequently compared to measured magnetic field data for an object located within the area in order to determine the position of the object within the area. In certain embodiments, the measured magnetic field data can be recorded and used to update the magnetic field map.

Figure 38:
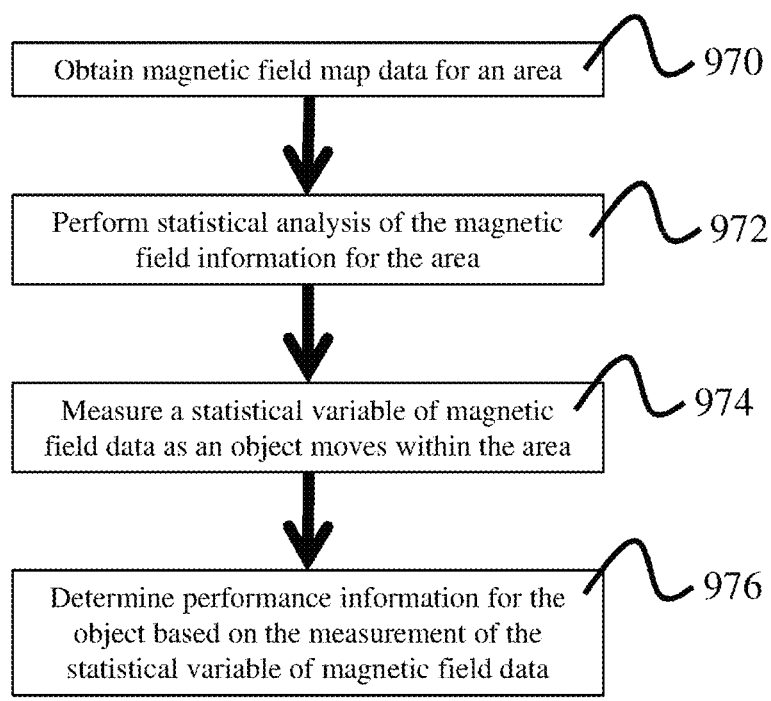
FIG. 38 is a flow chart illustrating a method for determining performance information for an object located within an area, according to an embodiment of the present invention.

As shown, for example, in FIG. 38, in certain embodiments, performance information, such as speed and distance traveled, can be determined for an object located within an area. Similar to the methods above, magnetic field information for the area can be obtained, for example, in a mapping session (step 970). In certain situations (e.g., a small basketball gymnasium), magnetic field information may be sufficiently similar such that the area need not be mapped, but rather associated with a similar area that has previously been mapped. Statistical analysis of the variability of the magnetic field information for the area can then be performed (step 972). For example, variations in magnetic field intensity and/or direction over a given distance between adjacent points can be determined. In certain embodiments, a statistical distribution of the variability of magnetic field intensities and/or direction can be determined for the area. The variability of the magnetic field data can then be measured as an object moves within the area (step 974) in order to determine performance information for the object based on the variability of the magnetic field data (step 976).

Figure 39:
FIG. 39 is an illustration of a magnetic field intensity map, according to an embodiment of the present invention.
Figure 40:
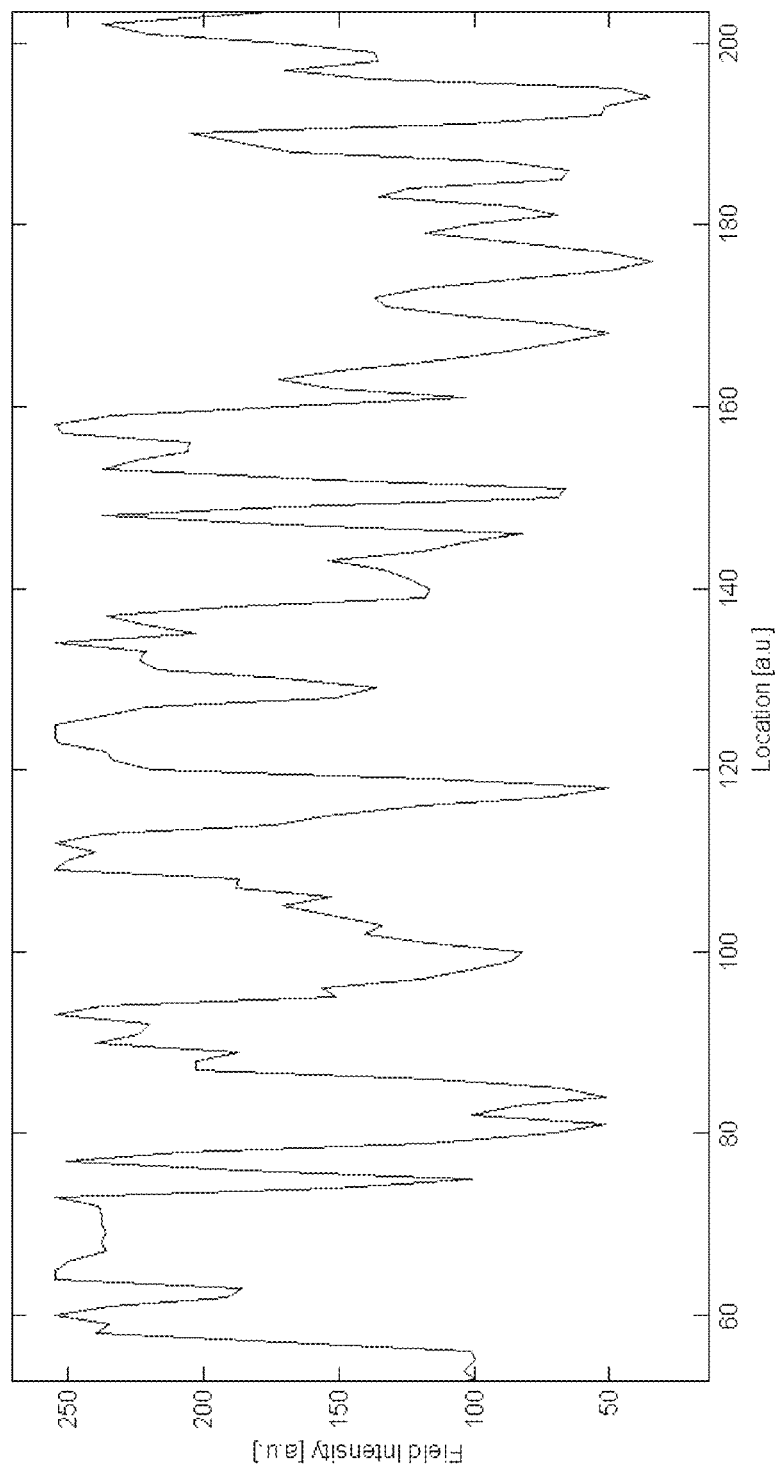
FIG. 40 is a graphical representation of magnetic field intensity measurements over a unit distance, according to an embodiment of the present invention.
Figure 41:
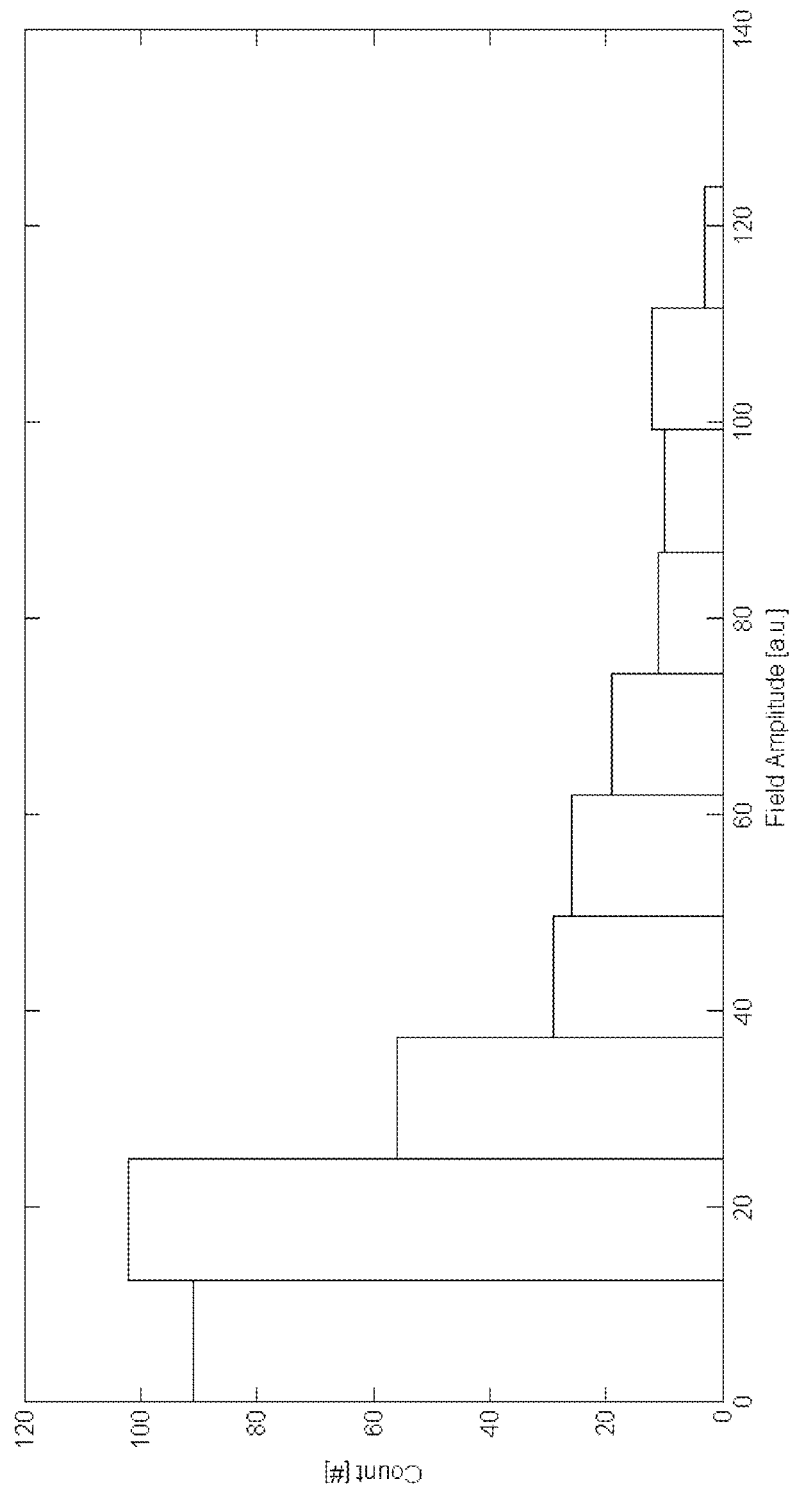
FIG. 41 is a graphical representation of average magnetic field intensity distribution for a unit distance within an area, according to an embodiment of the present invention.
Figure 42:
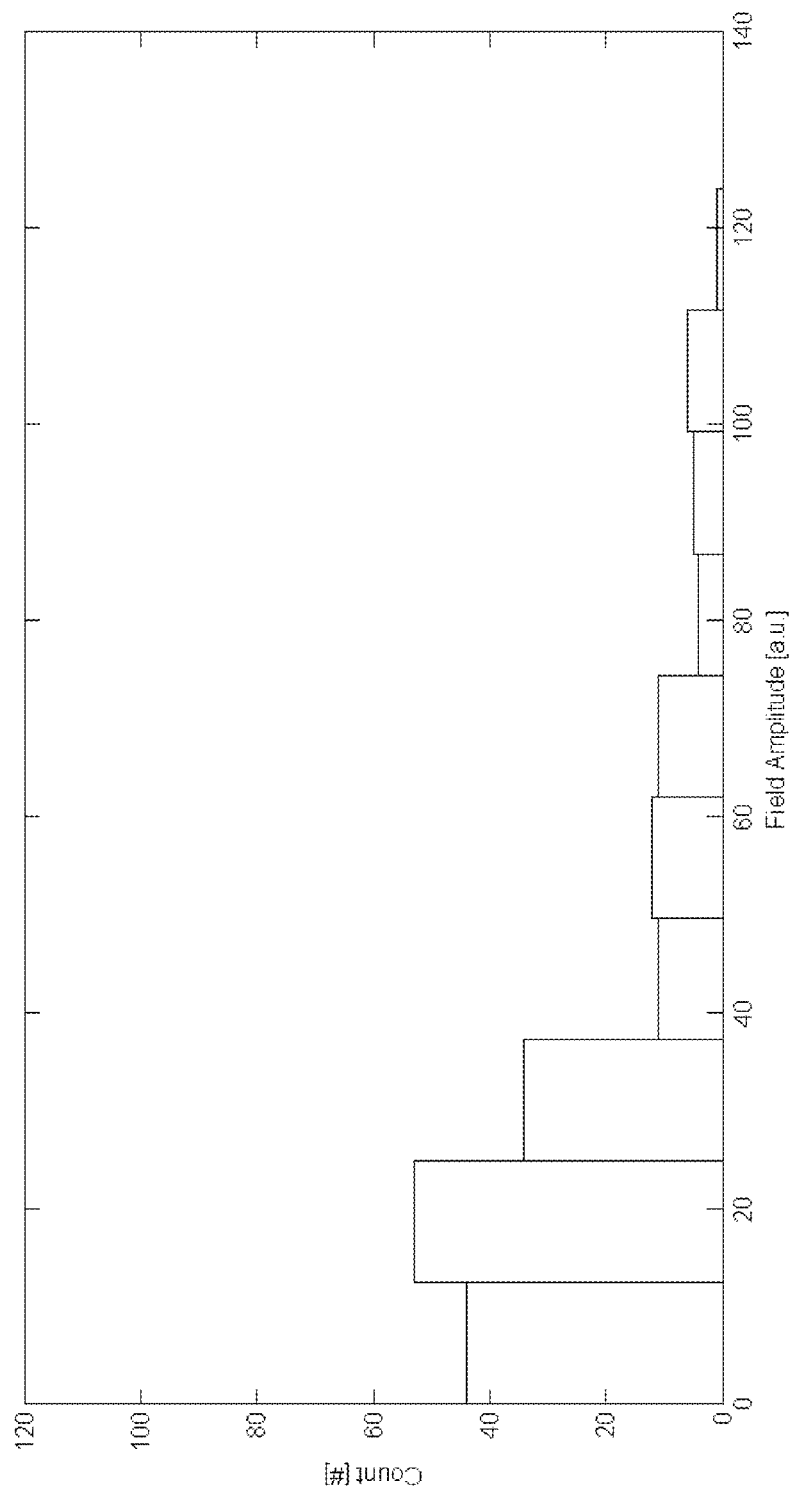
FIG. 42 is a graphical representation of magnetic field intensity distribution over a distance, according to an embodiment of the present invention.

FIGS. 39-42 illustrate examples of data and graphical representations that can be created and used for the methods explained above. FIG. 39 illustrates an example of a magnetic field intensity map. In certain embodiments, each pixel can correspond to a discrete magnetic field intensity measurement taken at specific coordinates within the area being mapped (e.g., a basketball court). The variations in magnetic field intensity can be displayed, for example, by color or shading. For example, white areas can indicate minimum magnetic field intensity and black areas can indicate maximum magnetic field intensity, with various shades of gray indicating magnetic field intensities between the minimum and maximum magnetic field intensities.

The solid lines in FIG. 39 can indicate sample unit distance movements (e.g., 1 meter) within the area. While moving along one of these unit distances, a sensor can record the fluctuations in the magnetic field intensity, which can be characterized by local maxima (peaks), as illustrated by the graphical representation in FIG. 40. Multiple samples can be recorded in order to determine an average distribution of magnetic field intensity (and/or fluctuations in magnetic field intensity) for the area, as illustrated by the graphical representation in FIG. 41. A comparison to the average distribution can then be used to determine the movement of an object over an unknown distance within the area. As the object moves within the area, a sensor can record the magnetic field intensity (and/or fluctuations in magnetic field intensity) and determine a distribution, as illustrated, for example, by the graphical representation in FIG. 42. For the example shown in FIG. 42, the count values for the occurrences of various magnetic field intensity measurements that make up the distribution are approximately half of the count values for the average distribution shown in FIG. 41. Therefore, it can be determined that the object moved approximately half of the unit distance (i.e., 0.5 meters). When combined with timing information, the speed at which the object moves within the area can also be determined.

The foregoing description of the specific embodiments of the present invention described with reference to the figures will so fully reveal the general nature of the invention that others can, by applying knowledge within the skill of the art, readily modify and/or adapt for various applications such specific embodiments, without undue experimentation, without departing from the general concept of the present invention.

While various embodiments of the present invention have been described above, they have been presented by way of example only, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present invention. The elements of the embodiments presented above are not necessarily mutually exclusive, but may be interchanged to meet various needs as would be appreciated by one of skill in the art.

It is to be understood that the phraseology or terminology used herein is for the purpose of description and not of limitation. The breadth and scope of the present invention should not be limited by any of the above-described exemplary embodiments, but should be defined only in accordance with the following claims and their equivalents.

What is claimed is:

1. A method for tracking a first object and a second object within an area during a period of time, the method comprising:
   obtaining magnetic field data for the first object within the area during the period of time from a first sensor coupled to the first object;
   obtaining magnetic field data for the second object within the area during the period of time from a second sensor coupled to the second object;
   transmitting the obtained local magnetic field data for the first and second object to a computer respectively from the first and second sensors; and
   tracking, via the computer, positions of the first object and the second object at given times as they move about the area during the period of time based on the obtained magnetic field data for the first and second object respectively received from the first and second sensors.

2. The method of claim 1, wherein the first object and the second object are tracked in real time as they move about the area.

3. The method of claim 1, wherein the area comprises an athletic field.

4. The method of claim 1, further comprising displaying a heat map that is indicative how much time the first object and the second object spent at various positions in the area.

5. The method of claim 1, further comprising obtaining magnetic field data for the area.

6. The method of claim 1, further comprising:
   applying a constraint to one of the first and the second magnetic field data; and
   determining a location of one of the first and second object at a time during the period of time based on the constraint.

7. The method of claim 6, wherein the constraint comprises factoring in physical space constraints of the area.

8. The method of claim 6, wherein the constraint comprises factoring in motion dynamics constraints of the object.

9. The method of claim 1, wherein the first and the second magnetic field data both comprise one of magnetic field intensity data and magnetic field direction data.

10. The method of claim 1, wherein the magnetic field data for the first object comprises local magnetic field data of the area in a vicinity of the first object, and
    wherein the magnetic field data for the second object comprises local magnetic field data of the area in the a vicinity of the second object.

* * * * *